United States Patent
Furukawa et al.

(10) Patent No.: US 10,073,344 B2
(45) Date of Patent: Sep. 11, 2018

(54) NEGATIVE RESIST PATTERN-FORMING METHOD, AND COMPOSITION FOR UPPER LAYER FILM FORMATION

(71) Applicant: JSR CORPORATION, Minato-ku (JP)

(72) Inventors: Taiichi Furukawa, Tokyo (JP); Sosuke Osawa, Tokyo (JP)

(73) Assignee: JSR CORPORATION, Minato-ku (JP)

( * ) Notice: Subject to any disclaimer, the term of this patent is extended or adjusted under 35 U.S.C. 154(b) by 0 days.

(21) Appl. No.: 15/095,774

(22) Filed: Apr. 11, 2016

(65) Prior Publication Data

US 2016/0299432 A1 Oct. 13, 2016

(30) Foreign Application Priority Data

Apr. 13, 2015 (JP) .................................. 2015-082037
Mar. 16, 2016 (JP) .................................. 2016-053147

(51) Int. Cl.
| | | |
|---|---|---|
| *G03F 7/11* | (2006.01) | |
| *G03F 7/004* | (2006.01) | |
| *G03F 7/20* | (2006.01) | |
| *G03F 7/32* | (2006.01) | |
| *G03F 7/039* | (2006.01) | |

(52) U.S. Cl.
CPC .............. *G03F 7/11* (2013.01); *G03F 7/0046* (2013.01); *G03F 7/0397* (2013.01); *G03F 7/2041* (2013.01); *G03F 7/325* (2013.01)

(58) Field of Classification Search
CPC .......... G03F 7/2041; G03F 7/325; G03F 7/11; G03F 7/0046; G03F 7/0397
USPC .................... 430/270.1, 273.1, 325, 907, 910
See application file for complete search history.

(56) References Cited

U.S. PATENT DOCUMENTS

| | | | |
|---|---|---|---|
| 4,910,122 A | 3/1990 | Arnold et al. | |
| 2012/0135355 A1* | 5/2012 | Tsubaki | G03F 7/325 430/311 |
| 2012/0288796 A1* | 11/2012 | Katayama | G03F 7/0045 430/285.1 |
| 2012/0308930 A1* | 12/2012 | Hatakeyama | G03F 7/004 430/280.1 |
| 2012/0328987 A1* | 12/2012 | Hatakeyama | G03F 1/32 430/285.1 |
| 2014/0212796 A1* | 7/2014 | Takizawa | G03F 7/325 430/9 |

FOREIGN PATENT DOCUMENTS

| | | |
|---|---|---|
| JP | 6-12452 | 2/1994 |
| JP | 2000-199953 | 7/2000 |
| JP | 2008-309878 | 12/2008 |
| JP | 2009-134088 | 6/2009 |

* cited by examiner

*Primary Examiner* — John S Chu
(74) *Attorney, Agent, or Firm* — Oblon, McClelland, Maier & Neustadt, L.L.P.

(57) ABSTRACT

Provided is a negative resist pattern-forming method that enables a resist pattern with fewer development defects to be formed while favorable water repellency of the surface of the upper layer film is maintained. A negative resist pattern-forming method includes the steps of: forming a resist film using a radiation-sensitive resin composition; forming an upper layer film on one face of the resist film using a composition for upper layer film formation; subjecting the resist film having the upper layer film formed thereon to liquid immersion lithography; and developing the resist film subjected to the liquid immersion lithography with a developer solution containing an organic solvent, wherein at least one of the radiation-sensitive resin composition and the composition for upper layer film formation contains a fluorine atom.

16 Claims, No Drawings

NEGATIVE RESIST PATTERN-FORMING METHOD, AND COMPOSITION FOR UPPER LAYER FILM FORMATION

BACKGROUND OF THE INVENTION

Field of Invention

The present invention relates to a negative resist pattern-forming method, and a composition for upper layer film formation.

With the progress of miniaturization of various types of electronic device structures such as semiconductor devices and liquid crystal devices, microfabrication of a resist pattern in lithography processes has been demanded. Although a fine resist pattern having a line width of about 90 nm can be currently formed using an ArF excimer laser, for example, further finer resist pattern formation would be demanded in the future.

To address the demands described above, as techniques for improving resolving power of conventional chemically amplified radiation-sensitive resin compositions using existing apparatuses without increasing the number of steps, a technique in which a negative resist pattern is formed by using an organic solvent having a lower polarity than an alkaline aqueous solution as a developer solution has been known (see Japanese Unexamined Patent Application, Publication No. 2000-199953). More specifically, in a case in which a resist pattern is formed using an alkaline aqueous solution as a developer solution, it is difficult to form a fine resist pattern due to poor optical contrast, whereas in a case in which an organic solvent is used according to the aforementioned technique, a finer resist pattern can be formed since high optical contrast can be achieved.

Also in such a development involving the use of the organic solvent, liquid immersion lithography is performed in order to form a finer resist pattern, and in the liquid immersion lithography, an upper layer film (topcoat) is formed on a resist film (see Japanese Unexamined Patent Application, Publication No. 2008-309878).

However, in the case in which the organic solvent is used as the developer solution, as described above, it is disadvantageous that in forming the resist pattern, bridge defects which would be caused by undissolved matter of the resist film, the upper layer film or the like in the developer solution, etc., and/or development defects such as residue defects, blob defects, and further, break defects which would be caused by high solubility of the resist film and the upper layer film in the developer solution are generated. In addition, it is difficult to attain both inhibition of the generation of the development defects through the control of the solubility in the developer solution and enhancement of water repellency of the surface of the upper layer film in the liquid immersion lithography, and a demand that a scanning speed in the liquid immersion lithography should be further improved is not satisfied.

PRIOR ART DOCUMENTS

Patent Documents

Patent Document 1: Japanese Unexamined Patent Application, Publication No. 2000-199953
Patent Document 2: Japanese Unexamined Patent Application, Publication No. 2008-309878

SUMMARY OF THE INVENTION

The present invention was made in view of the foregoing circumstances, and an object of the present invention is to provide a negative resist pattern-forming method and a composition for upper layer film formation that enable the water repellency of the surface of the upper layer film to be enhanced, and enable a resist pattern with fewer development defects to be formed.

According to an aspect of the invention made for solving the aforementioned problems, a negative resist pattern-forming method includes the steps of: forming a resist film using a radiation-sensitive resin composition (hereinafter, may be also referred to as "radiation-sensitive resin composition (X)") (hereinafter, may be also referred to as "resist film-forming step"); forming an upper layer film using on one face of the resist film using a composition for upper layer film formation (hereinafter, may be also referred to as "composition for upper layer film formation (Y)") (hereinafter, may be also referred to as "upper layer film-forming step"); subjecting the resist film having the upper layer film formed thereon to liquid immersion lithography (hereinafter, may be also referred to as "liquid immersion lithography step"); and developing the resist film subjected to the liquid immersion lithography with a developer solution containing an organic solvent (hereinafter, may be also referred to as "development step"), wherein at least one of the radiation-sensitive resin composition (X) and the composition for upper layer film formation (Y) contains a fluorine atom.

According to another aspect of the invention made for solving the aforementioned problems, a composition for upper layer film formation for use in a negative resist pattern-forming method which includes using a developer solution containing an organic solvent is provided which contains: a polymer component having, in a single polymer or different polymers, a structural unit that includes an alicyclic structure, and a structural unit that includes a fluorine atom and that is other than the structural unit that includes an alicyclic structure; and a solvent, wherein the percentage content of the fluorine atom in the polymer component is no less than 2% by mass and no greater than 30% by mass.

The term "organic group" as referred to herein means a group that includes at least one carbon atom.

According to the negative resist pattern-forming method and the composition for upper layer film formation of the aspects of the present invention, the water repellency of the surface of the upper layer film can be enhanced, and a resist pattern with fewer defects can be formed. Therefore, the negative resist pattern-forming method can be suitably used for pattern formation in the field of semiconductor devices and the like in which further miniaturization and improvement in quality would be demanded in the future.

DESCRIPTION OF THE EMBODIMENTS

Negative Resist Pattern-Forming Method

The negative resist pattern-forming method according to an embodiment of the present invention includes the resist film-forming step, the upper layer film-forming step, the liquid immersion lithography step, and the development step. In the negative resist pattern-forming method, at least one of the radiation-sensitive resin composition (X) and the composition for upper layer film formation (Y) contains a fluorine atom. The negative resist pattern-forming method may further include the step of removing the upper layer film formed in the upper layer film-forming step (hereinafter, may be also referred to as "upper layer film-removing step"), after the liquid immersion lithography step and concurrently with or before the development step.

According to the negative resist pattern-forming method, since at least one of the radiation-sensitive resin composition (X) and the composition for upper layer film formation (Y) contains the fluorine atom, the water repellency of the surface of the upper layer film can be enhanced, and a resist pattern with fewer development defects can be formed. Hereinafter, each step of the negative resist pattern-forming method, the radiation-sensitive resin composition (X) and the composition for upper layer film formation (Y) will be described.

<Resist Film-Forming Step>

In this step, a resist film is formed. The resist film is formed on a substrate using the radiation-sensitive resin composition (X). The radiation-sensitive resin composition (X) will be described later. The substrate for use is typically exemplified by silicon wafers, silicon wafers coated with aluminum, and the like. In addition, in order to maximally utilize the characteristics of the formed resist film, an organic or inorganic antireflective film is preferably formed beforehand on the surface of the substrate, as disclosed in, for example, Japanese Examined Patent Application, Publication No. H6-12452, etc.

The application procedure of the radiation-sensitive resin composition (X) is exemplified by conventionally well-known application procedures such as spin coating, cast coating and roll coating, and the like. Prebaking (PB) may be performed after the application onto the substrate in order to evaporate the solvent. The lower limit of the temperature of the PB is preferably 50° C., and more preferably 80° C. The upper limit of the temperature of the PB is preferably 150° C., and more preferably 120° C. The lower limit of the time period of the PB is preferably 10 sec, and more preferably 30 sec. The upper limit of the time period of the PB is preferably 600 sec, and more preferably 300 sec. The lower limit of the average thickness of the resist film thus formed is preferably 10 nm, more preferably 20 nm, and still more preferably 50 nm. The upper limit of the average thickness is preferably 1,000 nm, more preferably 500 nm, and still more preferably 200 nm.

<Upper Layer Film-Forming Step>

In this step, an upper layer film is formed on one face of the resist film using the composition for upper layer film formation (Y). The composition for upper layer film formation (Y) will be described later. The application procedure of the composition for upper layer film formation (Y) is exemplified by procedures similar to the application procedure of the radiation-sensitive resin composition (X) in the resist film-forming step. In this step, prebaking (PB) is preferably performed after the application of the composition for upper layer film formation (Y). The lower limit of the temperature of the PB is preferably 50° C., and more preferably 80° C. The upper limit of the temperature of the PB is preferably 150° C., and more preferably 120° C. The lower limit of the time period of the PB is preferably 10 sec, and more preferably 30 sec. The upper limit of the time period of the PB is preferably 600 sec, and more preferably 300 sec. The lower limit of the film thickness of the upper layer film thus formed is preferably 10 nm, more preferably 20 nm, and still more preferably 50 nm. The upper limit of the film thickness is preferably 300 nm, more preferably 200 nm, and still more preferably 150 nm. In addition, it is preferred that the film thickness of the upper layer film thus formed is as approximate to an odd multiple of $\lambda/4$ m as possible, wherein $\lambda$, represents the wavelength of the radioactive ray, and in represents the refractive index of the upper layer film. According to such a configuration, an effect of inhibiting reflection at the upper boundary of the resist film can be enhanced.

Once the upper layer film is formed on one face of the resist film, the resist film is not brought into direct contact with a liquid immersion liquid. Thus, the impairment of the lithography performances of the resist film which may be caused by penetration of the liquid immersion liquid into the resist film, and contamination of a lens of a projection aligner which may be caused by a component eluted from the resist film into the liquid immersion liquid are effectively inhibited.

<Liquid Immersion Lithography Step>

In this step, the resist film having the upper layer film formed thereon is subjected to liquid immersion lithography. This liquid immersion lithography is performed by placing the liquid immersion liquid on the upper layer film, and exposing the resist film through the liquid immersion liquid.

A liquid having a greater refractive index than that of air is typically used as the liquid immersion liquid. Water is preferably used as the liquid immersion liquid, and pure water is more preferably used. It is to be noted that pH of the liquid immersion liquid may be adjusted as needed. In the presence of this liquid immersion liquid, more specifically, in a state in which a space between the lens of the aligner and the upper layer film is filled with the liquid immersion liquid, exposure light is emitted from the aligner, and the resist film is exposed through a mask having a predetermined pattern.

The exposure light used for the liquid immersion lithography may be appropriately selected in accordance with the type of the resist film and/or the upper layer film, and examples thereof include: electromagnetic waves, e.g., visible light rays, ultraviolet rays such as g-line and i-line, far ultraviolet rays such as excimer laser beams, and X-rays such as synchrotron radioactive rays; and particle rays and particle beams, e.g. charged particle rays and charged particle beams such as electron beams. Of these, the far ultraviolet rays are preferred, an ArF excimer laser beam (wavelength: 193 nm) and a KrF excimer laser beam (wavelength: 248 nm) are more preferred, and the ArF excimer laser beam is still more preferred. In addition, the conditions for the emission of the exposure light, e.g., an exposure dose, etc., may be selected as appropriate in accordance with the blend composition of the radiation-sensitive resin composition (X) and/or the composition for upper layer film formation (Y), the type of additives contained therein, and the like.

After the liquid immersion lithography, post exposure baking (PEB) is preferably performed in order to improve the resolution, pattern configuration, developability etc. of the resulting resist pattern. The temperature of the PEB may be selected as appropriate in accordance with the type of the radiation-sensitive resin composition (X) used and the composition for upper layer film formation (Y) used, etc. The lower limit of the temperature of the PEB is preferably 30° C., and more preferably 50° C. The upper limit of the temperature of the PEB is preferably 200° C., and more preferably 150° C. The lower limit of the time period of the PEB is preferably 5 sec, and more preferably 10 sec. The upper limit of the time period of the PEB is preferably 600 sec, and more preferably 300 sec.

<Development Step>

In this step, the resist film subjected to the liquid immersion lithography is developed with a developer solution containing an organic solvent. Thus, a desired negative resist pattern can be obtained.

The organic solvent which may be contained in the developer solution is exemplified by an alcohol solvent, an ether solvent, a ketone solvent, an amide solvent, an ester solvent, a hydrocarbon solvent, and the like. The organic solvent of the developer solution preferably contains an ester solvent, a ketone solvent or a combination thereof. The developer solution may contain the organic solvent either alone of one type, or two or more types thereof.

Examples of the alcohol solvent include:

aliphatic monohydric alcohol solvents having 1 to 18 carbon atoms such as 4-methyl-2-pentanol and n-hexanol;

alicyclic monohydric alcohol solvents having 3 to 18 carbon atoms such as cyclohexanol;

polyhydric alcohol solvents having 2 to 18 carbon atoms such as 1,2-propylene glycol;

polyhydric alcohol partial ether solvents having 3 to 19 carbon atoms such as propylene glycol monomethyl ether; and the like.

Examples of the ether solvent include:

dialkyl ether solvents such as diethyl ether, dipropyl ether, dibutyl ether, dipentyl ether, diisoamyl ether, dihexyl ether and diheptyl ether;

cyclic ether solvents such as tetrahydrofuran and tetrahydropyran;

aromatic ring-containing ether solvents such as diphenyl ether and anisole; and the like.

Examples of the ketone solvent include:

chain ketone solvents such as acetone, methyl ethyl ketone, methyl n-propyl ketone, methyl n-butyl ketone, diethyl ketone, methyl iso-butyl ketone, 2-heptanone, ethyl n-butyl ketone, methyl n-hexyl ketone, di-iso-butyl ketone and trimethylnonanone;

cyclic ketone solvents such as cyclopentanone, cyclohexanone, cycloheptanone, cyclooctanone and methylcyclohexanone;

2,4-pentanedione, acetonylacetone and acetophenone; and the like.

Examples of the amide solvent include:

cyclic amide solvents such as N,N'-dimethylimidazolidinone and N-methylpyrrolidone;

chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

monocarboxylic acid ester solvents such as n-butyl acetate and ethyl lactate;

polyhydric alcohol carboxylate solvents such as propylene glycol acetate;

polyhydric alcohol partial ether carboxylate solvents such as propylene glycol monomethyl ether acetate;

polyhydric carboxylic acid diester solvents such as diethyl oxalate;

carbonate solvents such as dimethyl carbonate and diethyl carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Of these, the ester solvent, the ketone solvent, the ether solvent and a combination thereof are preferred, and the ester solvent, the ketone solvent and a combination thereof are more preferred. The ester solvent is preferably n-butyl acetate, isopropyl acetate or amyl acetate. The ketone solvent is preferably 2-butanone, methyl n-butyl ketone or methyl n-amyl ketone. The ether solvent is preferably anisole.

The lower limit of the content of the organic solvent in the developer solution is preferably 80% by mass, more preferably 90% by mass, still more preferably 99% by mass, and particularly preferably 100% by mass. When the content of the organic solvent in the developer solution falls within the above range, a dissolution contrast between the light-exposed regions and the light-unexposed regions can be improved, and consequently the resist pattern more superior in the lithography performances can be formed. A component other than the organic solvent is exemplified by water, silicone oil and the like.

The developer solution may contain a nitrogen-containing compound. When the developer solution contains the nitrogen-containing compound, a film loss in the formed resist pattern can be reduced.

Examples of the nitrogen-containing compound include compounds exemplified in connection with (K) an acid diffusion inhibiting compound of a composition for upper layer film formation (Y1) described later, and the like.

An appropriate amount of a surfactant may be added to the developer solution, as needed. Examples of the surfactant include ionic or nonionic fluorochemical surfactants, ionic or nonionic silicone-based surfactants, and the like.

Examples of the development procedure include: a procedure in which the substrate is immersed for a given time period in the developer solution charged in a container (dip procedure); a procedure in which the developer solution is placed to form a dome-shaped bead by way of the surface tension on the surface of the substrate for a given time period to conduct a development (puddle procedure); a procedure in which the developer solution is sprayed onto the surface of the substrate (spray procedure); a procedure in which the developer solution is continuously applied onto the substrate that is rotated at a constant speed while scanning with a developer solution-application nozzle at a constant speed (dynamic dispensing procedure); and the like.

In the development step, the resist film is preferably rinsed with a rinse agent after the development. As the rinse agent, an organic solvent may be used. When the organic solvent is used as the rinse agent, scums which may be generated can be efficiently washed away.

The organic solvent for use as the rinse agent is exemplified by a hydrocarbon solvent, a ketone solvent, an ester solvent, an alcohol solvent, an amide solvent, and the like. Of these, the alcohol solvent and the ester solvent are preferred, and the alcohol solvent is more preferred. The alcohol solvent is preferably a monohydric alcohol solvent having 6 to 8 carbon atoms.

The monohydric alcohol solvent having 6 to 8 carbon atoms is exemplified by linear, branched or cyclic monohydric alcohols and the like, and specific examples thereof include 1-hexanol, 1-heptanol, 1-octanol, 4-methyl-2-pentanol, 2-hexanol, 2-heptanol, 2-octanol, 3-hexanol, 3-heptanol, 3-octanol, 4-octanol, benzyl alcohol, and the like. Of these, 1-hexanol, 2-hexanol, 2-heptanol and 4-methyl-2-pentanol are preferred.

The organic solvent which may be contained in the rinse agent may be used either alone of one type, or two or more types thereof may be used in combination. The upper limit of the moisture content in the rinse agent is preferably 10% by mass, more preferably 5% by mass, and still more preferably 3% by mass. When the moisture content in the rinse agent is no greater than the upper limit, favorable development characteristics can be attained. It is to be noted that the rinse agent may contain a surfactant.

The procedure for rinsing with the rinse agent is exemplified by: a procedure in which the rinse agent is continuously applied onto the substrate that is rotated at a constant speed (spin-coating procedure); a procedure in which the substrate is immersed for a given time period in the rinse agent charged in a container (dip procedure), a procedure in which the rinse agent is sprayed on the surface of the substrate (spray procedure), and the like.

<Upper Layer Film-Removing Step>

In this step, the upper layer film formed in the upper layer film-forming step is removed after the liquid immersion lithography step and concurrently with or before the development step.

Although the removing procedure of the upper layer film is not particularly limited, it is preferred that the removing procedure of the upper layer film does not impair the lithography performances of the resist pattern. According to the negative resist pattern-forming method, since the upper layer film is formed using the composition for upper layer film formation (Y), the upper layer film can be readily removed with the developer solution and/or the rinse agent in the development step. Thus, the removal of the upper layer film can be achieved in the development step, and therefore a step of removing the upper layer film separate from the development step is not necessary.

In connection with the negative resist pattern-forming method, the radiation-sensitive resin composition (X) used in the resist film-forming step and the composition for upper layer film formation (Y) used in the upper layer film-forming step are described below. The combination of the radiation-sensitive resin composition (X) and the composition for upper layer film formation (Y) used in the negative resist pattern-forming method is exemplified by (1) and (2) below, and the like:

(1) a combination of a radiation-sensitive resin composition (X1) and a composition for upper layer film formation (Y1); and (2) a combination of a radiation-sensitive resin composition (X2) and a composition for upper layer film formation (Y2).

When the combination (1) is used, lithography characteristics such as Depth of Focus (DOF), Critical Dimension Uniformity (CDU) and Line Width Roughness (LWR) of the formed resist pattern can be more improved.

<Radiation-Sensitive Resin Composition (X)>

In regard to the radiation-sensitive resin composition (X), the type thereof is not particularly limited, and may be appropriately selected from among radiation-sensitive resin compositions conventionally used for forming a resist film, in accordance with an intended use of the resist. Of these, a radiation-sensitive resin composition that contains a first polymer component (hereinafter, may be also referred to as "polymer component (I)"), and a radiation-sensitive acid generator (hereinafter, may be also referred to as "(C) acid generator" or "acid generator (C)") is preferred.

The radiation-sensitive resin composition (X) is exemplified by the radiation-sensitive resin composition (X1), the radiation-sensitive resin composition (X2) and the like that contain the following polymer(s) as the polymer component (I).

radiation-sensitive resin composition (X1): a radiation-sensitive resin composition containing as the polymer component (I), a first polymer that has a fluorine atom (hereinafter, may be also referred to as "(A) polymer" or "polymer (A)"), and a second polymer that includes an acid-labile group (hereinafter, may be also referred to as "(B) polymer" or "polymer (B)"); and radiation-sensitive resin composition (X2): a radiation-sensitive resin composition containing as the polymer component (I), the polymer (B) that includes an acid-labile group.

Hereinafter, the radiation-sensitive resin composition (X1) and the radiation-sensitive resin composition (X2) will be described.

[Radiation-Sensitive Resin Composition (X1)]

The radiation-sensitive resin composition (X1) contains as the polymer component (I), the polymer (A) that has a fluorine atom and the polymer (B) that includes an acid-labile group, and also contains the acid generator (C). The polymer (B) preferably has a lower mass percentage content of fluorine atom than that of the polymer (A). The radiation-sensitive resin composition (X1) may further contain other component within a range not leading to impairment of the effects of the present invention.

[(A) Polymer]

The polymer (A) has a fluorine atom. The polymer (A) preferably has a structural unit that includes a fluorine atom (hereinafter, may be also referred to as "structural unit (I)"). Moreover, in light of an improvement of a development defects-inhibiting property of the radiation-sensitive resin composition (X1), the polymer (A) preferably has, in addition to the structural unit (I), any of the structural units in the polymer (B) described later. Since the radiation-sensitive resin composition contains the polymer (A), in forming the resist film, the polymer (A) tends to be localized in the surface region of the resist film due to the oil-repellency characteristics thereof, and consequently the elution of the acid generating agent, the acid diffusion control agent, and/or the like into the liquid immersion liquid in the liquid immersion lithography can be inhibited. In addition, also in an electron beam exposure and/or an EUV exposure, the development defects-inhibiting property of the resist film can be improved due to the water-repellency characteristics of the polymer (A). Since the radiation-sensitive resin composition thus contains the polymer (A), the resist film suitable for liquid immersion lithography, electron beam exposure, EUV exposure etc. can be formed.

Although not necessarily clarified, the reason for achieving the effects described above due to the negative resist pattern-forming method having the aforementioned features such as the step of forming a resist film using the radiation-sensitive resin composition (X1) that contains the polymer (A) that has a fluorine atom and the step of forming the upper layer film on one face of the resist film using the composition for upper layer film formation (Y) is inferred as in the following, for example. Specifically, since the polymer (A) contained in the radiation-sensitive resin composition (X) constituting the resist film has the fluorine atom, the polymer (A) would tend to be localized in the surface region of the resist film due to the characteristics of a low surface free energy of the polymer (A), and the water repellency of the upper layer film formed on one face of the resist film could be more enhanced due to the oil-repellency characteristics exerted by the fluorine atom of the polymer (A).

The polymer (A) preferably has a greater mass percentage content of fluorine atom than that of the polymer (B) in the radiation-sensitive resin composition (X1). When the polymer (A) has a greater mass percentage content of fluorine atom than that of the polymer (B), the aforementioned localization is achieved to a higher degree, characteristics such as water repellency and elution-inhibiting property of the surface of the resulting resist film can be further improved.

The lower limit of the mass percentage content of fluorine atom of the polymer (A) is preferably 1% by mass, more preferably 2% by mass, still more preferably 4% by mass, and particularly preferably 7% by mass. The upper limit of the total mass percentage content is preferably 60% by mass, more preferably 40% by mass, and still more preferably 30% by mass. The mass percentage content of fluorine atom of the polymer can be calculated based on the polymer structure determined by $^1$H-NMR, $^{13}$C-NMR, $^{19}$F-NMR, and the like.

The mode of incorporation of the fluorine atom in the polymer (A) is not particularly limited, and the fluorine atom may bond to any of the main chain, a side chain and an end of the polymer (A); however, the polymer (A) preferably has a structural unit that includes a fluorine atom (I). The polymer (A) may have other structural unit than the structural unit (I). The other structural unit is exemplified by a structural unit that includes a polar group, a structural unit derived from (meth)acrylic acid ester that includes a non-labile monovalent alicyclic hydrocarbon group, and the like. Examples of the polar group include an alcoholic hydroxyl group, a carboxy group, a cyano group, a nitro group, a sulfonamide group, and the like. In addition, the upper limit of the proportion of the other structural unit with respect to the total structural units constituting the polymer (A) is preferably 90 mol %, and more preferably 85 mol %.

[Structural Unit (I)]

The structural unit (I) includes a fluorine atom. The structural unit (I) is exemplified by a structural unit represented by the following formula (F), and the like. Since the polymer (A) has the structural unit (I), the percentage content of the fluorine atom can be adjusted.

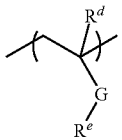

(F)

In the above formula (F), $R^d$ represents a hydrogen atom, a methyl group or a trifluoromethyl group; G represents a single bond, an oxygen atom, a sulfur atom, —CO—O—, —SO$_2$—O—NH—, —CO—NH— or —O—CO—NH—; and $R^e$ represents a monovalent fluorinated chain hydrocarbon group having 1 to 6 carbon atoms or a monovalent fluorinated alicyclic hydrocarbon group having 4 to 20 carbon atoms.

In light of the copolymerizability of a monomer that gives the structural unit (I), etc., $R^d$ represents preferably a hydrogen atom or a methyl group, and more preferably a methyl group.

G represents preferably —CO—O—, —SO$_2$—O—NH—, —CO—NH— or —O—CO—NH—, and more preferably —CO—O—.

Examples of the monovalent fluorinated chain hydrocarbon group having 1 to 6 carbon atoms which may be represented by $R^e$ include a trifluoromethyl group, a 2,2,2-trifluoroethyl group, a perfluoroethyl group, a 2,2,3,3,3-pentafluoropropyl group, a 1,1,1,3,3,3-hexafluoropropyl group, a perfluoro-n-propyl group, a perfluoro-i-propyl group, a perfluoro-n-butyl group, a perfluoro-i-butyl group, a perfluoro-t-butyl group, a 2,2,3,3,4,4,5,5-octafluoropentyl group, a perfluorohexyl group, and the like.

Examples of the monovalent fluorinated alicyclic hydrocarbon group having 4 to 20 carbon atoms which may be represented by $R^e$ include a monofluorocyclopentyl group, a difluorocyclopentyl group, a perfluorocyclopentyl group, a monofluorocyclohexyl group, a difluorocyclopentyl group, a perfluorocyclohexylmethyl group, a fluoronorbornyl group, a fluoroadamantyl group, a fluorobornyl group, a fluoroisobornyl group, a fluorotricyclodecyl group, a fluorotetracyclodecyl group, and the like.

Of these, $R^e$ represents preferably the fluorinated chain hydrocarbon group, more preferably the 2,2,2-trifluoroethyl group or the 1,1,1,3,3,3-hexafluoro-2-propyl group, and still more preferably the 1,1,1,3,3,3-hexafluoro-2-propyl group.

The lower limit of the proportion of the structural unit (I) with respect to the total structural units constituting the polymer (A) is preferably 10 mol %, more preferably 30 mol %, and still more preferably 50 mol %. The upper limit of the proportion of the structural unit (I) is preferably 100 mol %, more preferably 95 mol %, and still more preferably 90 mol %. When the proportion of the structural unit (I) falls within the range, the percentage content of the fluorine atom of the polymer (A) can be adjusted more properly.

The lower limit of the content of the polymer (A) with respect to 100 parts by mass of the polymer (B) described later is preferably 0.1 parts by mass, more preferably 0.2 parts by mass, still more preferably 0.5 parts by mass, and particularly preferably 1 part by mass. The upper limit of the content of the polymer (A) with respect to 100 parts by mass of the polymer (B) is preferably 30 parts by mass, more preferably 20 parts by mass, still more preferably 15 parts by mass, and particularly preferably 10 parts by mass.

[Synthesis Method of Polymer (A)]

The polymer (A) can be synthesized by, for example, polymerizing monomer(s) that give(s) each structural unit in an appropriate solvent using a radical polymerization initiator or the like.

Examples of the radical polymerization initiator include: azo radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile) and dimethyl 2,2'-azobisisobutyrate; peroxide radical initiators such as benzoyl peroxide, t-butyl hydroperoxide and cumene hydroperoxide; and the like. Of these, AIBN and dimethyl 2,2'-azobisisobutyrate are preferred, and AIBN is more preferred. These radical initiators may be used either alone of one type, or as a mixture of two or more types thereof.

Examples of the solvent which may be used in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

halogenated hydrocarbons such as chlorobutanes, bromohexanes, dichloroethanes, hexamethylene dibromide and chlorobenzene;

saturated carboxylic acid esters such as ethyl acetate, n-butyl acetate, i-butyl acetate and methyl propionate;

ketones such as acetone, methyl ethyl ketone, 4-methyl-2-pentanone and 2-heptanone;

ethers such as tetrahydrofuran, dimethoxyethanes and diethoxyethanes;

alcohols such as methanol, ethanol, 1-propanol, 2-propanol and 4-methyl-2-pentanol; and the like. These solvents which may be used in the polymerization may be used either alone of one type, or two or more types thereof may be used in combination.

The lower limit of the reaction temperature in the polymerization is preferably 40° C., and more preferably 50° C. The upper limit of the reaction temperature is preferably 150° C., and more preferably 120° C. The lower limit of the reaction time period is preferably 1 hour, and more preferably 2 hrs. The upper limit of the reaction time period is preferably 48 hrs, and more preferably 24 hrs.

The polystyrene equivalent weight average molecular weight (Mw) of the polymer (A) as determined by gel permeation chromatography (GPC) is not particularly limited, and the lower limit of the Mw is preferably 1,000, more preferably 2,000, still more preferably 2,500, and particularly preferably 3,000. The upper limit of the Mw is preferably 50,000, more preferably 30,000, still more preferably 20,000, and particularly preferably 15,000. When the Mw of the polymer (A) falls within the above range, the application property and development defects-inhibiting property of the radiation-sensitive resin composition may be improved. When the Mw of the polymer (A) is less than the lower limit, the resist film exhibiting sufficient heat resistance may not be obtained. When the Mw of the polymer (A) is greater than the upper limit, the developability of the resist film may be deteriorated.

The ratio (Mw/Mn) of the Mw to the polystyrene equivalent number average molecular weight (Mn) as determined by GPC of the polymer (A) is typically no less than 1 and no greater than 5, preferably no less than 1 and no greater than 3, and still more preferably no less than 1 and no greater than 2.

The Mw and the Mn of the polymer as referred to herein mean a value determined by gel permeation chromatography (GPC) under the following conditions:
GPC columns: "G2000 HXL"×2, "G3000 HXL"×1 and "G4000 HXL"×1 available from Tosoh Corporation;
column temperature: 40° C.;
elution solvent: tetrahydrofuran;
flow rate: 1.0 mL/min;
sample concentration: 1.0% by mass;
amount of injected sample: 100 μL;
detector: differential refractometer; and
standard substance: mono-dispersed polystyrene.

[(B) Polymer]

The polymer (B) includes an acid-labile group. The polymer (B) preferably has a lower mass percentage content of fluorine atom than that of the polymer (A). The polymer (B) normally serves as a base polymer in the radiation-sensitive resin composition (X1). The "base polymer" as referred to means a polymer that is contained as a principal component among polymers constituting the resist pattern, and accounts for preferably no less than 50% by mass, and more preferably no less than 60% by mass with respect to the total polymers constituting the resist pattern.

The polymer (B) preferably has a structural unit that includes an acid-labile group (hereinafter, may be also referred to as "structural unit (II)"). The polymer (B) preferably has, in addition to the structural unit (II), a structural unit (III) that includes at least one selected from the group consisting of a lactone structure, a cyclic carbonate structure and a sultone structure, and may have other structural unit than these structural units. The polymer (B) may have one type, or two or more types of these structural units.

[Structural Unit (II)]

The structural unit (II) includes an acid-labile group. When the polymer (B) has the structural unit (II), the sensitivity and resolution of the radiation-sensitive resin composition (X1) may be improved, and consequently the lithography performances thereof may be improved. The "acid-labile group" as referred to means a group that substitutes for a hydrogen atom of a carboxy group, a hydroxy group and the like and is dissociated by an action of an acid.

Examples of the structural unit (II) include a structural unit represented by the following formula (4) (hereinafter, may be also referred to as "structural unit (II-1)"), and the like. In the formula (4) of the structural unit (II-1), the group represented by —CR$^5$R$^6$R$^7$ corresponds to the acid-labile group.

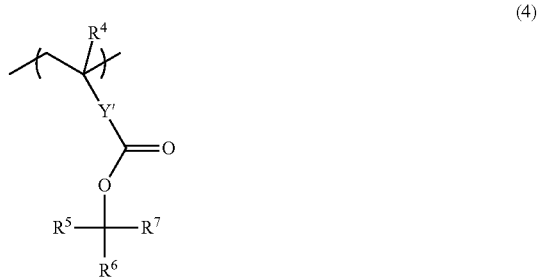

In the above formula (4), R$^4$ represents a hydrogen atom, a fluorine atom, a methyl group or a trifluoromethyl group; Y' represents a single bond, a carbonyloxyalkanediyl group having 2 to 20 carbon atoms, a carbonyloxycycloalkanediyl group having 4 to 20 carbon atoms, a carbonyloxycycloalkanediyloxy group having 4 to 20 carbon atoms, an arenediyl group having 6 to 20 carbon atoms or a carbonyloxyarenediyl group having 7 to 20 carbon atoms; R$^5$ represents a hydrogen atom or a monovalent chain hydrocarbon group having 1 to 10 carbon atoms; and R$^6$ and R$^7$ each independently represent a monovalent chain hydrocarbon group having 1 to 20 carbon atoms or a monovalent alicyclic hydrocarbon group having 3 to 20 carbon atoms, or R$^6$ and R$^7$ taken together represent an alicyclic structure having 3 to 20 ring atoms together with the carbon atom to which R$^6$ and R$^7$ bond.

Examples of the carbonyloxyalkanediyl group having 2 to 20 carbon atoms which may be represented by Y' include a carbonyloxymethanediyl group, a carbonyloxyethanediyl group, a carbonyloxypropanediyl group, and the like.

Examples of the carbonyloxycycloalkanediyl group having 4 to 20 carbon atoms which may be represented by Y' include:
monocyclic carbonyloxycycloalkanediyl groups such as a carbonyloxycyclopropanediyl group, a carbonyloxycyclobutanediyl group, a carbonyloxycyclopentanediyl group and a carbonyloxycyclohexanediyl group;
polycyclic carbonyloxycycloalkanediyl groups such as a carbonyloxynorbornanediyl group, a carbonyloxyadamantanediyl group, a carbonyloxytricyclodecanediyl group and a carbonyloxytetracyclododecanediyl group; and the like.

Examples of the carbonyloxycycloalkanediyloxy group having 4 to 20 carbon atoms which may be represented by Y' include:
monocyclic carbonyloxycycloalkanediyloxy groups such as a carbonyloxycyclopropanediyloxy group, a carbonyloxycyclobutanediyloxy group, a carbonyloxycyclopentanediyloxy group and a carbonyloxycyclohexanediyloxy group;

polycyclic carbonyloxycycloalkanediyloxy groups such as a carbonyloxynorbornanediyloxy group, a carbonyloxyadamantanediyloxy group, a carbonyloxytricyclodecanediyloxy group and a carbonyloxytetracyclododecanediyloxy group; and the like.

Examples of the arenediyl group having 6 to 20 carbon atoms which may be represented by Y' include a benzenediyl group, a toluenediyl group, a xylenediyl group, a mesitylenediyl group, a naphthalenediyl group, an anthracenediyl group, and the like.

Examples of the carbonyloxyarenediyl group having 6 to 20 carbon atoms which may be represented by Y' include a carbonyloxybenzenediyl group, a carbonyloxytoluenediyl group, a carbonyloxyxylenediyl group, a carbonyloxymesityleneoxy group, a carbonyloxynaphthalenediyl group, a carbonyloxyanthracenediyl group, and the like.

Y' represents preferably the single bond, the carbonyloxyalkanediyl group having 2 to 20 carbon atoms, the carbonyloxycycloalkanediyloxy group having 4 to 20 carbon atoms or the arenediyl group having 6 to 20 carbon atoms, more preferably the single bond, the carbonyloxymethanediyl group, the polycyclic carbonyloxycycloalkanediyloxy group or the benzenediyl group, and still more preferably the single bond or the carbonyloxymethanediyl group.

In light of the copolymerizability of a monomer that gives the structural unit (II), $R^4$ represents preferably the hydrogen atom or the methyl group, and more preferably the methyl group.

Examples of the monovalent chain hydrocarbon group having 1 to 10 carbon atoms which may be represented by $R^5$, $R^6$ or $R^7$ include:
alkyl groups such as a methyl group, an ethyl group, a n-propyl group and an i-propyl group;
alkenyl groups such as an ethenyl group, a propenyl group and a butenyl group;
alkynyl groups such as an ethynyl group, a propynyl group and a butynyl group; and the like.

Examples of the monovalent alicyclic hydrocarbon group having 3 to 20 carbon atoms which may be represented by $R^5$, $R^6$ or $R^7$ include:
saturated monocyclic alicyclic hydrocarbon groups such as a cyclopentyl group and a cyclohexyl group;
unsaturated monocyclic alicyclic hydrocarbon groups such as a cyclopentenyl group and a cyclohexenyl group;
saturated polycyclic alicyclic hydrocarbon groups such as a norbornyl group, an adamantyl group and a tricyclodecyl group;
unsaturated polycyclic alicyclic hydrocarbon groups such as a norbornenyl group and a tricyclodecenyl group; and the like.

Examples of the alicyclic structure having 3 to 20 carbon atoms which may be taken together represented by $R^6$ and $R^7$ together with the carbon atom to which $R^6$ and $R^7$ bond include:
saturated monocyclic alicyclic hydrocarbon structures such as a cyclopropane structure, a cyclobutane structure, a cyclopentane structure, a cyclohexane structure, a cycloheptane structure and a cyclooctane structure;
saturated polycyclic alicyclic hydrocarbon structures such as a norbornane structure, an adamantane structure, a tricyclodecane structure and a tetracyclododecane structure; and the like.

As the structural unit (II-1), structural units represented by the following formulae (4-1) to (4-5) (hereinafter, may be also referred to as "structural units (II-1-1) to (II-1-5)") are preferred.

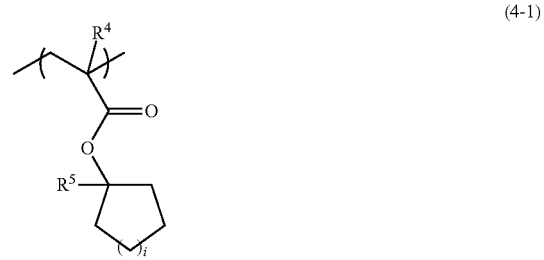

(4-1)

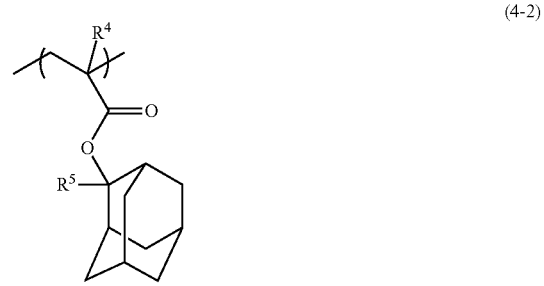

(4-2)

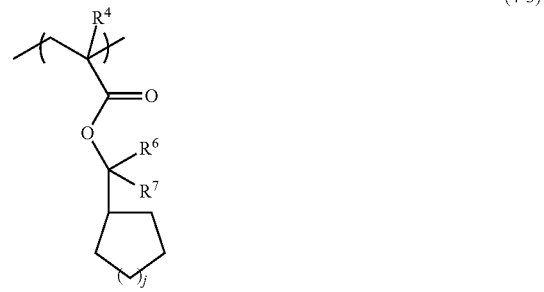

(4-3)

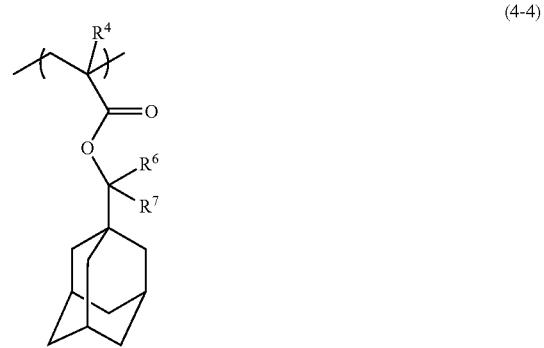

(4-4)

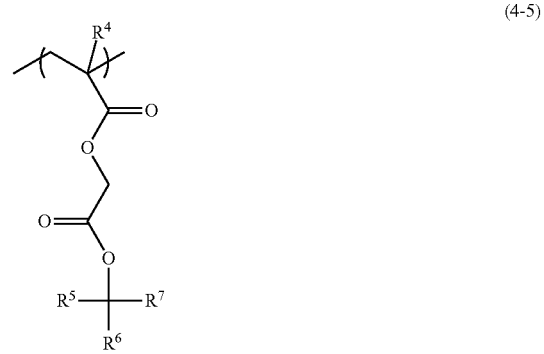

(4-5)

In the above formulae (4-1) to (4-5), $R^4$ to $R^7$ are as defined in the above formula (4); and i and j are each independently an integer of 1 to 4.
Examples of the structural units (II-1-1) to (II-1-5) include structural units presented by the following formulae, and the like.
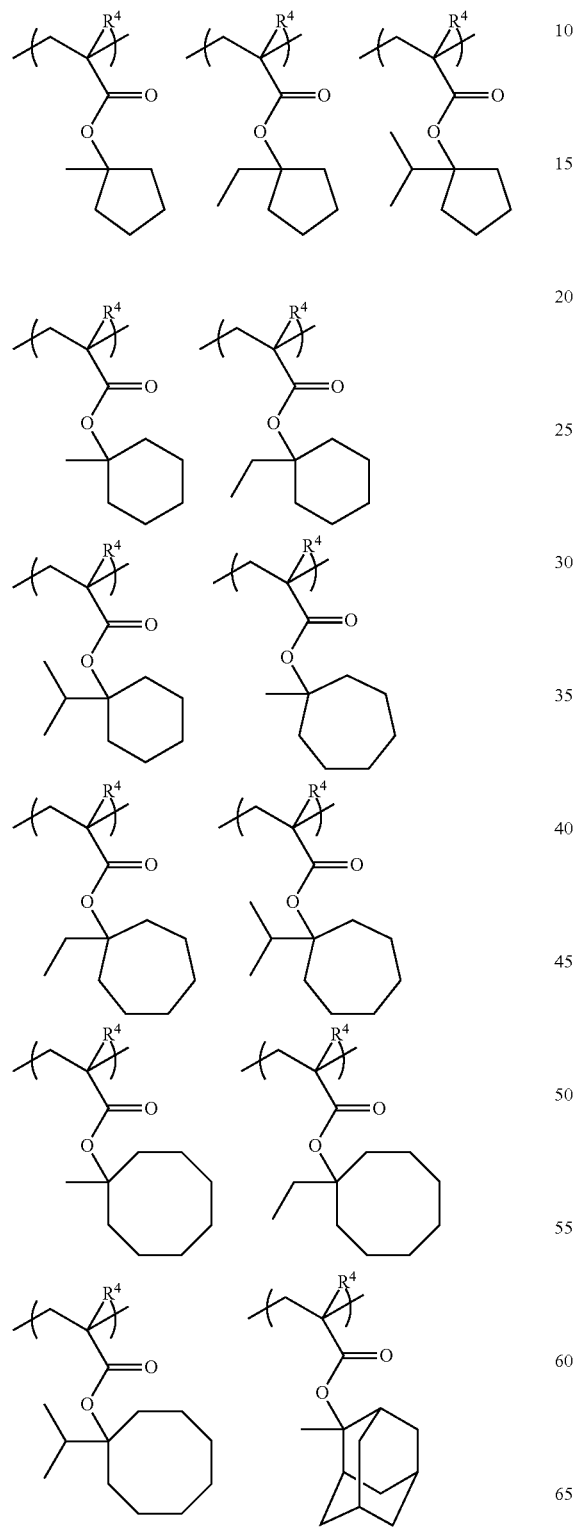
-continued
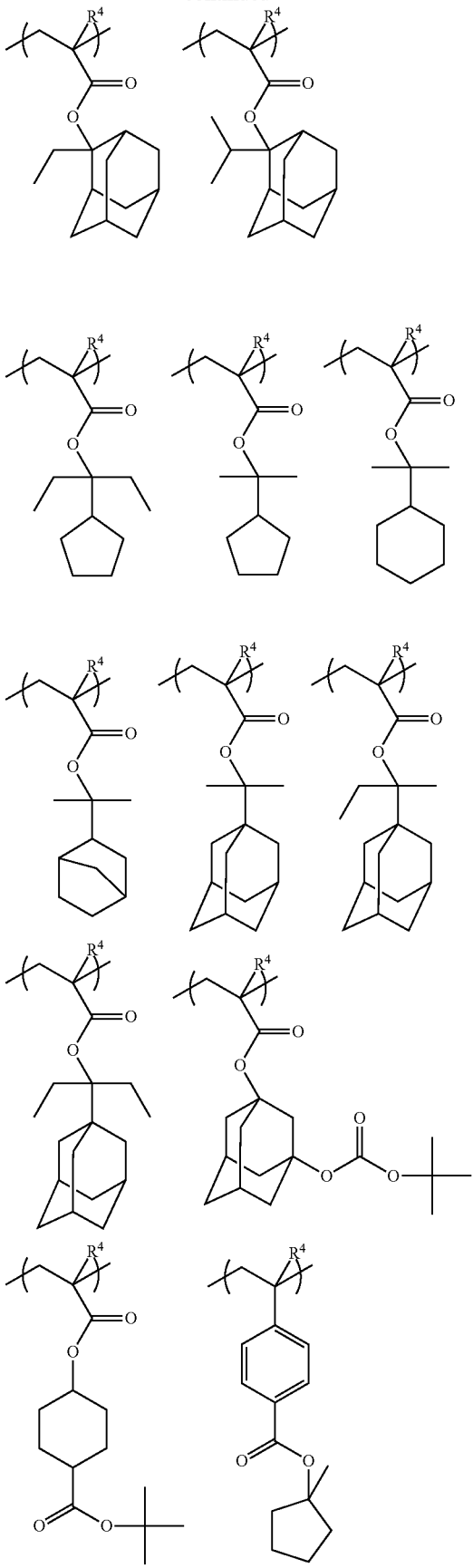

-continued
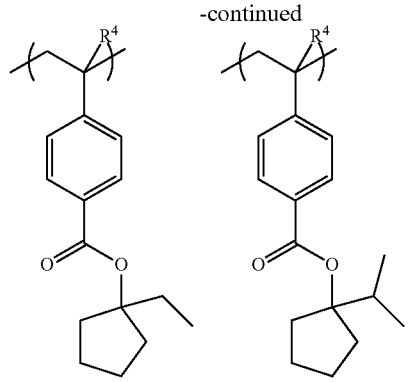
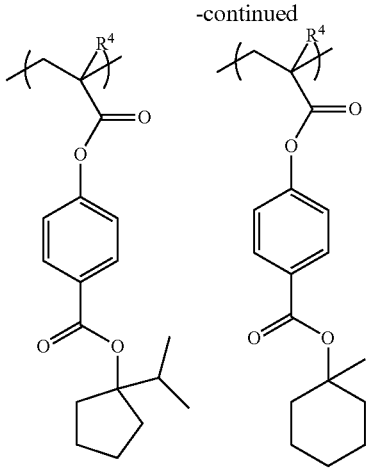
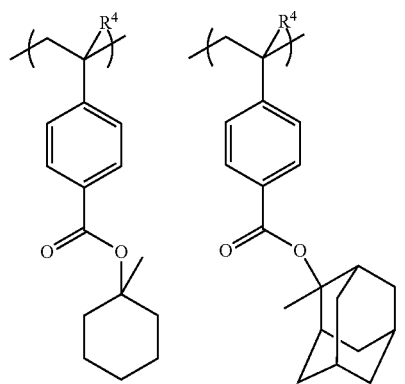
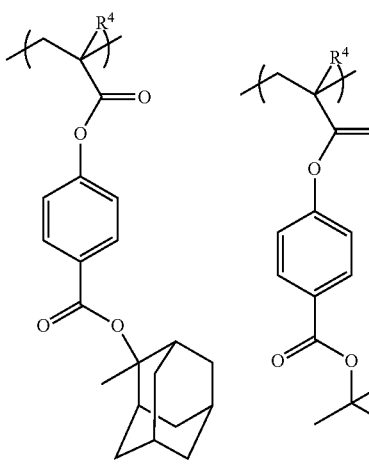
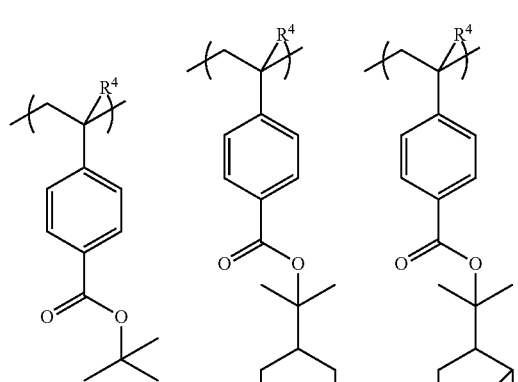
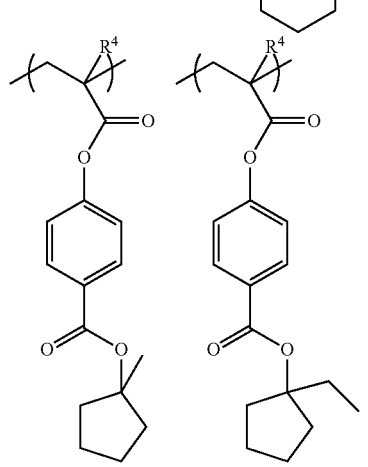
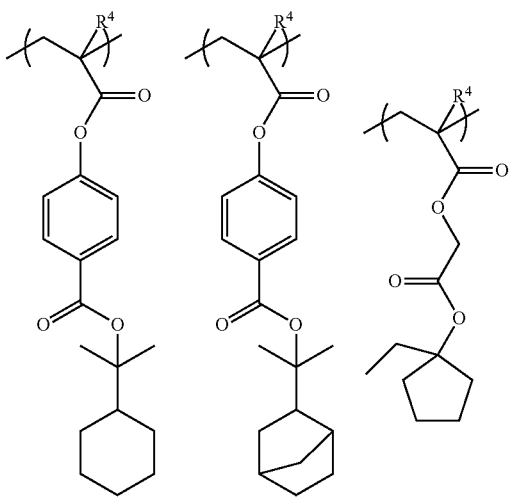

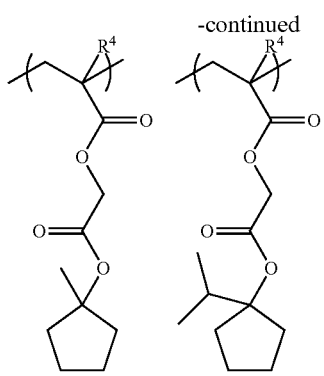

In the above formulae, $R^4$ is as defined in the above formula (4).

As the structural unit (II), a structural unit derived from 1-alkyl-monocyclic cycloalkan-1-yl (meth)acrylate, a structural unit derived from 2-alkyl-polycyclic cycloalkan-2-yl (meth)acrylate, a structural unit derived from 2-(cycloalkan-yl)propan-2-yl (meth)acrylate and a structural unit derived from 1-alkyl-monocyclic cycloalkan-1-yloxycarbonylmethyl (meth)acrylate are preferred, and a structural unit derived from 1-methylcyclopentan-1-yl (meth)acrylate, a structural unit derived from 1-i-propylcyclopentan-1-yl (meth)acrylate, a structural unit derived from 2-(adamantan-1-yl)propan-2-yl (meth)acrylate, a structural unit derived from 2-(cyclohexan-1-yl)propan-2-yl (meth)acrylate and a structural unit derived from 1-ethylcyclopentan-1-yloxycarbonylmethyl (meth)acrylate are more preferred.

The lower limit of the proportion of the structural unit (II) with respect to the total structural units constituting the polymer (B) is preferably 10 mol %, more preferably 20 mol %, still more preferably 30 mol %, and particularly preferably 35 mol %. The upper limit of the proportion of the structural unit (II) is preferably 80 mol %, more preferably 75 mol %, still more preferably 70 mol %, and particularly preferably 60 mol %. When the proportion of the structural unit (II) falls within the above range, the lithography performances of the radiation-sensitive resin composition (X1) can be further improved. When the proportion of the structural unit (II) is less than the lower limit, the pattern formability of radiation-sensitive resin composition (X1) may be deteriorated. When the proportion of the structural unit (II) is greater than the upper limit, adhesiveness of the resist pattern to a substrate may be deteriorated.

[Structural Unit (III)]

The structural unit (III) includes at least one selected from the group consisting of a lactone structure, a cyclic carbonate structure and a sultone structure. When the polymer (B) further has the structural unit (III), the solubility thereof in the developer solution can be more adjusted, and consequently the lithography performances of the radiation-sensitive resin composition (X1) can be further improved. In addition, the adhesiveness between the resist pattern and the substrate can be improved.

Examples of the structural unit (III) that includes the lactone structure include structural units represented by the following formula formulae (5-1-1) to (5-1-19) (hereinafter, may be also referred to as "structural units (III-1-1) to (III-1-19)"), and the like; examples of the structural unit (III) that includes the cyclic carbonate structure include structural units represented by the following formulae (5-2-1) to (5-2-17) (hereinafter, may be also referred to as "structural units (III-2-1) to (III-2-17)"), and the like; and examples of the structural unit (III) that includes the sultone structure include structural units represented by the following formulae (5-3-1) to (5-3-11) (hereinafter, may be also referred to as "structural unit (III-3-1) to (III-3-11)"), and the like.

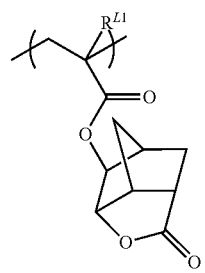

(5-1-1)

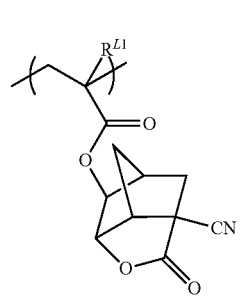

(5-1-2)

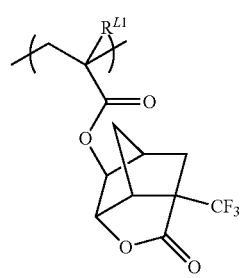

(5-1-3)

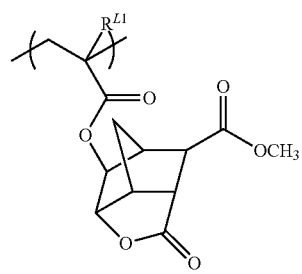

(5-1-4)

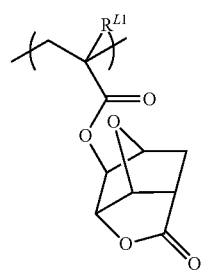

(5-1-5)

(5-1-6)
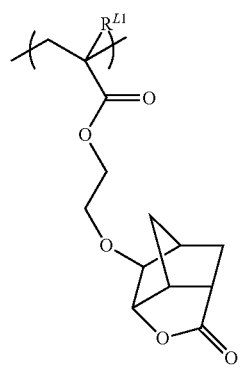
(5-1-7)
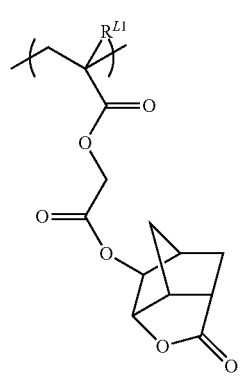
(5-1-8)
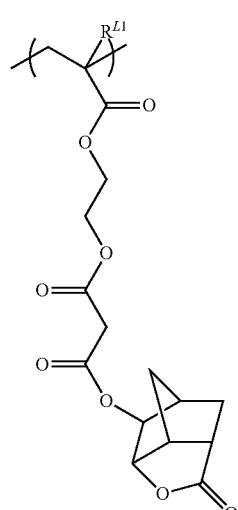
(5-1-9)
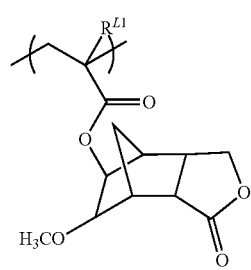
(5-1-10)
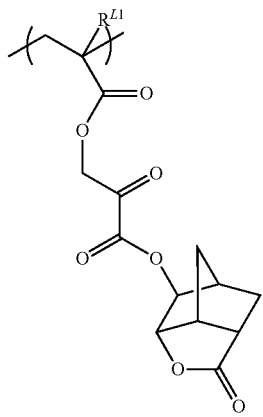
(5-1-11)
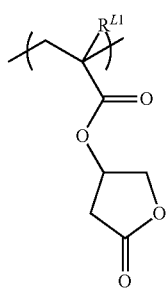
(5-1-12)
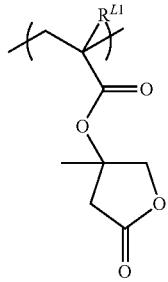
(5-1-13)
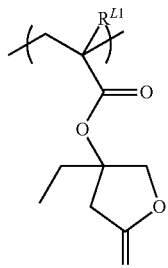
(5-1-14)
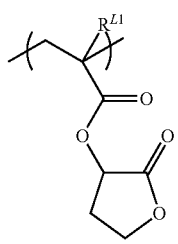

(5-1-15) 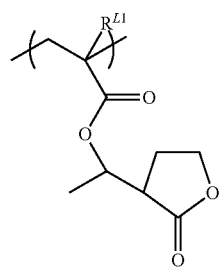
(5-1-16) 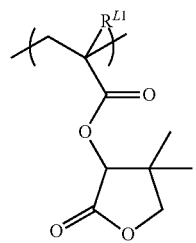
(5-1-17) 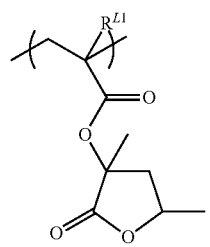
(5-1-18) 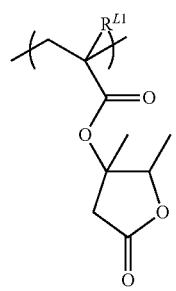
(5-1-19) 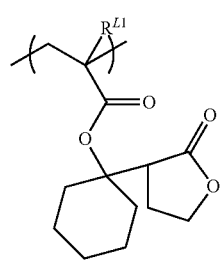
(5-2-1) 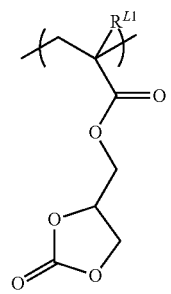
(5-2-2) 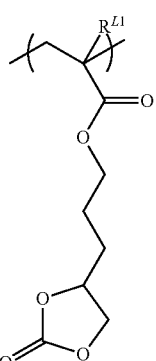
(5-2-3) 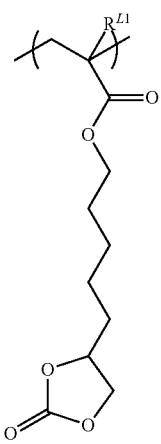
(5-2-4) 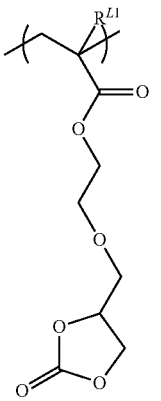
(5-2-5) 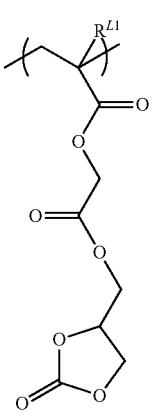

(5-2-6) 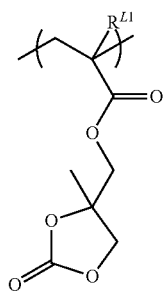
(5-2-7) 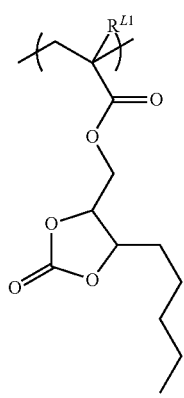
(5-2-8) 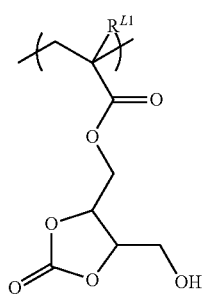
(5-2-9) 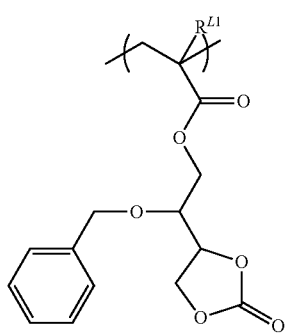
(5-2-10) 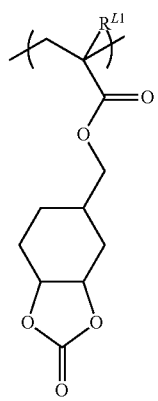
(5-2-11) 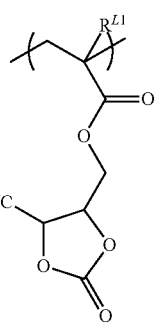
(5-2-12) 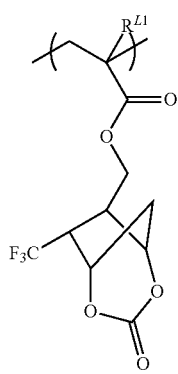
(5-2-13) 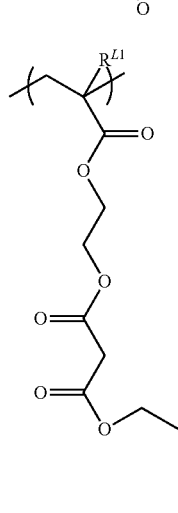

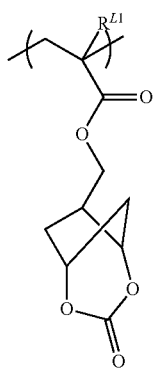
(5-2-14)
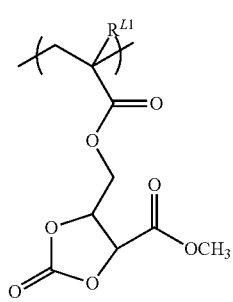
(5-2-15)
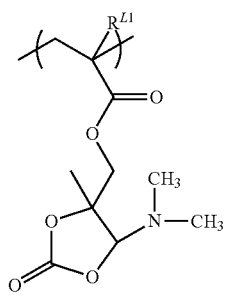
(5-2-16)
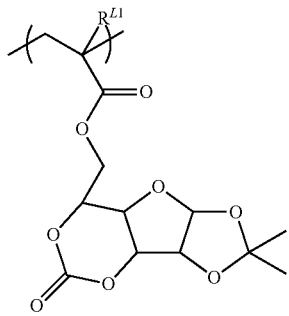
(5-2-17)
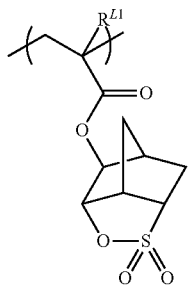
(5-3-1)
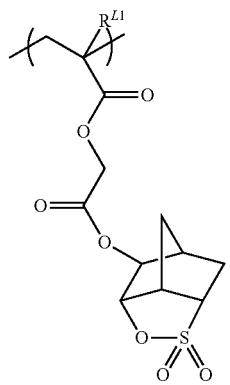
(5-3-2)
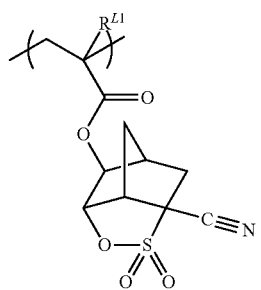
(5-3-3)
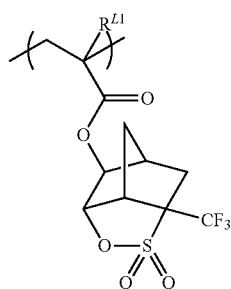
(5-3-4)
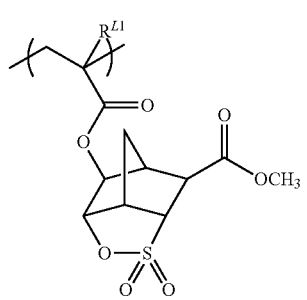
(5-3-5)
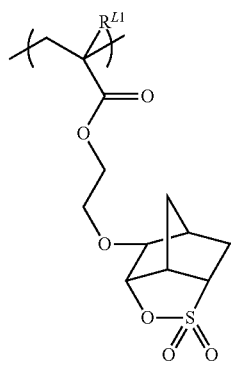
(5-3-6)

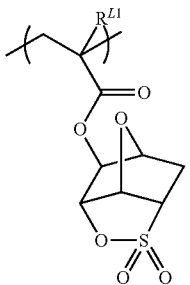
(5-3-7)

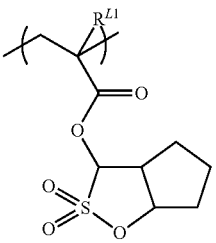
(5-3-11)

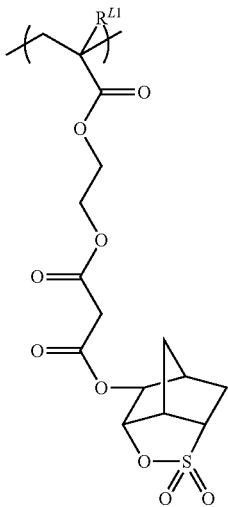
(5-3-8)

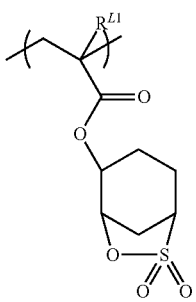
(5-3-9)

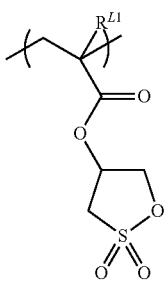
(5-3-10)

In the above formulae, $R^{L1}$ represents a hydrogen atom, a fluorine atom, a methyl group or a trifluoromethyl group.

As the structural unit (III), the structural units (III-1-1), (III-1-2), (III-1-5), (III-1-7), (III-1-10), (III-1-13), (III-1-19), (III-2-1) and (III-3-1) are more preferred.

The lower limit of the proportion of the structural unit (III) with respect to the total structural units in the polymer (B) is preferably 10 mol %, and more preferably 20 mol %. The upper limit of the proportion of the structural unit (III) is preferably 80 mol %, more preferably 70 mol %, and still more preferably 60 mol %. When the proportion of the structural unit (III) falls within the above range, the lithography performances of the radiation-sensitive resin composition (X1) can be further improved. In addition, the adhesiveness between the resulting resist pattern and the substrate can be further improved.

[Other Structural Unit]

The polymer (B) may have other structural unit than the structural units (II) and (III). Examples of the other structural unit include: a structural unit that includes at least one selected from the group consisting of a hydroxy group, a ketonic carbonyl group, a cyano group, a carboxy group, a nitro group and an amino group; a structural unit that includes an acid-nonlabile alicyclic hydrocarbon group such as a structural unit derived from tricyclodecyl (meth)acrylate; and the like. Of these, the structural unit that includes a hydroxy group is preferred, and a structural unit derived from 3-hydroxyadamantan-1-yl (meth)acrylate and a structural unit derived from 1-oxa-2-oxo-3-methylene-8-hydroxyspiro[4,5]decane are preferred. The upper limit of the proportion of these structural units is preferably 30 mol %, and more preferably 20 mol %.

The lower limit of the content of the polymer (B) with respect to 100 parts by mass of the polymer (A) is preferably 1,500 parts by mass, more preferably 2,000 parts by mass, and still more preferably 2,500 parts by mass. The upper limit of the content of the polymer (B) with respect to 100 parts by mass of the polymer (A) is preferably 9,000 parts by mass, more preferably 7,000 parts by mass, and still more preferably 4,000 parts by mass.

Moreover, the content of the polymer (B) with respect to the total solid content of the radiation-sensitive resin composition (X1) is preferably no less than 70% by mass, more preferably no less than 80% by mass, and still more preferably no less than 85% by mass.

[Synthesis Method of Polymer (B)]

The polymer (B) can be synthesized according to a similar method to that for the polymer (A) described above.

The polystyrene equivalent weight average molecular weight (Mw) as determined by gel permeation chromatography (GPC) of the polymer (B) is not particularly limited, and the lower limit of the Mw is preferably 1,000, more preferably 2,000, still more preferably 3,000, and particularly preferably 3,500. The upper limit of the Mw is preferably 50,000, more preferably 30,000, still more preferably 20,000, and particularly preferably 15,000. When the Mw of the polymer (B) falls within the above range, the application property and development defects-inhibiting property of the radiation-sensitive resin composition (X1) may be improved. When the Mw of the polymer (B) is less than the lower limit, the resist film exhibiting sufficient heat resistance may not be obtained. When the Mw of the polymer (B) is greater than the upper limit, the developability of the resist film may be deteriorated.

The ratio (Mw/Mn) of the Mw to the polystyrene equivalent number average molecular weight (Mn) as determined by GPC of the polymer (B) is typically no less than 1 and no greater than 5, preferably no less than 1 and no greater than 3, and still more preferably no less than 1 and no greater than 2.

[(C) Acid Generator]

The acid generator (C) is a substance that generates an acid upon an exposure. The acid thus generated allows the acid-labile group included in the polymer (B) or the like to be dissociated, thereby generating a carboxy group or the like. As a result, the solubility of the polymer or the like in the developer solution is altered, and thus a resist pattern can be formed from the radiation-sensitive resin composition. The acid generator (C) may be contained in the radiation-sensitive resin composition (X1) either in the form of a low-molecular-weight compound (hereinafter, may be also referred to as "(C) acid generating agent" or "acid generating agent (C)", as appropriate), as described later, or in the form of an acid generator incorporated as a part of the polymer, or may be in both of these forms.

The acid generating agent (C) is exemplified by an onium salt compound, an N-sulfonyloxyimide compound, a halogen-containing compound, a diazo ketone compound, and the like.

The onium salt compound is exemplified by a sulfonium salt, a tetrahydrothiophenium salt, an iodonium salt, a phosphonium salt, a diazonium salt, a pyridinium salt, and the like.

Specific examples of the acid generating agent (C) include compounds disclosed in paragraphs [0080] to [0113] of Japanese Unexamined Patent Application, Publication No. 2009-134088, and the like.

The acid generating agent (C) is preferably a compound represented by the following formula (cc). When the acid generating agent (C) is the compound represented by the following formula (cc), it is expected that a diffusion length of the acid generated upon the exposure in the resist film will be more properly decreased through e.g. an interaction with a polar structure included in the polymer (A) or the polymer (B), or the like, and consequently the lithography performances of the radiation-sensitive resin composition (X1) can be further improved.

$$R^{b1}\text{—}R^{b2}\text{—}SO_3^-M^+ \quad (cc)$$

In the above formula (cc), $R^{b1}$ represents a monovalent group that includes an alicyclic structure having 6 or more ring atoms or a monovalent group that includes an aliphatic heterocyclic structure having 6 or more ring atoms; $R^{b2}$ represents a fluorinated alkanediyl group having 1 to 10 carbon atoms; and $M^+$ represents a monovalent radioactive ray-labile onium cation.

In regard to $R^{b1}$, the number of "ring atoms" as referred to means the number of atoms constituting a ring included in the alicyclic structure or the aliphatic heterocyclic structure, and in the case of polycyclic alicyclic structures and polycyclic aliphatic heterocyclic structures, the number of "ring atoms" means the number of atoms constituting the plurality of rings.

Examples of the monovalent group that includes an alicyclic structure having 6 or more ring atoms which may be represented by $R^{b1}$ include:

saturated monocyclic alicyclic hydrocarbon groups such as a cyclooctyl group, a cyclononyl group, a cyclodecyl group and a cyclododecyl group;

unsaturated monocyclic alicyclic hydrocarbon groups such as a cyclooctenyl group and a cyclodecenyl group;

saturated polycyclic alicyclic hydrocarbon groups such as a norbornyl group, an adamantyl group, a tricyclodecyl group and a tetracyclododecyl group;

unsaturated polycyclic alicyclic hydrocarbon groups such as a norbornenyl group and a tricyclodecenyl group; and the like.

Examples of the monovalent group that includes an aliphatic heterocyclic structure having 6 or more ring atoms which may be represented by $R^{b1}$ include:

groups that include a lactone structure such as a norbornanelactone-yl group;

groups that include a sultone structure such as a norbornanesultone-yl group;

oxygen atom-containing heterocyclic groups such as an oxacycloheptyl group and an oxanorbornyl group;

nitrogen atom-containing heterocyclic groups such as an azacyclohexyl group, an azacycloheptyl group and a diazabicyclooctan-yl group;

sulfur atom-containing heterocyclic groups such as a thiacycloheptyl group and a thianorbornyl group; and the like.

In light of attaining a further proper diffusion length of the acid described above, the number of ring atoms included in the group represented by $R^{b1}$ is preferably no less than 8, more preferably 9 to 15, and still more preferably 10 to 13.

Of these, $R^{b1}$ represents preferably a monovalent group that includes an alicyclic structure having 9 or more ring atoms, a monovalent group that includes an aliphatic heterocyclic structure having 9 or more ring atoms, more preferably an adamantyl group, a hydroxyadamantyl group, a norbornanelactone-yl group, a 5-oxo-4-oxatricyclo[4.3.1.1$^{3,8}$]undecan-yl group, and still more preferably an adamantyl group.

Examples of the fluorinated alkanediyl group having 1 to 10 carbon atoms which is represented by $R^{b2}$ include groups obtained by substituting with a fluorine atom, at least one of hydrogen atoms included in an alkanediyl group having 1 to 10 carbon atoms such as a methanediyl group, an ethanediyl group, a propanediyl group, and the like.

Of these, a fluorinated alkanediyl group in which a fluorine atom bonds to a carbon atom adjacent to the $SO_3^-$ group is preferred, a fluorinated alkanediyl group in which two fluorine atoms bond to a carbon atom adjacent to the $SO_3^-$ group is more preferred, and a 1,1-difluoromethanediyl group, a 1,1-difluoroethanediyl group, a 1,1,3,3,3-pentafluoro-1,2-propanediyl group, a 1,1,2,2-tetrafluoroethanediyl group, a 1,1,2,2-tetrafluorobutanediyl group and a 1,1,2,2-tetrafluorohexanediyl group are still more preferred.

The monovalent radioactive ray-labile onium cation represented by $M^+$ is a cation that is degraded upon an irradiation with exposure light. In light-exposed regions, a sulfonic acid is generated from the sulfonate anion and a proton generated through degradation of the radioactive ray-labile onium cation. The monovalent radioactive ray-labile onium cation represented by $M^+$ is exemplified by radioactive ray-labile onium cations that contain an element such as S, I, O, N, P, Cl, Br, F, As, Se, Sn, Sb, Te and Bi. Examples of the cation that contains S (sulfur) as the element include a sulfonium cation, a tetrahydrothiophenium cation, and the like, and examples of the cation that contains I (iodine) as the element include an iodonium cation, and the like. Of these, the sulfonium cation, the tetrahydrothiophenium cation and the iodonium cation are preferred.

Examples of the acid generating agent (C) include compounds represented by the following formulae (cc-1) to (cc-17) (hereinafter, may be also referred to as "compounds (cc-1) to (cc-17)"), and the like.

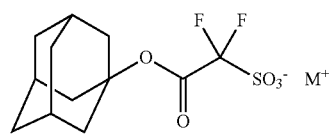
(cc-1)

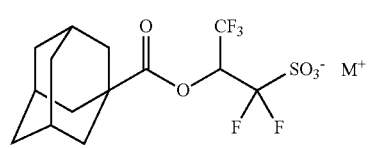
(cc-2)

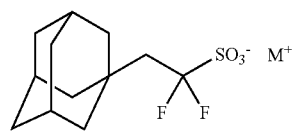
(cc-3)

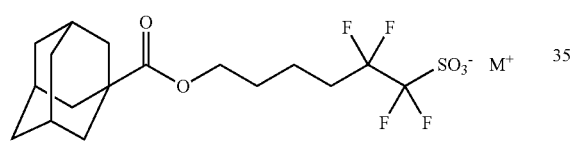
(cc-4)

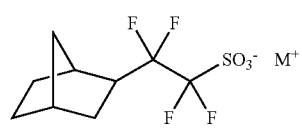
(cc-5)

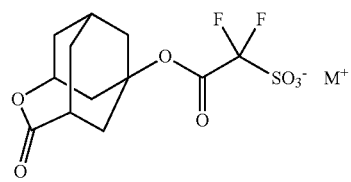
(cc-6)

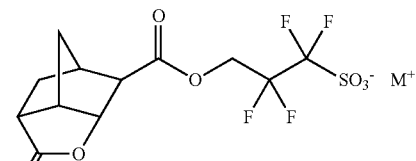
(cc-7)

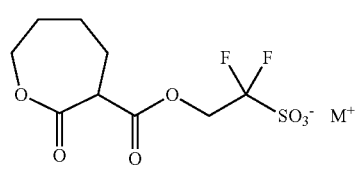
(cc-8)

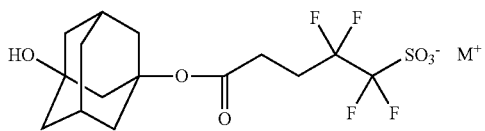
(cc-9)

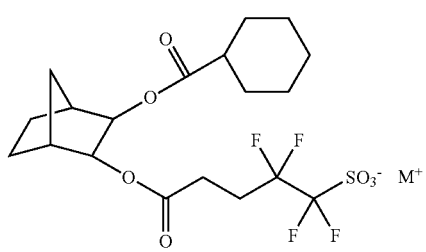
(cc-10)

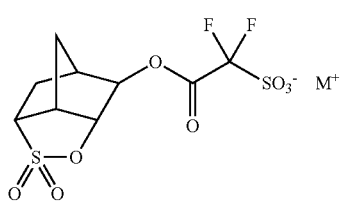
(cc-11)

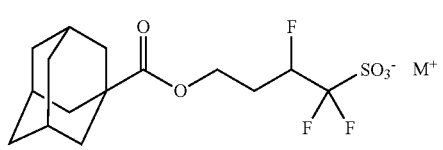
(cc-12)

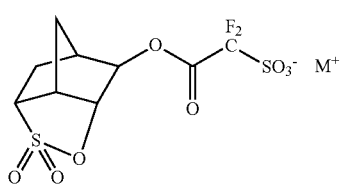
(cc-13)

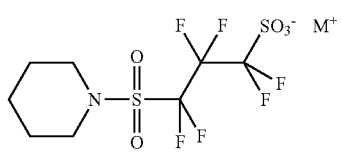
(cc-14)

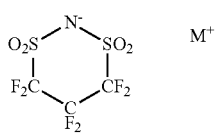
(cc-15)

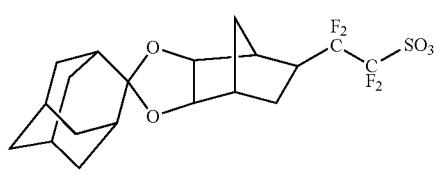
(cc-16)

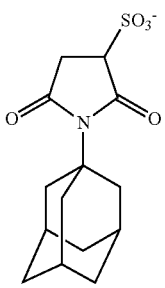 (cc-17)

In the above formulae (cc-1) to (cc-17), M+ represents a monovalent radioactive ray-labile onium cation.

Of these, as the acid generating agent (C), onium salt compounds are preferred, sulfonium salts are more preferred, and the compounds (cc-1) to (cc-3) and the compounds (cc-13) to (cc-17) are still more preferred.

In a case where the acid generator (C) is the acid generating agent (C), the lower limit of the content of the acid generating agent (C) with respect to 100 parts by mass of the polymer (B) is preferably 0.1 parts by mass, more preferably 0.5 parts by mass, still more preferably 1 part by mass, and particularly preferably 3 parts by mass. The upper limit of the content of the acid generating agent (C) is preferably 30 parts by mass, more preferably 20 parts by mass, and still more preferably 15 parts by mass. Either one type, or two or more types of the acid generator (C) may be used.

[(D) Solvent]

The radiation-sensitive resin composition (X1) typically contains (D) a solvent. The solvent (D) is not particularly limited as long as the solvent (D) can dissolve or disperse at least the compound (A) and the polymer (B), as well as the acid generating agent (C) contained as needed, etc.

The solvent (D) is exemplified by an alcohol solvent, an ether solvent, a ketone solvent, an amide solvent, an ester solvent, a hydrocarbon solvent, and the like.

Examples of the alcohol solvent include:
aliphatic monohydric alcohol solvents having 1 to 18 carbon atoms such as 4-methyl-2-pentanol and n-hexanol;
alicyclic monohydric alcohol solvents having 3 to 18 carbon atoms such as cyclohexanol;
polyhydric alcohol solvents having 2 to 18 carbon atoms such as 1,2-propylene glycol;
polyhydric alcohol partial ether solvents having 3 to 19 carbon atoms such as propylene glycol monomethyl ether; and the like.

Examples of the ether solvent include:
dialkyl ether solvents such as diethyl ether, dipropyl ether, dibutyl ether, dipentyl ether, diisoamyl ether, dihexyl ether and diheptyl ether;
cyclic ether solvents such as tetrahydrofuran and tetrahydropyran;
aromatic ring-containing ether solvents such as diphenyl ether and anisole (methyl phenyl ether); and the like.

Examples of the ketone solvent include:
chain ketone solvents such as acetone, methyl ethyl ketone, methyl n-propyl ketone, methyl n-butyl ketone, diethyl ketone, methyl iso-butyl ketone, 2-heptanone (methyl n-pentyl ketone), ethyl n-butyl ketone, methyl n-hexyl ketone, di-iso-butyl ketone and trimethylnonanone;
cyclic ketone solvents such as cyclopentanone, cyclohexanone, cycloheptanone, cyclooctanone and methylcyclohexanone;

2,4-pentanedione, acetonylacetone and acetophenone; and the like.

Examples of the amide solvent include:
cyclic amide solvents such as N,N'-dimethylimidazolidinone and N-methylpyrrolidone;
chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:
monocarboxylic acid ester solvents such as n-butyl acetate and ethyl lactate;
polyhydric alcohol carboxylate solvents such as propylene glycol acetate;
polyhydric alcohol partial ether carboxylate solvents such as propylene glycol monomethyl ether acetate;
lactone solvents such as γ-butyrolactone and δ-valerolactone;
polyhydric carboxylic acid diester solvents such as diethyl oxalate;
carbonate solvents such as dimethyl carbonate, diethyl carbonate, ethylene carbonate and propylene carbonate; and the like.

Examples of the hydrocarbon solvent include:
aliphatic hydrocarbon solvents having 5 to 12 carbon atoms such as n-pentane and n-hexane;
aromatic hydrocarbon solvents having 6 to 16 carbon atoms such as toluene and xylene; and the like.

Of these, as the solvent (D), the ester solvent and the ketone solvent are preferred, the polyhydric alcohol partial ether carboxylate solvent, the lactone solvent and the cyclic ketone solvent are more preferred, polyhydric alcohol partial alkyl ether acetate, the lactone solvent and cycloalkanones are still more preferred, and propylene glycol monomethyl ether acetate, γ-butyrolactone and cyclohexanone are particularly preferred. The radiation-sensitive resin composition may contain one type, or two or more types of the solvent (D).

[Other Component]

The radiation-sensitive resin composition (X1) may contain other component than the components (A) to (D). The other component is exemplified by (E) an acid diffusion control agent, a surfactant, an alicyclic skeleton-containing compound, a sensitizing agent, and the like. Each of these other components may be used either alone of one type, or two or more types thereof may be used in combination.

[(E) Acid Diffusion Control Agent]

The acid diffusion control agent (E) controls a diffusion phenomenon of an acid generated from the acid generator (C) in the resist film upon an exposure. Consequently, the acid diffusion control agent (E) achieves the effect of inhibiting unfavorable chemical reactions in light-unexposed regions. Moreover, the storage stability of the resulting radiation-sensitive resin composition may be further improved. In addition, a resolution for use as a resist is further improved, while variation of the line width of the resist pattern caused by a variation of post exposure time delay from the exposure until a development treatment can be inhibited, which enables a radiation-sensitive resin composition with superior process stability to be obtained.

The acid diffusion control agent (E) is exemplified by a compound represented by the following formula (EE-1) (hereinafter, may be also referred to as "nitrogen-containing compound (I)"), a compound having two nitrogen atoms in a single molecule (hereinafter, may be also referred to as "nitrogen-containing compound (II)"), a compound having three nitrogen atoms (hereinafter, may be also referred to as "nitrogen-containing compound (III)"), an amide group-containing compound, a urea compound, a nitrogen-containing heterocyclic compound, and the like.

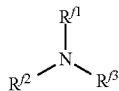

(EE-1)

In the above formula (EE-1), $R^{f1}$, $R^{f2}$ and $R^{f3}$ each independently represent a hydrogen atom, or a substituted or unsubstituted linear or branched alkyl group, a substituted or unsubstituted monovalent saturated alicyclic hydrocarbon group, a substituted or unsubstituted monovalent aryl group or a substituted or unsubstituted monovalent aralkyl group.

Examples of the nitrogen-containing compound (I) include monoalkylamines such as n-hexylamine; dialkylamines such as di-n-butylamine; trialkylamines such as triethylamine and tri-n-pentylamine; aromatic amines such as aniline; and the like.

Examples of the nitrogen-containing compound (II) include ethylenediamine, N,N,N',N'-tetramethylethylenediamine, and the like.

Examples of the nitrogen-containing compound (III) include: polyamine compound such as polyethyleneimine and polyallylamine; polymers of dimethylaminoethylacrylamide, etc.; and the like.

Examples of the amide group-containing compound include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compound include: pyridines such as pyridine and 2-methylpyridine; morpholines such as N-propylmorpholine and N-(undecan-1-ylcarbonyloxyethyl)morpholine; pyrazines; pyrazoles; and the like.

A photolabile base that is basic and is sensitized upon an exposure to generate a weak acid may also be used as the acid diffusion control agent (E). By way of an example, the photolabile base is exemplified by an onium salt compound that loses acid diffusion controllability through degradation upon an exposure. The onium salt compound is exemplified by a sulfonium salt compound represented by the following formula (EE-2), an iodonium salt compound represented by the following formula (EE-3), and the like.

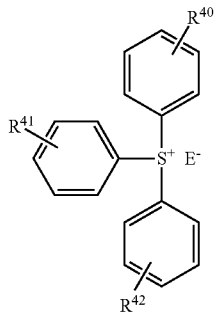

(EE-2)

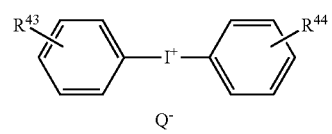

(EE-3)

In the above formulae (EE-2) and (EE-3), $R^{40}$ to $R^{44}$ each independently represent a hydrogen atom, an alkyl group, an alkoxy group, a hydroxy group, a halogen atom or $-SO_2-R^C$, wherein $R^C$ represents an alkyl group, a cycloalkyl group, an alkoxy group or an aryl group; and $Z^-$ represents $OH^-$, $R^{50}-COO^-$, $R^D-SO_2-N^--R^{50}$, $R^{50}-SO_3^-$ or an anion represented by the following formula (EE-4), wherein $R^{50}$ and $R^D$ each independently represent a monovalent organic group having 1 to 30 carbon atoms.

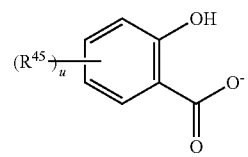

(EE-4)

In the above formula (EE-4), $R^{45}$ represents a linear or branched alkyl group having 1 to 12 carbon atoms, or a linear or branched alkoxy group having 1 to 12 carbon atoms, wherein a part or all of hydrogen atoms included in the linear or branched alkyl group or the linear or branched alkoxy group may be substituted with a fluorine atom; and u is an integer of 0 to 2.

The monovalent organic group having 1 to 30 carbon atoms which is represented by $R^{50}$ or $R^D$ is exemplified by: a monovalent hydrocarbon group having 1 to 30 carbon atoms; a group obtained from the hydrocarbon group by incorporating a hetero atom-containing group between two adjacent carbon atoms or at the end on the atomic bonding side of the hydrocarbon group; a group obtained by substituting with a substituent, a part or all of hydrogen atoms included in the monovalent hydrocarbon groups or the group obtained from the hydrocarbon group by incorporating a hetero atom-containing group; and the like. The hydrocarbon group which may be represented by $R^{50}$ or $R^D$ is preferably a linear or branched hydrocarbon group or an alicyclic hydrocarbon group.

Examples of the sulfonium salt compound represented by the above formula (EE-2) include compounds represented by the following formulae, and the like.

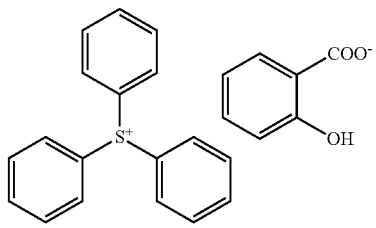

-continued

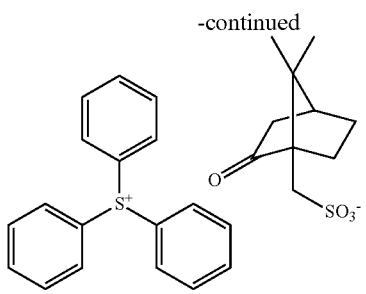

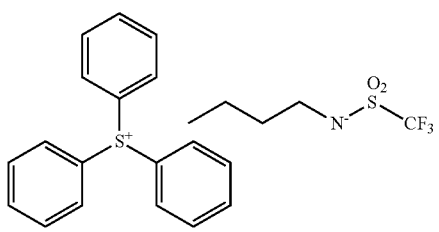

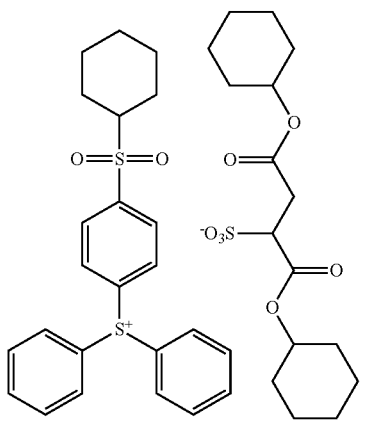

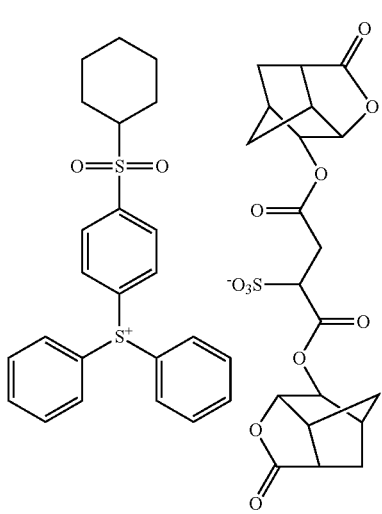

-continued

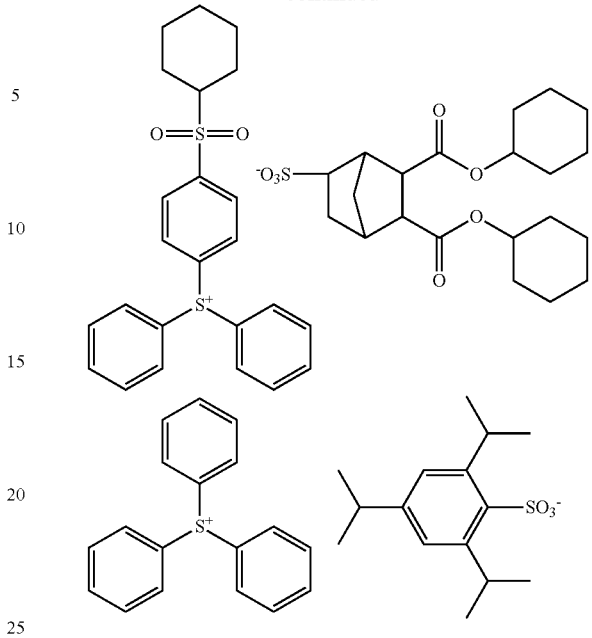

As the photolabile base, the sulfonium salt compound represented by the above formula (EE-2) is preferred.

In a case where the radiation-sensitive resin composition (X1) contains the acid diffusion control agent (E), the upper limit of the content of the acid diffusion control agent (E) with respect to 100 parts by mass of the polymer (B) is typically 10 parts by mass. When the content of the acid diffusion control agent (E) is greater than 10 parts by mass, the sensitivity for use as a resist tends to be deteriorated.

[Preparation Method of Radiation-Sensitive Resin Composition (X1)]

The radiation-sensitive resin composition (X1) may be prepared by, for example, dissolving the polymer (A), the polymer (B) and the acid generator (C) as well as the acid diffusion control agent (E) etc. as needed in the solvent (D), and preferably filtering the resulting mixture through a filter having a pore size of about 0.2 μm. In light of ease of application, the lower limit of the solid content concentration of the radiation-sensitive resin composition (X1) is preferably 0.2% by mass, more preferably 0.5% by mass, and still more preferably 1% by mass. The upper limit of the solid content concentration of the radiation-sensitive resin composition (X1) is preferably 50% by mass, more preferably 30% by mass, and still more preferably 10% by mass.

[Radiation-Sensitive Resin Composition (X2)]

The radiation-sensitive resin composition (X2) contains the polymer (B) and the acid generator (C). The radiation-sensitive resin composition (X2) may further contain, in addition to the polymer (B) and the acid generator (C), the solvent (D), the acid diffusion control agent (E) and the like, which may be contained in the radiation-sensitive resin composition (X1) described above. The favorable amount of each component is similar to that for the case of the radiation-sensitive resin composition (X1).

[Preparation Method of Radiation-Sensitive Resin Composition (X2)]

The radiation-sensitive resin composition (X2) may be prepared by, for example, dissolving the polymer (B) and the acid generator (C) as well as the acid diffusion control agent (E) etc. as needed in the solvent (D), and preferably filtering the resulting mixture through a filter having a pore size of about 0.2 μm. In light of ease of application, the lower limit of the solid content concentration of the radiation-sensitive resin composition (X2) is preferably 0.2% by mass, more preferably 0.5% by mass, and still more preferably 1% by mass. The upper limit of the solid content concentration of the radiation-sensitive resin composition (X2) is preferably 50% by mass, more preferably 30% by mass, and still more preferably 10% by mass.

<Composition for Upper Layer Film Formation (Y)>

The type, for example, of the composition for upper layer film formation (Y) is not particularly limited, and a composition for upper layer film formation appropriately selected in accordance with an intended use of the resist from among compositions for upper layer film formation which are conventionally used for forming an upper layer film of a resist film may be used as the composition for upper layer film formation (Y). Of the compositions for upper layer film formation, a composition for upper layer film formation which contains a second polymer component (hereinafter, may be also referred to as "polymer component (II)") and a solvent (hereinafter, may be also referred to as "(P) solvent" or "solvent (P)") is preferred.

The composition for upper layer film formation (Y) is exemplified by a composition for upper layer film formation (Y1), a composition for upper layer film formation (Y2) described below, and the like:

composition for upper layer film formation (Y1): a composition for upper layer film formation containing (J) a polymer component as the polymer component (II), and satisfying at least one selected from the group consisting of (i) and (ii) described below; and composition for upper layer film formation (Y2): a composition for upper layer film formation containing the polymer component (II) which has, in a single polymer or different polymers, a first structural unit that includes an alicyclic structure (hereinafter, may be also referred to as "structural unit (A)"), and a second structural unit that is other than the structural unit (A) and includes a fluorine atom (hereinafter, may be also referred to as "structural unit (B)"), wherein the percentage content of the fluorine atom in the polymer component (II) is no less than 2% by mass and no greater than 30% by mass.

Hereinafter, the composition for upper layer film formation (Y1) and the composition for upper layer film formation (Y2) will be described.

[Composition for Upper Layer Film Formation (Y1)]

The composition for upper layer film formation (Y1) contains the polymer component (J) as the polymer component (II) and the solvent (P), and the composition for upper layer film formation (Y1) satisfies at least one selected from the group consisting of (i) and (ii) below:

(i) the composition for upper layer film formation (Y1) further containing the acid diffusion inhibiting compound (K); and (ii) the polymer component (J) having a structural unit (VI) that includes an acid diffusion-inhibiting group.

The acid diffusion inhibiting compound (K) includes a compound represented by the following formula (1), a compound represented by the following formula (2), a compound represented by the following formula (3), or a combination thereof.

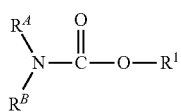
(1)

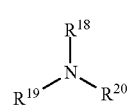
(2)

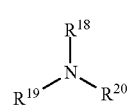
(3)

In the above formula (1), $R^A$ and $R^B$ each independently represent a hydrogen atom or a monovalent organic group having 1 to 20 carbon atoms, or $R^A$ and $R^B$ taken together represent an aliphatic heterocyclic structure having 3 to 20 ring atoms together with the nitrogen atom to which $R^A$ and $R^B$ bond; and $R^1$ represents a monovalent hydrocarbon group having 1 to 20 carbon atoms.

In the above formula (2), $X^+$ represents a monovalent onium cation; and $Y^-$ represents a monovalent weak acid anion.

In the above formula (3), $R^{18}$, $R^{19}$ and $R^{20}$ each independently represent a hydrogen atom, or a substituted or unsubstituted linear or branched alkyl group, a monovalent saturated alicyclic hydrocarbon group, a monovalent aryl group or a monovalent aralkyl group.

The acid diffusion-inhibiting group includes a group represented by the following formula (1'), a group represented by the following formula (2'-1), a group represented by the following formula (2'-2), a group represented by the following formula (3'), or a combination thereof.

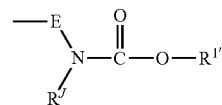
(1')

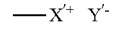
(2'-1)

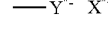
(2'-2)

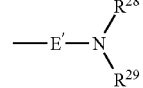
(3')

In the above formula (1'), E represents a single bond or a divalent organic group having 1 to 20 carbon atoms; $R^J$ represents a hydrogen atom or a monovalent organic group having 1 to 20 carbon atoms, wherein $R^J$ and E may taken together represent an aliphatic heterocyclic structure having 3 to 20 ring atoms together with the nitrogen atom to which $R^J$ and E bond; and $R^{1'}$ represents a monovalent hydrocarbon group having 1 to 20 carbon atoms.

In the above formula (2'-1), $X'^+$ represents a monovalent group that includes a monovalent onium cation; and $Y'^-$ represents a monovalent weak acid anion.

In the above formula (2'-2), $Y''^-$ represents a monovalent group that includes a monovalent weak acid anion; and $X''^+$ represents a monovalent onium cation.

In the above formula (3'), E' represents a single bond or a divalent organic group having 1 to 20 carbon atoms; and $R^{28}$ and $R^{29}$ each independently represent a hydrogen atom or a monovalent organic group having 1 to 20 carbon atoms, wherein any two of $R^{28}$, $R^{29}$ and E' may taken together represent an aliphatic heterocyclic structure having 3 to 20 ring atoms together with the nitrogen atom to which the any two of $R^{28}$, $R^{29}$ and E' bond.

The composition for upper layer film formation (Y1) is used in a negative resist pattern-forming method which includes using a developer solution containing an organic solvent. According to the negative resist pattern-forming method which includes using the developer solution containing an organic solvent, a finer resist pattern can be formed since a higher optical contrast can be achieved as compared with a positive resist pattern-forming method which includes using a developer solution such as an alkaline aqueous solution, and the like. Since at least one selected from the group consisting of the conditions "(i) the composition for upper layer film formation (Y1) further containing the acid diffusion inhibiting compound (K)" and "(ii) the polymer component (J) having a structural unit (VI) that includes an acid diffusion-inhibiting group" is satisfied, diffusion of an acid into light-unexposed regions and a deprotection reaction can be inhibited, and thus a high dissolution contrast can be attained. In particular, a resolution of a desired line width can be achieved even under a low optical contrast condition such as a defocusing state, leading to a possible improvement of a process window. Hereinafter, each component will be described.

[(J) Polymer Component]

In regard to the polymer component (J), it is preferred that a part or all of polymers constituting the polymer component (J) have a structural unit (IV) that includes a hydrocarbon structure. Moreover, it is preferred that the polymer component (J) has a structural unit (V) that includes a fluorine atom (except for the structural unit (IV)), the structural unit (VI) that includes an acid diffusion-inhibiting group, which are described later, or a combination thereof. Hereinafter, each structural unit will be described.

[Structural Unit (IV)]

The structural unit (IV) includes a hydrocarbon structure.

The hydrocarbon structure is exemplified by a hydrocarbon structure such as a chain hydrocarbon structure, an alicyclic hydrocarbon structure and an aromatic hydrocarbon structure. The chain hydrocarbon structure, the alicyclic hydrocarbon structure and the aromatic hydrocarbon structure as referred to herein mean a structure derived from a chain hydrocarbon, a structure derived from an alicyclic hydrocarbon and a structure derived from an aromatic hydrocarbon, respectively.

Examples of the chain hydrocarbon structure include:

alkyl structures such as a n-propyl structure, an i-propyl structure, a n-butyl structure, an i-butyl structure, a sec-butyl structure and a t-butyl structure;

alkenyl structures such as a propenyl structure and a butenyl structure;

alkynyl structures such as a propynyl structure and a butynyl structure; and the like.

The number of carbon atoms of the alkyl structure, the alkenyl structure or the alkynyl structure is preferably 2 to 20.

Examples of the aromatic hydrocarbon structure include:

aryl structure groups such as a phenyl structure, a tolyl structure, a xylyl structure, a naphthyl structure and an anthryl structure;

aralkyl structures such as a benzyl structure, a phenethyl structure, a phenylpropyl structure and a naphthylmethyl structure; and the like.

Examples of the alicyclic hydrocarbon structure (hereinafter, may be also referred to as "alicyclic structure"; and hereinafter, the structural unit that includes an alicyclic structure may be also referred to as "structural unit (A)") include:

monocyclic structures, e.g.;

saturated monocyclic alicyclic hydrocarbon structures such as a cyclopropane structure, a cyclobutane structure, a cyclopentane structure, a cyclohexane structure, a cyclooctane structure, a cyclodecane structure and a cyclododecane structure; and unsaturated monocyclic alicyclic hydrocarbon structures such as a cyclopropene structure, a cyclobutene structure, a cyclopentene structure, a cyclohexene structure, a cyclooctene structure, a cyclodecene structure and a cyclododecene structure;

polycyclic structures, e.g.;

saturated polycyclic alicyclic hydrocarbon structures such as a norbornane structure, an adamantane structure, a tricyclodecane structure and a tetracyclododecane structure; and unsaturated polycyclic alicyclic hydrocarbon structures such as a norbornene structure, a tricyclodecene structure and a tetracyclododecene structure; and the like.

In light of a greater receding contact angle of a liquid immersion liquid on the upper layer film, and a possible exposure by high speed scanning without being accompanied by residual water bead, the hydrocarbon structure of the structural unit (IV) is preferably the alicyclic structure, more preferably a polycyclic alicyclic structure, and still more preferably a saturated polycyclic alicyclic hydrocarbon structure. As the alicyclic structure, a polycyclic hydrocarbon structure not having any hetero atom therein is preferred.

[Structural Unit (A)]

The structural unit (A) includes an alicyclic structure. The structural unit (A) is exemplified by: a structural unit derived from a (meth)acrylic acid ester having an alicyclic structure (hereinafter, may be also referred to as "structural unit (A-1)"); a structural unit derived from an exo-methylene lactone having an alicyclic structure (hereinafter, may be also referred to as "structural unit (A-2)"); a structural unit derived from a cycloolefin (hereinafter, may be also referred to as "structural unit (A-3)"); and the like. The structural unit (A-1) is exemplified by a structural unit represented by the following formula (6-1) (hereinafter, may be also referred to as "structural unit (A-1a)"), and the like. The structural unit (A-2) is exemplified by a structural unit represented by the following formula (6-2) (hereinafter, may be also referred to as "structural unit (A-2a)"), and the like. The cycloolefin is exemplified by a substituted or unsubstituted norbornene, a substituted or unsubstituted tricyclodecene, a substituted or unsubstituted tetracyclododecene, and the like.

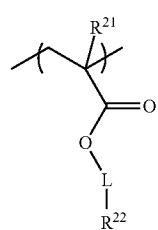

(6-1)

(6-2)

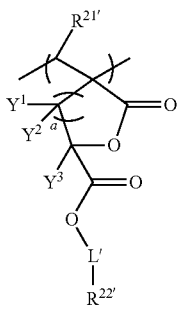

In the above formula (6-1), $R^{21}$ represents a hydrogen atom, a fluorine atom, a methyl group or a trifluoromethyl group; L represents a single bond or a divalent organic group having 1 to 20 carbon atoms; and $R^{22}$ represents a substituted or unsubstituted monovalent alicyclic hydrocarbon group having 3 to 20 ring atoms.

In the above formula (6-2), $R^{21'}$ represents a hydrogen atom or a methyl group; $Y^1$, $Y^2$ and $Y^3$ each independently represent a hydrogen atom or a monovalent organic group having 1 to 20 carbon atoms; a is an integer of 1 to 4, wherein in a case where a is no less than 2, a plurality of $Y^1$s may be identical or different, and a plurality of $Y^1$s may be identical or different; L' represents a single bond or a divalent organic group having 1 to 20 carbon atoms; and $R^{22'}$ represents a substituted or unsubstituted monovalent alicyclic hydrocarbon group having 3 to 20 ring atoms.

In light of the copolymerizability of a monomer that gives the structural unit (A-1), $R^{21}$ represents preferably a hydrogen atom or a methyl group, and more preferably a methyl group. In light of the copolymerizability of a monomer that gives the structural unit (A-2), $R^{21'}$ preferably represents a hydrogen atom.

The divalent organic group having 1 to 20 carbon atoms which may be represented by L or L' is exemplified by: a divalent hydrocarbon group having 1 to 20 carbon atoms; a group (α) obtained from the hydrocarbon group by incorporating a divalent hetero atom-containing group between two adjacent carbon atoms or at the end on the atomic bonding side of the hydrocarbon; a group obtained from the hydrocarbon group or the group (α) by substituting a part or all of hydrogen atoms included therein with a monovalent hetero atom-containing group; and the like.

L and L' represent preferably a single bond or a chain hydrocarbon group having 1 to 5 carbon atoms, more preferably a single bond or a methanediyl group, and still more preferably a single bond.

Examples of the monovalent alicyclic hydrocarbon group having 3 to 20 ring atoms which is represented by $R^{22}$ or $R^{22'}$ include:

monocyclic alicyclic hydrocarbon groups, e.g.;

saturated monocyclic alicyclic hydrocarbon groups such as a cyclopropyl group, a cyclobutyl group, a cyclopentyl group, a cyclohexyl group, a cyclooctyl group, a cyclodecyl group and a cyclododecyl group; and unsaturated monocyclic alicyclic hydrocarbon groups such as a cyclopropenyl group, a cyclobutenyl group, a cyclopentenyl group, a cyclohexenyl group, a cyclooctenyl group, a cyclodecenyl group and a cyclododecenyl group;

polycyclic alicyclic hydrocarbon groups, e.g.;

saturated polycyclic alicyclic hydrocarbon groups such as a norbornyl group, an adamantyl group, a tricyclodecyl group and a tetracyclododecyl group; and unsaturated polycyclic alicyclic hydrocarbon groups such as a norbornenyl group, a tricyclodecenyl group and a tetracyclododecyl group; and the like.

The substituent of the alicyclic hydrocarbon group is exemplified by a hydrocarbon group having 1 to 10 carbon atoms, a hydroxy group, a cyano group, a nitro group, a sulfanyl group; and the like.

$R^{22}$ and $R^{22'}$ represent preferably an unsubstituted alicyclic hydrocarbon group, more preferably a polycyclic alicyclic hydrocarbon group, still more preferably a saturated polycyclic alicyclic hydrocarbon group, still more preferably a saturated alicyclic hydrocarbon group having three rings, particularly preferably a tricyclodecanyl group, and further particularly preferably a tricyclo[5.2.1.0$^{2,6}$]decanyl group.

Examples of the structural unit (A-1) include structural units represented by the following formulae (6-1-1) to (6-1-9) (hereinafter, may be also referred to as "structural units (A-1a-1) to (A-1a-9)"), and the like. Examples of the structural unit (A-2) include structural units represented by the following formulae (6-2-1) and (6-2-2) (hereinafter, may be also referred to as "structural units (A-2a-1) and (A-2a-2)", and the like. Examples of the structural unit (A-3) include structural units represented by the following formulae (6-3-1) and (6-3-2) (hereinafter, may be also referred to as "structural units (A-3-1) and (A-3-2)"), and the like.

(6-1-1)

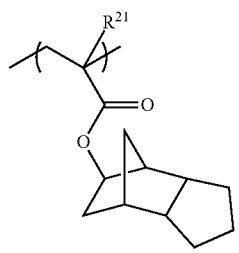

(6-1-2)

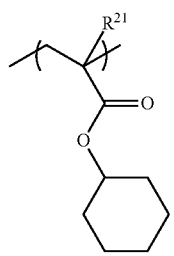

(6-1-3)

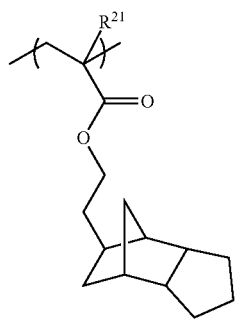

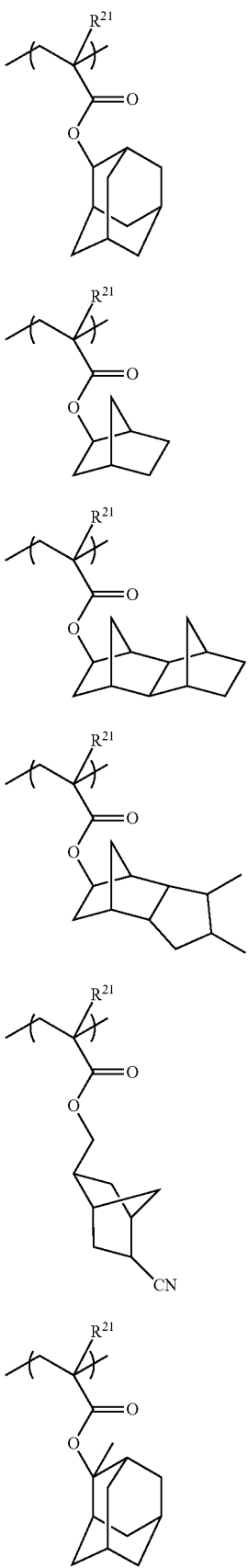

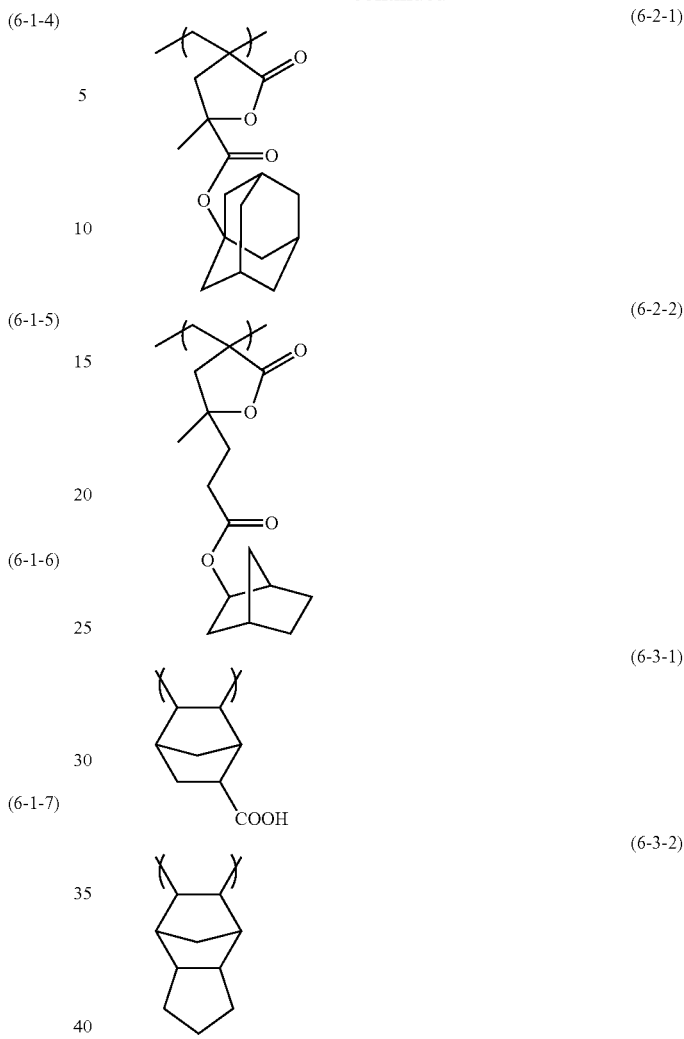

In the above formulae (6-1-1) to (6-1-9), $R^{21}$ is as defined in the above formula (6-1).

As the structural unit (A), the structural units (A-1) and (A-2) are preferred, the structural units (A-1a-1) to (A-1a-9), (A-2a-1) and (A-2a-2) are more preferred, and the structural units (A-1a-1), (A-1a-9) and (A-2a-1) are still more preferred.

The lower limit of the proportion of the structural unit (IV) in the polymer component (J) with respect to the total structural units constituting the polymer component (J) is preferably 50 mol %, more preferably 65 mol %, still more preferably 70 mol %, particularly preferably 75 mol %, and further particularly preferably 80 mol %.

The lower limit of the proportion of the structural unit (A) in the polymer component (J) with respect to the total structural units constituting the polymer component (J) is preferably 50 mol %, more preferably 65 mol %, still more preferably 70 mol %, particularly preferably 75 mol %, and further particularly preferably 80 mol %.

When the proportion of the structural unit (IV) or the structural unit (A) falls within the above range, the solubility of the polymer (J) in the developer solution can be adjusted more properly. Consequently, according to the resist pattern-forming method, both the water repellency of the surface of the upper layer film and a development defects-inhibiting property can be further enhanced.

[Structural Unit (V)]

The structural unit (V) is other than the structural unit (IV) and includes a fluorine atom. Thus, structural units that include a hydrocarbon structure and a fluorine atom shall be included in the structural unit (IV).

In a case where the polymer component (J) has the structural unit (V), the polymer component (J) has the structural unit (IV) and the structural unit (V) in a single polymer or different polymers. The mode of the polymer component (J) having the structural unit (V) is exemplified by the following polymer component (J1), polymer component (J2), and the like:

polymer component (J1): containing a polymer (a') that has the structural unit (IV), and a polymer (b') that has the structural unit (V); and polymer component (J2): containing a polymer (c') that has the structural unit (IV) and the structural unit (V).

The polymer component (J1) may contain other polymer than the polymer (a') and the polymer (b'). The polymer component (J2) may contain other polymer than the polymer (c').

The structural unit (V) is exemplified by a structural unit (V-1) that includes a group represented by the following formula (7), a structural unit (V-2) that includes a fluorinated alkyl group, and the like.

(Structural Unit (V-1))

The structural unit (V-1) includes a group represented by the following formula (7) (hereinafter, may be also referred to as "group (7)"). When the polymer component (J) has the structural unit (V-1), both the water repellency and the solubility in a developer solution can be adjusted more properly. Consequently, the water repellency of the surface of the upper layer film and the defects-inhibiting property can be further improved.

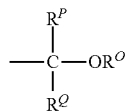

(7)

In the above formula (7), $R^O$ represents a hydrogen atom or a monovalent organic group having 1 to 20 carbon atoms; and $R^P$ and $R^Q$ each independently represent a fluorine atom or a fluorinated alkyl group having 1 to 20 carbon atoms.

The monovalent organic group having 1 to 20 carbon atoms which may be represented by $R^O$ is exemplified by: a monovalent hydrocarbon group having 1 to 20 carbon atoms; a group obtained from the hydrocarbon group by incorporating a hetero atom-containing group between two adjacent carbon atoms or at the end on the atomic bonding side of the hydrocarbon group; a group obtained from the monovalent hydrocarbon group or the group obtained from the hydrocarbon group by incorporating a hetero atom-containing group, by substituting a part or all of hydrogen atoms included therein with a substituent; and the like.

$R^O$ preferably represents the hydrogen atom in light of more proper adjustment of the solubility in the developer solution and a further possible improvement of the development defects-inhibiting property.

Examples of the fluorinated alkyl group having 1 to 20 carbon atoms which may be represented by $R^P$ or $R^Q$ include:

partially fluoro-substituted alkyl groups such as a fluoromethyl group, a difluoromethyl group, a difluoroethyl group, a trifluoroethyl group, a trifluoropropyl group, a pentafluoropropyl group, a heptafluorobutyl group and a nonafluoropentyl group;

perfluoroalkyl groups such as a trifluoromethyl group, a pentafluoroethyl group, a hexafluoropropyl group, a nonafluorobutyl group and an undecafluoropentyl group; and the like. Of these, the perfluoroalkyl groups are preferred, and the trifluoromethyl group is more preferred.

Examples of the group (7) include groups represented by the following formulae (7-1) to (7-8) (hereinafter, may be also referred to as "groups (7-1) to (7-8)"), and the like.

(7-1)

(7-2)

(7-3)

(7-4)

(7-5)

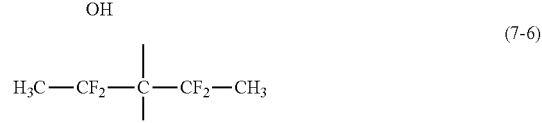

(7-6)

(7-7)

(7-8)

As the group (7), hydroxybis(perfluoroalkyl)methyl groups are preferred, the groups (7-1) to (7-3) are more preferred, and the group represented by the group (7-1) is still more preferred.

Examples of the structural unit (V-1) include a structural unit represented by the following formula (7-a) (hereinafter, may be also referred to as "structural unit (V-1a)"), a structural unit represented by the following formula (7-b) (hereinafter, may be also referred to as "structural unit (V-1b)"), and the like.

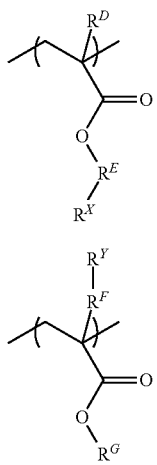 (7-a)

 (7-b)

In the above formula (7-a), $R^D$ represents a hydrogen atom, a fluorine atom, a methyl group or a trifluoromethyl group; $R^E$ represents a divalent linking group; and $R^X$ represents the group (7) described above.

In the above formula (7-b), $R^Y$ represents the group (7) described above; $R^F$ represents a single bond or a divalent linking group; and $R^G$ represents a hydrogen atom or a monovalent organic group.

In light of the copolymerizability of a monomer that gives the structural unit (V-1a), etc., $R^D$ represetns preferably the hydrogen atom or the methyl group, and more preferably the methyl group.

The divalent linking group represented by $R^E$ is exemplified by: a divalent chain hydrocarbon group having 1 to 6 carbon atoms; a divalent alicyclic hydrocarbon group having 4 to 12 carbon atoms; a group obtained from the chain hydrocarbon group or the alicyclic hydrocarbon group by incorporating —O—, -D-, —CO—, -CD- or a combination thereof between two adjacent carbon atoms thereof; and the like.

Examples of the divalent chain hydrocarbon group having 1 to 6 carbon atoms include:

alkanediyl groups such as a methanediyl group, a 1,1-ethanediyl group, a 1,2-ethanediyl group, a 1,1-propanediyl group, a 1,2-propanediyl group, a 1,3-propanediyl group, a 2,2-propanediyl group, a 1,4-propanediyl group, a 1,5-pentanediyl group, a 1,6-hexanediyl group, a 1-methyl-1,3-propanediyl group, a 2-methyl-1,3-propanediyl group, a 2-methyl-1,2-propanediyl group, a 1-methyl-1,4-butanediyl group and a 2-methyl-1,4-butanediyl group;

alkenediyl groups such as a 1,2-ethenediyl group, a 1,3-propenediyl group and a 1,2-propenediyl group;

alkynediyl groups such as a 1,2-ethynediyl group and a 1,3-propynediyl group; and the like.

Of these, the alkanediyl groups are preferred, the methanediyl group, the ethanediyl groups and the propanediyl groups are more preferred, the methanediyl group, the 1,1-ethanediyl group, the 1,2-ethanediyl group, the 1,2-propanediyl group and the 1,3-propanediyl group are still more preferred, and the 1,2-propanediyl group is particularly preferred.

Examples of the divalent alicyclic hydrocarbon group having 4 to 12 carbon atoms include:

monocyclic cycloalkanediyl groups, e.g., cyclobutanediyl groups such as a 1,3-cyclobutanediyl group, cyclopentanediyl groups such as a 1,3-cyclopentanediyl group, cyclo-hexanediyl groups such as a 1,4-cyclohexanediyl group and a 1,2-cyclohexanediyl group, cyclooctanediyl groups such as a 1,5-cyclooctanediyl group, cyclopentylethanediyl groups such as a 1,1-cyclopentylethanediyl group and a 1,2-cyclopentylethanediyl group, and cyclohexylethanediyl groups such as a 1,1-cyclohexylethanediyl group and a 1,2-cyclohexylethanediyl group;

polycyclic cycloalkanediyl groups, e.g., norbornanediyl groups such as a 1,4-norbornanediyl group and a 2,5-norbornanediyl group, adamantanediyl groups such as a 1,3-adamantanediyl group and a 2,4-adamantanediyl group, tetracyclododecanediyl groups such as a 2,7-tetracyclododecanediyl group, a norbornylmethanediyl group, and an adamantylmethanediyl group; and the like.

Of these, the norbornanediyl group, the tetracyclododecanediyl groups and cyclohexylethanediyl groups are preferred, the 2,5-norbornanediyl group, the 2,7-tetracyclododecanediyl group and the 1,2-cyclohexylethanediyl group are more preferred, and the 1,2-cyclohexylethanediyl group is still more preferred.

Examples of the structural unit (V-1a) include structural units represented by the following formulae (7-a-1) to (7-a-5) (hereinafter, may be also referred to as "structural units (V-1a-1) to (V-1a-5)"), and the like.

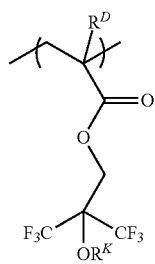 (7-a-1)

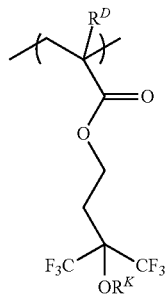 (7-a-2)

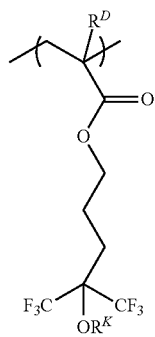 (7-a-3)

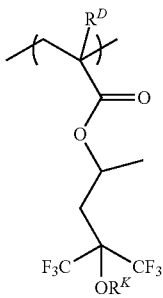

(7-a-4)

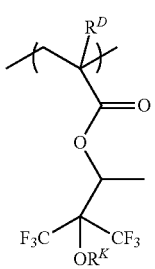

(7-a-5)

In the above formulae (7-a-1) to (7-a-5), $R^A$ is as defined in the above formula (7); and $R^D$ is as defined in the above formula (7-a).

The divalent linking group which may be represented by $R^F$ is exemplified by: a divalent chain hydrocarbon group having 1 to 20 carbon atoms; a divalent alicyclic hydrocarbon group having 3 to 20 carbon atoms; a group obtained by combining —O— with one, or two or more types of the chain hydrocarbon group and/or one, or two or more types of the alicyclic hydrocarbon group; and the like.

Examples of the divalent chain hydrocarbon group having 1 to 20 carbon atoms include a methanediyl group, an ethanediyl group, a propanediyl group, a butanediyl group, a pentanediyl group, a hexanediyl group, an octanediyl group, a decanediyl group, a dodecanediyl group, a tetradecanediyl group, a hexadecanediyl group, an octadecanediyl group, an icosanediyl group, and the like.

Examples of the divalent alicyclic hydrocarbon group having 3 to 20 carbon atoms include a cyclopropanediyl group, a cyclobutanediyl group, a cyclopentanediyl group, a cyclohexanediyl group, a cyclooctanediyl group, a cyclodecanediyl group, and the like.

Examples of the group obtained by combining —O— with one, or two or more types of the chain hydrocarbon group and/or one, or two or more types of the alicyclic hydrocarbon group include: alkanediyloxy groups such as a methanediyloxy group, an ethanediyloxy group, a propanediyloxy group, a butanediyloxy group, a pentanediyloxy group, a hexanediyloxy group and an octanediyloxy group; groups that include one —O— such as a methanediyloxymethanediyl group, a methanediyloxyethanediyl group, a methanediyloxy(6,2-propanediyl) group, a methanediyloxybutanediyl group and a methanediyloxycyclohexanediyl group; groups that include two or more —O— such as a propanediyloxyethanediyloxyethanediyl group; and the like.

Of these, $R^F$ represents preferably a single bond, a methanediyl group, an alkanediyloxy group having 2 to 4 carbon atoms and a cycloalkanediyloxy group having 7 to 10 carbon atoms, more preferably a single bond, a methanediyl group, a 1,2-ethanediyloxy group, a 1,2-propanediyloxy group and a 2,6-norbornanediyloxy group, and still more preferably 1,2-ethanediyloxy group.

The monovalent organic group which may be represented by $R^G$ is exemplified by: a monovalent chain hydrocarbon group having 1 to 20 carbon atoms; a monovalent alicyclic hydrocarbon group having 3 to 20 carbon atoms; a monovalent aromatic hydrocarbon group having 6 to 20 carbon atoms; or a group obtained by combining a hetero atom-containing linking group such as —O—, —CO—, —COO—, —COO— and -D- with one, or two or more types of the monovalent chain hydrocarbon, and/or one, or two or more types of the monovalent alicyclic hydrocarbon group, and/or one, or two or more types of the monovalent aromatic hydrocarbon group; and the like. A part or all of hydrogen atoms included in these groups may be substituted with a fluorine atom, a hydroxy group, a carboxy group, an amino group, a cyano group, or the like.

$R^G$ represents preferably a hydrogen atom, a monovalent chain hydrocarbon group, a monovalent alicyclic hydrocarbon group, a monovalent fluorinated chain hydrocarbon group, a monovalent fluorinated alicyclic hydrocarbon group, a monovalent hydroxy chain hydrocarbon group, a group that includes a hydroxybis(perfluoroalkyl)methyl group, or a monovalent group that includes a lactone structure, more preferably a hydrogen atom, a methyl group, an ethyl group, an i-propyl group, a n-butyl group, a cyclohexylmethyl group, a hexafluoro-2-propyl group, a 2-hydroxyethyl group, a hydroxybis(perfluoroalkyl)butyl group, a hydroxybis(perfluoroalkyl)methylnorbornyl group, an α-butyrolactone-yl group, a norbornanelactone-yl group and a trifluoromethylnorbornanelactone-yl group, and still more preferably a methyl group and an ethyl group.

Examples of the structural unit (V-1b) include structural units represented by the following formulae (7-b-1) to (7-b-13) (hereinafter, may be also referred to as "structural units (V-1b-1) to (V-1b-13)"), and the like.

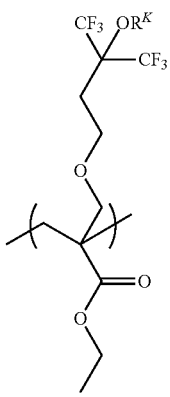

(7-b-1)

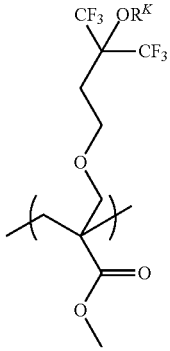

(7-b-2)

(7-b-3) 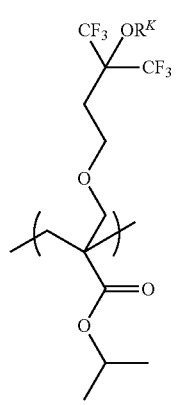
(7-b-4) 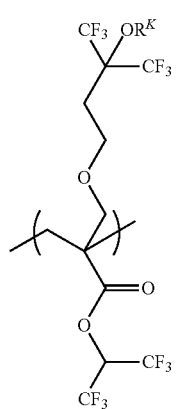
(7-b-5) 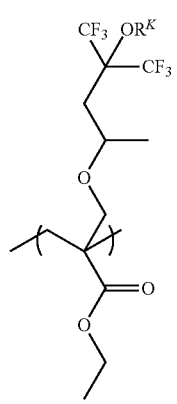
(7-b-6) 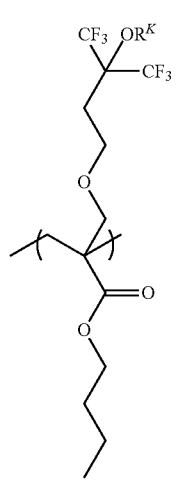
(7-b-7) 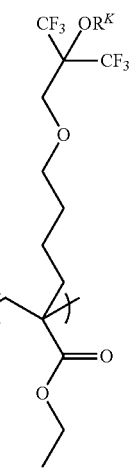
(7-b-8) 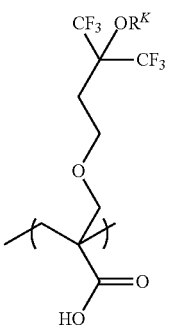
(7-b-9) 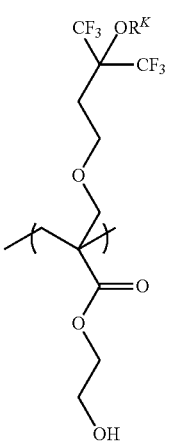

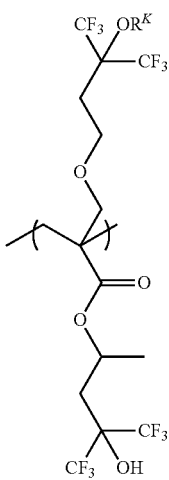

(7-b-10)

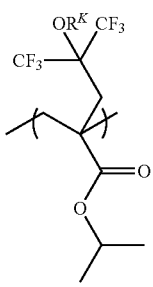

(7-b-11)

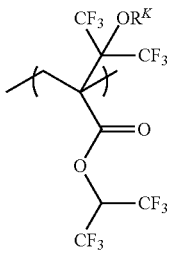

(7-b-12)

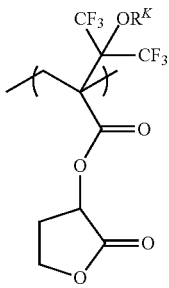

(7-b-13)

In the above formulae (7-b-1) to (7-b-13), $R^K$ is as defined in the above formula (7).

Of these, the structural units (V-1b-1) to (V-1b-9), the structural unit (V-1b-13) and the structural unit (V-1b-16) are preferred, and the structural unit (V-1b-1) and the structural unit (V-1b-2) are more preferred.

The lower limit of the proportion of the structural unit (V-1) in the polymer component (J) with respect to the total structural units constituting the polymer component (J) is preferably 10 mol %, more preferably 20 mol %, still more preferably 35 mol %, and particularly preferably 45 mol %. The upper limit of the proportion of the structural unit (V-1) in the polymer component (J) is preferably 90 mol %, more preferably 80 mol %, still more preferably 75 mol %, and particularly preferably 60 mol %.

In a case where the polymer component (J) is the polymer component (J1), the lower limit of the proportion of the structural unit (V-1) with respect to the total structural units constituting the polymer (b') is preferably 10 mol %, more preferably 20 mol %, still more preferably 30 mol %, and particularly preferably 40 mol %. The upper limit of the proportion of the structural unit (V-1) is preferably 100 mol %, more preferably 90 mol %, still more preferably 80 mol %, and particularly preferably 75 mol %.

In a case where the polymer component (J) is the polymer component (J2), the lower limit of the proportion of the structural unit (V-1) with respect to the total structural units constituting the polymer (c') is preferably 0.5 mol %, more preferably 1 mol %, still more preferably 1.5 mol %, and particularly preferably 2 mol %. The upper limit of the proportion of the structural unit (V-1) is preferably 50 mol %, more preferably 40 mol %, still more preferably 35 mol %, and particularly preferably 30 mol %.

When the proportion of the structural unit (V-1) falls within the above range, both the water repellency of the surface of the upper layer film and the defects-inhibiting property can be further enhanced.

(Structural Unit (V-2))

The structural unit (V-2) includes a fluorinated alkyl group. When the polymer component (J) has the structural unit (V-2), the water repellency of the upper layer film can be more enhanced.

Examples of the fluorinated alkyl group include a fluoromethyl group, a difluoromethyl group, a trifluoromethyl group, a fluoroethyl group, a difluoroethyl group, a trifluoroethyl group, a pentafluoroethyl group, a fluoro-n-propyl group, a difluoro-n-propyl group, a trifluoro-n-propyl group, a pentafluoro-n-propyl group, a heptafluoro-n-propyl group, a fluoro-i-propyl group, a trifluoro-i-propyl group, a hexafluoro-i-propyl group, a fluoro-n-butyl group, an octafluoro-n-butyl group, a nonafluoro-n-butyl group, an undecafluoro-n-pentyl group, a heptadecafluoro-n-decyl group, and the like.

In light of the copolymerizability of a monomer that gives the structural unit (V-2), the structural unit (V-2) is preferably a structural unit represented by the following formula (8) (hereinafter, may be also referred to as "structural unit (V-2a)").

(8)

In the above formula (8), $R^H$ represents a hydrogen atom, a methyl group, a fluorine atom or a trifluoromethyl group; and $R^I$ represents a monovalent fluorinated alkyl group.

In light of the copolymerizability of a monomer that gives the structural unit (IV-2a), etc., $R^H$ represents preferably the hydrogen atom or the methyl group, and more preferably the methyl group.

Examples of the monovalent fluorinated alkyl group represented by $R^I$ include groups exemplified as the fluorinated alkyl group described above, and the like.

Examples of the structural unit (V-2a) include structural units represented by the following formulae (8-1) to (8-6) (hereinafter, may be also referred to as "structural units (V-2a-1) to (V-2a-6)"), and the like.

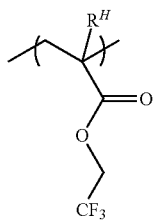
(8-1)

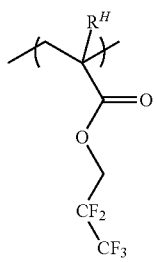
(8-2)

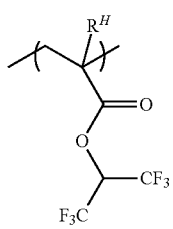
(8-3)

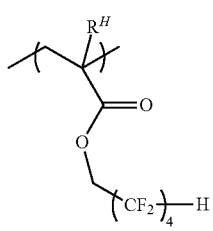
(8-4)

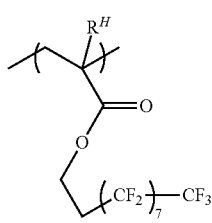
(8-5)

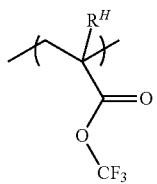
(8-6)

In the above formulae (8-1) to (8-6), $R^H$ is as defined in the above formula (8).

The lower limit of the proportion of the structural unit (V-2) in the polymer component (J) with respect to the total structural units constituting the polymer component (J) is preferably 10 mol %, more preferably 20 mol %, and still more preferably 30 mol %. The upper limit of the proportion of the structural unit (V-2) in the polymer component (J) is preferably 80 mol, more preferably 70 mol %, and still more preferably 60 mol %.

In a case where the polymer component (J) is the polymer component (J1), the lower limit of the proportion of the structural unit (V-2) with respect to the total structural units constituting the polymer (b') is preferably 10 mol %, more preferably 20 mol %, still more preferably 30 mol %, and particularly preferably 40 mol %. The upper limit of the proportion of the structural unit (V-2) is preferably 100 mol %, more preferably 90 mol %, still more preferably 80 mol %, and particularly preferably 75 mol %.

In a case where the polymer component (J) is the polymer component (J2), the lower limit of the proportion of the structural unit (V-2) with respect to the total structural units constituting the polymer (c') is preferably 0.5 mol %, more preferably 1 mol %, still more preferably 1.5 mol %, and particularly preferably 2 mol %. The upper limit of the proportion of the structural unit (V-2) is preferably 50 mol %, more preferably 40 mol %, still more preferably 35 mol %, and particularly preferably 30 mol %.

When the proportion of the structural unit (V-2) falls within the above range, the water repellency of the surface of the upper layer film can be further enhanced.

[Structural Unit (VI)]

The structural unit (VI) includes an acid diffusion-inhibiting group. When the polymer component (J) has the structural unit (VI), excess diffusion of the acid into light-unexposed regions can be inhibited by an action of the acid diffusion-inhibiting group, whereby the lithography characteristics can be improved.

Examples of the acid diffusion-inhibiting group include groups exhibiting basicity, such as an amino group, a hydrocarbon group-monosubstituted amino group, a hydrocarbon group-disubstituted amino group, a cyclic amino group and an amide group.

Examples of the hydrocarbon group-monosubstituted amino group include:

monoalkylamino groups such as a methylamino group, an ethylamino group and a propylamino group;

monocycloalkylamino groups such as a cyclopentylamino group and a cyclohexylamino group;

monoarylamino groups such as a phenylamino group and a naphthylamino group;

monoaralkylamino groups such as a benzylamino group and a phenethylamino group; and the like.

Examples of the hydrocarbon group-disubstituted amino group include: dialkylamino groups such as a dimethylamino group, a methylethylamino group, a diethylamino group and a dipropylamino group;

dicycloalkylamino groups such as a dicyclopentylamino group, a dicyclohexylamino group and a dinorbornylamino group;

diarylamino groups such as a diphenylamino group, a ditolylamino group, a dinaphthylamino group and a phenyltolylamino group;

diaralkylamino groups such as a dibenzylamino group, a diphenethylamino group and a di(naphthylmethyl)amino group; and the like.

Examples of the cyclic amino group include an azacyclopentyl group (pyrrolidinyl group), an azacyclohexyl group (piperidinyl group), an azacyclooctyl group, and the like.

Examples of the amide group include a dimethylamide group, a diethylamide group, and the like.

A group that includes an acid-labile group may be used as the acid diffusion-inhibiting group. Examples of the acid diffusion-inhibiting group that includes an acid-labile group include an N-(t-butoxycarbonyl)piperidinyl group, N-(t-butoxycarbonyl)imidazole group, an N-(t-amyloxycarbonyl)methylethylamino group, and the like.

Of these, as the acid diffusion-inhibiting group, the hydrocarbon group-disubstituted amino group is preferred, the dialkylamino group is more preferred, and dimethylamino group is still more preferred.

Examples of the structural unit (VI) include structural unit represented by the following formula (9) (hereinafter, may be also referred to as "structural unit (VI-a)"), and the like.

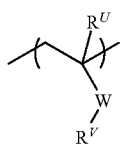
(9)

In the above formula (9), $R^U$ represents a hydrogen atom, a fluorine atom, a methyl group or a trifluoromethyl group; W represents —COO— or —NH—; and $R^V$ represents a group that includes an acid diffusion-inhibiting group.

In light of the copolymerizability of a monomer that gives the structural unit (VIII), $R^U$ represents preferably the hydrogen atom or the methyl group, and more preferably the methyl group.

The group that includes an acid diffusion-inhibiting group which is represented by $R^V$ is exemplified by a monovalent hydrocarbon group having the aforementioned acid diffusion-inhibiting group bound thereto, and the like. Of these, a hydrocarbon group-disubstituted aminohydrocarbon group and an N-t-alkoxycarbonyl-substituted cyclic amino group are preferred, a dialkylaminoalkyl group and an N-t-alkoxycarbonylazacycloalkyl group are more preferred, and a dimethylaminoethyl group and an N-t-butoxycarbonylazacyclohexyl group are still more preferred.

Examples of the acid diffusion-inhibiting group include a group represented by the following formula (1'), a group represented by the following formula (2'-1), a group represented by the following formula (2'-2), a group represented by the following formula (3'), and the like.

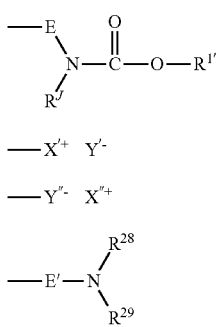

In the above formula (1'), E represents a single bond or a divalent organic group having 1 to 20 carbon atoms; $R^J$ represents a hydrogen atom or a monovalent organic group having 1 to 20 carbon atoms, wherein $R^J$ and E may taken together represent an aliphatic heterocyclic structure having 3 to 20 ring atoms together with the nitrogen atom to which $R^J$ and E bond; and $R^{1'}$ represents a monovalent hydrocarbon group having 1 to 20 carbon atoms.

The divalent organic group having 1 to 20 carbon atoms which may be represented by E is exemplified by: a divalent hydrocarbon group having 1 to 20 carbon atoms; a group ($\alpha$) obtained from the hydrocarbon group by incorporating a divalent hetero atom-containing group between two adjacent carbon atoms or at the end on the atomic bonding side of the hydrocarbon group; a group obtained from the hydrocarbon group or the group ($\alpha$) by substituting a part or all of hydrogen atoms included therein with a monovalent hetero atom-containing group; and the like.

The monovalent organic group having 1 to 20 carbon atoms which may be represented by $R^J$ is exemplified by: a monovalent hydrocarbon group having 1 to 20 carbon atoms; a group obtained from the hydrocarbon group by incorporating a hetero atom-containing group between two adjacent carbon atoms or at the end on the atomic bonding side of the hydrocarbon group; a group obtained from the monovalent hydrocarbon group or the group obtained from the hydrocarbon group by incorporating a hetero atom-containing group, by substituting a part or all of hydrogen atoms included therein with a substituent; and the like.

Examples of the aliphatic heterocyclic structure having 3 to 20 ring atoms which may be taken together represented by the groups $R^J$ and E together with the nitrogen atom to which $R^J$ and E bond include:

azacycloalkane structures such as an azacyclopropane structure, an azacyclobutane structure, an azacyclopentane structure, an azacyclohexane structure, an azacyclooctane structure, an azacyclodecane structure, an azanorbornane structure and an azaadamantane structure;

azaoxacycloalkane structures such as an azaoxacyclopentane structure, an azaoxacyclohexane structure, an azaoxacyclooctane structure and an azaoxanorbornane structure;

diazacycloalkane structures such as a diazacyclopentane structure, a diazacyclohexane structure, a diazacyclooctane structure, a diazacyclodecane structure and a diazanorbornane structure; and the like.

The monovalent hydrocarbon group having 1 to 20 carbon atoms which is represented by $R^{1'}$ is exemplified by: a linear or branched chain hydrocarbon group having 1 to 20 carbon atoms; an alicyclic hydrocarbon group having 3 to 20 carbon atoms; an aromatic hydrocarbon group having 6 to 20 carbon atoms; and the like.

Examples of the chain hydrocarbon group include: alkyl groups such as a methyl group, an ethyl group, a propyl group, a butyl group and a pentyl group; alkenyl groups such as an ethenyl group, a propenyl group, a butenyl group and a pentenyl group; alkynyl groups such as an ethynyl group, a propynyl group, a butynyl group and a pentynyl group; and the like.

Examples of the alicyclic hydrocarbon group include: saturated monocyclic alicyclic hydrocarbon groups such as a cyclopropyl group, a cyclobutyl group, a cyclopentyl group and a cyclohexyl group; saturated polycyclic alicyclic hydrocarbon groups such as a norbornyl group, an adamantyl group, a tricyclodecyl group and a tetracyclododecyl group; unsaturated monocyclic alicyclic hydrocarbon groups such as a cyclopropenyl group, a cyclobutenyl group, a cyclopentenyl group and a cyclohexenyl group; unsaturated polycyclic alicyclic hydrocarbon groups such as a norbornenyl group and a tricyclodecenyl group; and the like.

Examples of the aromatic hydrocarbon group include: aryl groups such as a phenyl group, a tolyl group, a xylyl group, a naphthyl group and an anthryl group; aralkyl groups such as a benzyl group, a phenethyl group, a naphthylmethyl group and an anthrylmethyl group; and the like.

In the above formula (2'-1), $X'^+$ represents a monovalent group that includes a monovalent onium cation; and $Y'^-$ represents a monovalent weak acid anion.

The monovalent onium cation included in the monovalent group represented by $X'^+$ is exemplified by a sulfonium cation, an iodonium cation, an ammonium cation, an oxonium cation, and the like.

The monovalent weak acid anion represented by $Y'^-$ is exemplified by a monovalent carboxylate anion or a monovalent sulfonamide anion.

Examples of the monovalent carboxylate anion which may be represented by $Y'^-$ include a salicylate anion, and the like. Examples of the monovalent sulfonamide anion which may be represented by Y– include a trifluoromethylsulfonamide ion, and the like.

The monovalent weak acid anion represented by $Y'^-$ is preferably an acid weaker than an acid generated from the acid generator (C).

In the above formula (2'-2), $Y''^-$ represents a monovalent group that includes a monovalent weak acid anion; and $X''^+$ represents a monovalent onium cation.

The monovalent weak acid anion included in the monovalent group represented by $Y''^-$ is exemplified by the anions exemplified in connection with $Y'^-$, and the like.

The monovalent weak acid anion included in the monovalent group represented by $Y''^-$ is preferably an acid weaker than an acid generated from the acid generator (C).

The monovalent onium cation represented by $X''^+$ is exemplified by the cations exemplified as the monovalent onium cation included in the monovalent group represented by $X'^+$, and the like.

In the above formula (3'), E' represents a single bond or a divalent organic group having 1 to 20 carbon atoms; and $R^{28}$ and $R^{29}$ each independently represent a hydrogen atom or a monovalent organic group having 1 to 20 carbon atoms, wherein any two of $R^{28}$, $R^{29}$ and E' may taken together represent an aliphatic heterocyclic structure having 3 to 20 ring atoms together with the nitrogen atom to which the any two of $R^{28}$, $R^{29}$ and E' bond.

Examples of the divalent organic group having 1 to 20 carbon atoms which may be represented by E' include groups similar to those exemplified in connection with the group represented by E, and the like.

Examples of the monovalent organic group having 1 to 20 carbon atoms which may be represented by $R^{28}$ or $R^{29}$ include groups similar to those exemplified in connection with the group represented by $R^J$, and the like.

Examples of the aliphatic heterocyclic structure having 3 to 20 ring atoms which may be taken together represented by the any two of $R^{28}$, $R^{29}$ and E' together with the nitrogen atom to which the any two of $R^{28}$, $R^{29}$ and E' bond include groups similar to those exemplified in connection with $R^J$ and E, and the like.

Examples of the structural unit (VI) include structural units represented by the following formulae (9-1) to (9-9) (hereinafter, may be also referred to as "structural units (VI-a-1) to (VI-a-9)"), and the like.

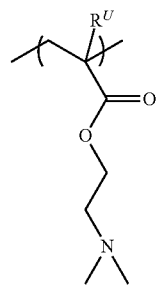

(9-1)

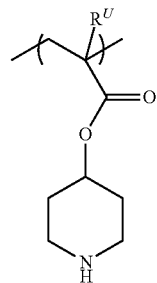

(9-2)

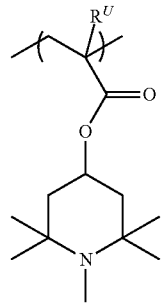

(9-3)

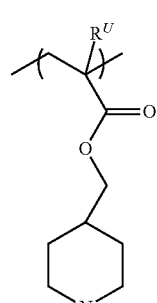

(9-4)

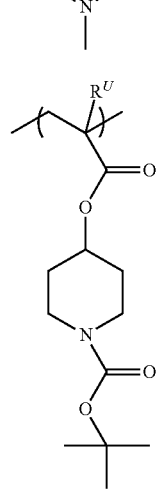

(9-5)

-continued (9-6)
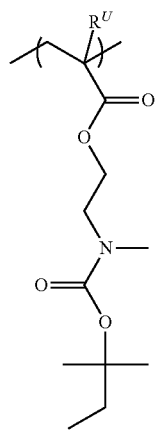

(9-7)
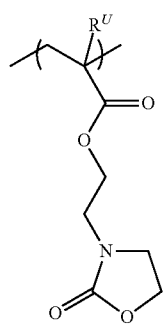

(9-8)
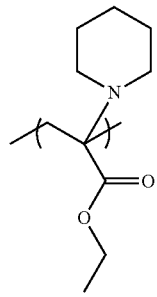

(9-9)
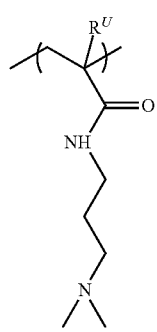

In the above formulae (9-1) to (9-9), $R^U$ is as defined in the above formula (9).

Among the structural units (VI-a-1) to (VI-a-9)), the structural units (VI-a-1) to (VI-a-5), the structural unit (VI-a-8) and the structural unit (VI-a-9) are preferred, the structural unit (VI-a-1) to the structural unit (VI-a-5) and the structural unit (VI-a-9) are more preferred, and the structural units (VI-a-1) and (VI-a-9) are still more preferred.

In addition, examples of the monomer that gives the structural unit (VI) include compounds represented by the following formulae, and the like.

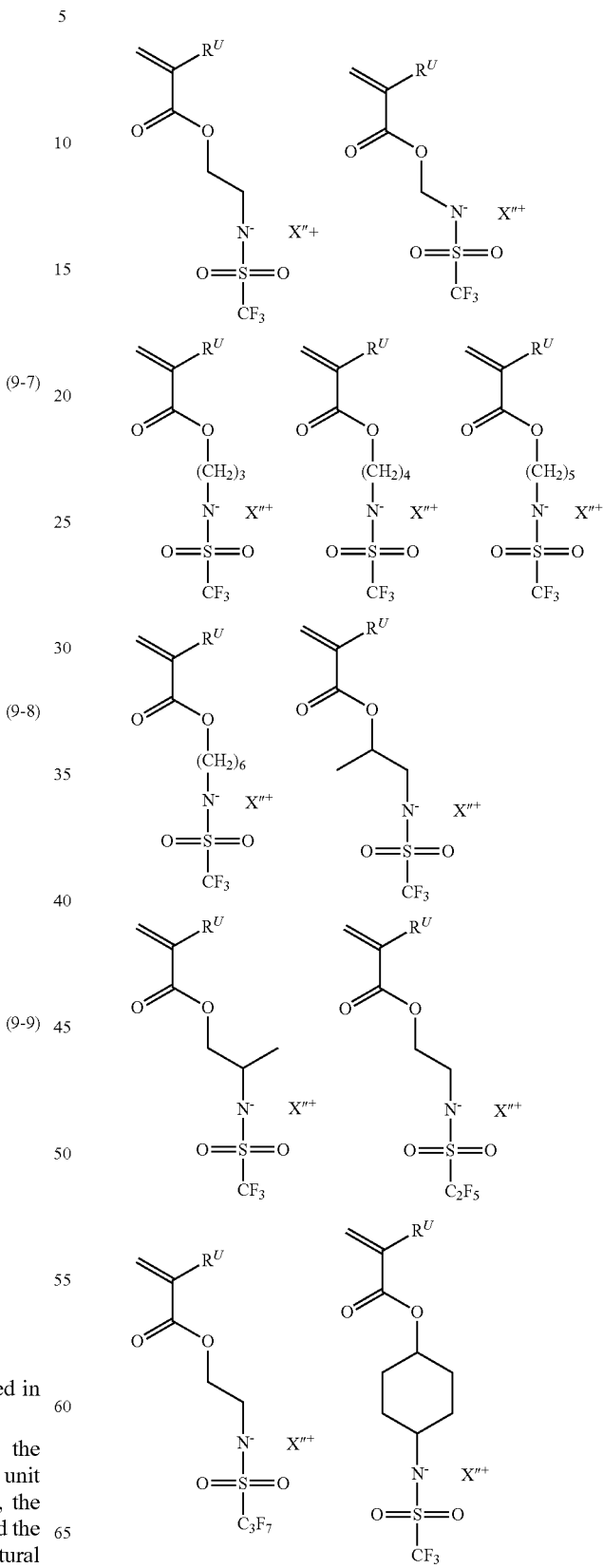

-continued
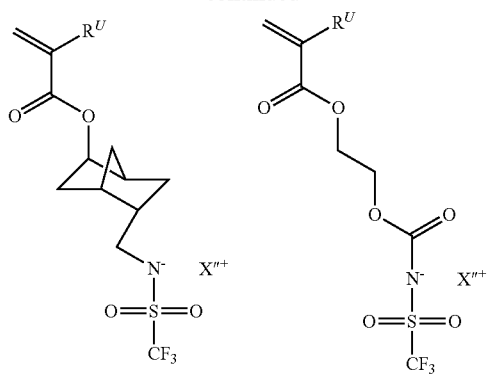
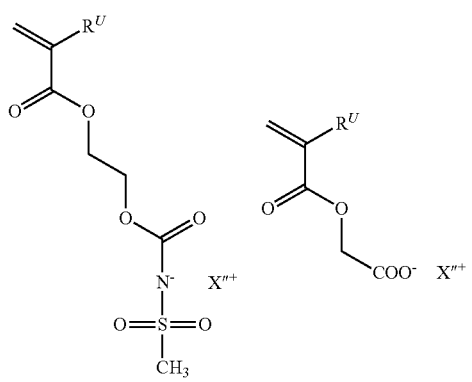
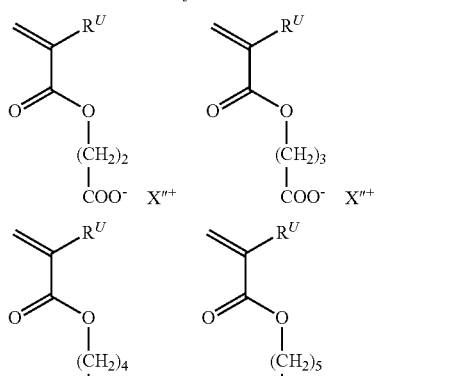
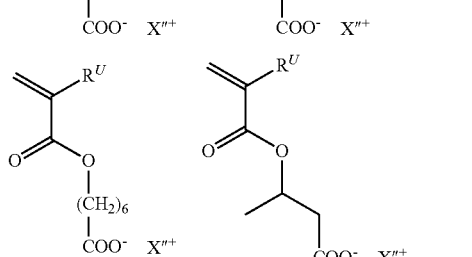
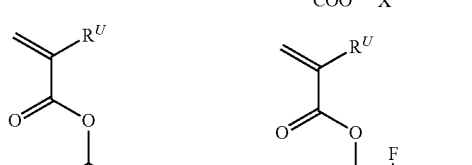
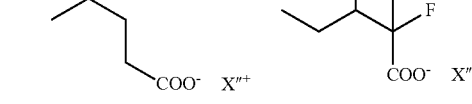
-continued
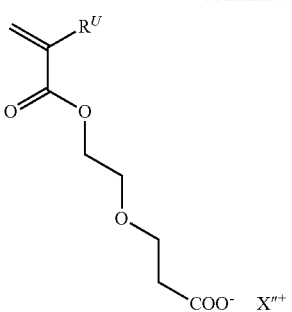
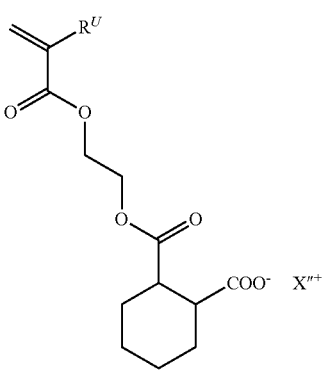
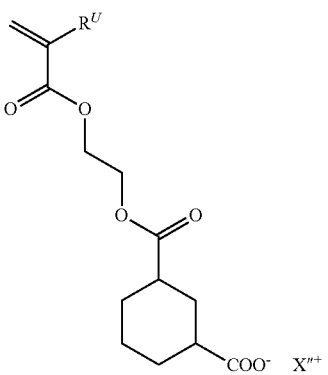
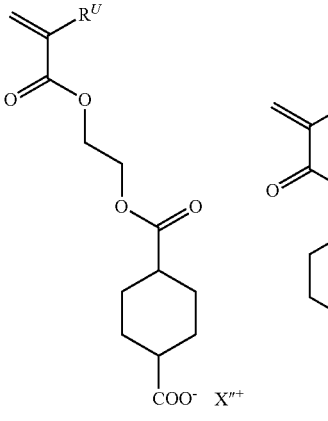

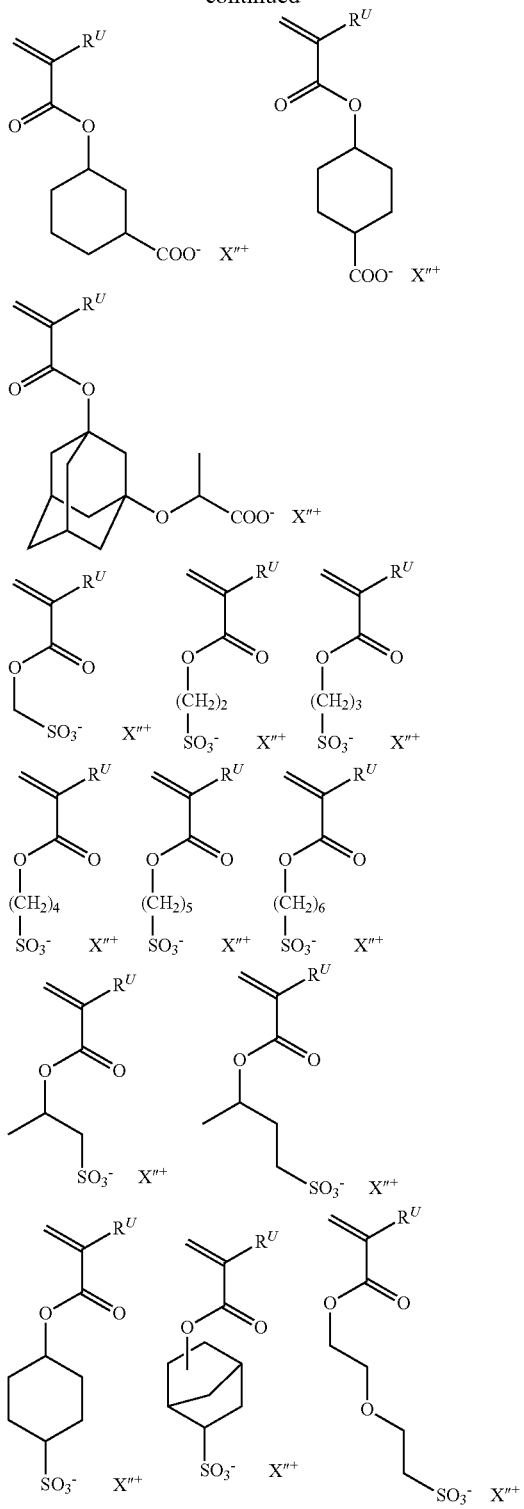

In the above formulae, $R^U$ and $X''^+$ is as defined in the above formula (9).

In a case where the polymer component (J) has the structural unit (VI), the upper limit of the proportion of the structural unit (VI) is preferably 30 mol %, more preferably 25 mol %, still more preferably 20 mol %, and particularly preferably 15 mol %.

When the proportion of the structural unit (VI) falls within the above range, the solubility of the polymer component (J) in the developer solution can be adjusted more properly, and additionally excess diffusion of an acid into light-unexposed regions can be inhibited, whereby the lithography characteristics can be further improved.

[Other Structural Unit]

The other structural unit is exemplified by: a structural unit (VII) that includes a carboxy group, a sulfo group or a combination thereof; a structural unit (VIII) that includes a group represented by the following formula (8); a structural unit (IX) that includes a lactone structure, a cyclic carbonate structure, a sultone structure or a combination thereof; and the like.

(Structural Unit (VII))

The structural unit (VII) includes a carboxy group, a sulfo group or a combination thereof.

Examples of the structural unit that includes a carboxy group (hereinafter, may be also referred to as "structural unit (VII-1)") include structural units represented by the following formulae (10-1) to (10-3) (hereinafter, may be also referred to as "structural units (VII-1-1) to (VII-1-3)", and the like.

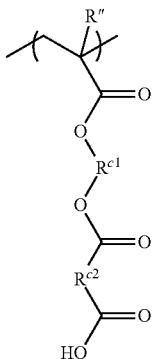

(10-1)

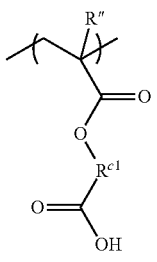

(10-2)

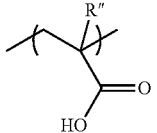

(10-3)

In the above formulae (10-1) to (10-3), R" represents a hydrogen atom, a fluorine atom, a methyl group or a trifluoromethyl group.

In the above formulae (10-1) and (10-2), $r^{c1}$ and $r^{c2}$ each independently represent a linear or branched divalent hydrocarbon group having 1 to 6 carbon atoms, a divalent alicyclic hydrocarbon group having 4 to 12 carbon atoms or a divalent aromatic hydrocarbon group having 6 to 12 carbon atoms.

Examples of the linear or branched divalent hydrocarbon group having 1 to 6 carbon atoms, the divalent alicyclic hydrocarbon group having 4 to 12 carbon atoms, and the divalent aromatic hydrocarbon group having 6 to 12 carbon atoms, which each may be represented by $R^{c1}$ or $R^{c2}$, include those exemplified in connection with $L^2$ in formula (11) described later.

Examples of the structural unit (VII-1-1) include structural units represented by the following formulae (10-1-1) and (10-1-2), examples of the structural unit (VII-1-2) include a structural unit represented by the following formula (10-1-3), and examples of the structural unit (VII-1-3) include structural unit represented by the following formulae (10-2-1) and (10-2-2).

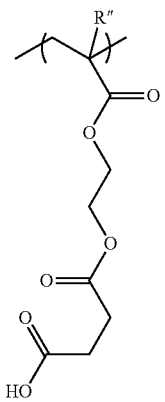

(10-1-1)

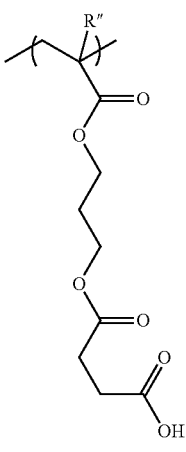

(10-1-2)

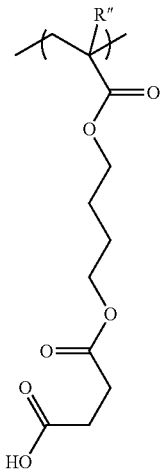

(10-1-3)

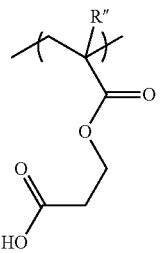

(10-2-1)

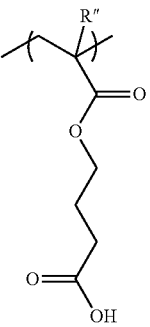

(10-2-2)

In the above formulae (10-1-1) to (10-2-2), R″ is as defined in the above formulae (10-1) to (10-3).

Examples of the structural unit that includes a sulfo group (hereinafter, may be also referred to as "structural unit (VII-2)") include a structural unit represented by the following formula (11), and the like.

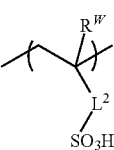

(11)

In the above formula (11), $R^W$ represents a hydrogen atom, a methyl group, a fluorine atom or a trifluoromethyl group; and $L^2$ represents a single bond, an oxygen atom, a sulfur atom, a divalent linear or branched hydrocarbon group having 1 to 6 carbon atoms, a divalent alicyclic hydrocarbon group having 4 to 12 carbon atoms, a divalent aromatic hydrocarbon group having 6 to 12 carbon atoms, or —C(=O)—X—$R^a$— group, wherein X represents an oxygen atom, a sulfur atom or an NH group, and $R^a$ represents a single bond, a divalent linear or branched hydrocarbon group having 1 to 6 carbon atoms, a divalent alicyclic hydrocarbon group having 4 to 12 carbon atoms, or a divalent aromatic hydrocarbon group having 6 to 12 carbon atoms.

As the divalent linear or branched hydrocarbon group having 1 to 6 carbon atoms which may be represented by $L^2$ or $R^a$, saturated hydrocarbon groups are preferred, and examples thereof include a methylene group, an ethylene group, a 1,3-propylene group, a 1,2-propylene group, a 1,1-propylene group, a 2,2-propylene group, a tetramethylene group, a pentamethylene group, a hexamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, and the like.

The divalent alicyclic hydrocarbon group having 4 to 12 carbon atoms which may be represented by $L^2$ or $R^a$ may be either monocyclic or polycyclic, and, in the case of being polycyclic, may a bridged structure. Examples of the monocyclic hydrocarbon group include: cyclobutylene groups such as a 1,3-cyclobutylene group; cyclopentylene groups such as a 1,3-cyclopentylene group; cyclohexylene groups such as a 1,4-cyclohexylene group; cyclooctylene groups such as a 1,5-cyclooctylene group; and the like. The polycyclic hydrocarbon group is exemplified by a hydrocarbon group having a 2 to 4-membered ring, and examples thereof include norbornylene groups such as a 1,4-norbornylene group and a 2,5-norbornylene group, adamantylene groups such as a 1,5-adamantylene group and a 2,6-adamantylene group; and the like.

Examples of the divalent aromatic hydrocarbon group having 6 to 12 carbon atoms which may be represented by $L^2$ or $R^a$ include arylene groups such as a phenylene group and a tolylene group; and the like. It is to be noted that the alicyclic hydrocarbon group and the aromatic hydrocarbon group may not necessarily be constructed of a ring structure alone, and a part thereof may have a chain structure.

$L^2$ represents preferably a single bond, a divalent linear or branched hydrocarbon group having 1 to 6 carbon atoms, a divalent aromatic hydrocarbon having 6 to 12 carbon atoms, or —C(=O)—NH—$R^a$ in which $R^a$ represents a divalent linear or branched hydrocarbon group having 1 to 6 carbon atoms, and more preferably a single bond, a methylene group, a phenylene group, or —C(=O)—NH—C(CH$_3$)$_2$—CH$_2$—.

Examples of the structural unit (VII-2) include structural units represented by the following formulae (11-1) to (11-4), and the like.

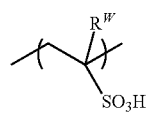

(11-1)

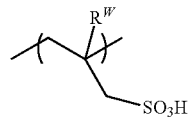

(11-2)

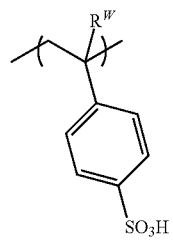

(11-3)

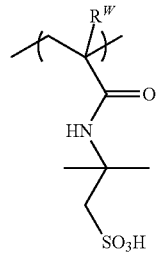

(11-4)

In the above formulae (11-1) to (11-4), $R^W$ is as defined in the above formula (11).

In light of the possibility that the solubility of the polymer component (J) in the developer solution can be adjusted more properly, the structural unit (VII-1) is preferred as the structural unit (VII).

In a case where the polymer component (J) has the structural unit (VII), the upper limit of the proportion of the structural unit (VII) with respect to the total structural units constituting the polymer component (J) is preferably 70 mol %, more preferably 65 mol %, still more preferably 60 mol %, and particularly preferably 55 mol %.

(Structural Unit (VIII))

The structural unit (VIII) includes a group represented by the following formula (12) (hereinafter, may be also referred to as "group (12)"). When the polymer component (J) has the structural unit (VIII), the composition for upper layer film formation (Y1) can form a resist pattern with fewer development defects.

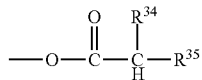

(12)

In the above formula (12), $R^{34}$ represents a hydrogen atom, a halogen atom, a nitro group, an alkyl group, a monovalent alicyclic hydrocarbon group, an alkoxy group, an acyl group, an aralkyl group or an aryl group, wherein a part or all of hydrogen atoms included in the alkyl group, the alicyclic hydrocarbon group, the alkoxy group, the acyl group, the aralkyl group or the aryl group may be substituted; and $R^{35}$ represents —C(=O)—$R^{36}$, —S(=O)$_2$—$R^{37}$, —$R^{38}$—CN or —$R^{39}$—NO$_2$, wherein $R^{36}$ and $R^{37}$ each independently represent a hydrogen atom, an alkyl group, a fluorinated alkyl group, a monovalent alicyclic hydrocarbon group, an alkoxy group, a cyano group, a cyanomethyl group, an aralkyl group or an aryl group, wherein $R^{36}$ or $R^{37}$ and $R^{34}$ may taken together represent a ring structure through bonding to each other, and wherein $R^{38}$ and $R^{39}$ each independently represent a single bond, a methylene group or an alkylene group having 2 to 5 carbon atoms.

Examples of the halogen atom which may be represented by $R^{34}$ include a fluorine atom, a chlorine atom, a bromine atom, iodine atom, and the like. Of these, the fluorine atom and the chlorine atom are preferred.

Examples of the alkyl group which may be represented by $R^{34}$ include: linear alkyl groups such as a methyl group, an ethyl group, a n-propyl group and a n-butyl group; branched alkyl groups such as an i-propyl group, an i-butyl group, a sec-butyl group and a t-butyl group; and the like. The alkyl group is preferably an alkyl group having 1 to 20 carbon atoms.

Examples of the monovalent alicyclic hydrocarbon group which may be represented by $R^{34}$ include: monocyclic alicyclic hydrocarbon groups such as a cyclopentyl group and a cyclohexyl group; polycyclic alicyclic hydrocarbon groups such as an adamantyl group, a norbornyl group and a tetracyclodecanyl group; and the like. The alicyclic hydrocarbon group is preferably an alicyclic hydrocarbon group having 3 to 20 carbon atoms.

Examples of the alkoxy group which may be represented by $R^{34}$ include a methoxy group, an ethoxy group, and the like. The alkoxy group is preferably an alkoxy group having 1 to 20 carbon atoms.

Examples of the acyl group which may be represented by $R^{34}$ include an acetyl group, a propionyl group, and the like. The acyl group is preferably an acyl group having 2 to 20 carbon atoms.

Examples of the aralkyl group which may be represented by $R^{34}$ include a benzyl group, a phenethyl group, a naphthylmethyl group, and the like. The aralkyl group is preferably an aralkyl group having 7 to 12 carbon atoms.

Examples of the aryl group which may be represented by $R^{34}$ include a phenyl group, a tolyl group, a dimethylphenyl group, a 2,4,6-trimethylphenyl group, a naphthyl group, and the like. The aryl group is preferably an aryl group having 6 to 10 carbon atoms.

Examples of the substituent which may be included in the alkyl group, the monovalent alicyclic hydrocarbon group, the alkoxy group, the acyl group, the aralkyl group or the aryl group, which may be represented by $R^{34}$, include halogen atoms such as a fluorine atom and a chlorine atom, a hydroxyl group, a nitro group, a cyano group, and the like.

Of these, in light of a balance of the solubility in a developer solution and the peel resistance of the upper layer film formed from the composition for upper layer film formation (Y1), $R^{34}$ represents preferably a hydrogen atom, an alkyl group having 1 to 5 carbon atoms, an alkoxy group having 1 to 5 carbon atoms or an acyl group having 2 to 5 carbon atoms, and more preferably a hydrogen atom, a methyl group, an ethyl group or an acetyl group.

In a case where $R^{35}$ represents —C(=O)—$R^{36}$ or —S(=O)$_2$—$R^{37}$, examples of the alkyl group, the monovalent alicyclic hydrocarbon group, the alkoxy group, the aralkyl group and the aryl group, which may be represented by $R^6$ or $R^7$, include alkyl groups, monovalent alicyclic hydrocarbon groups, alkoxy groups, aralkyl groups and aryl groups, respectively, similar to those exemplified in connection with $R^{34}$, and the like. Moreover, examples of the fluorinated alkyl group which may be represented by $R^{36}$ or $R^{37}$ include groups obtained from the group exemplified as the alkyl group which may be represented by $R^{34}$ by substituting at least one of hydrogen atoms included therein with a fluorine atom, and the like. Of these, $R^{36}$ and $R^{37}$ each independently represent preferably the hydrogen atom or the alkyl group, and more preferably the hydrogen atom, the methyl group or the ethyl group.

The group that includes a ring structure which may be taken together represented by $R^{36}$ or $R^{37}$ and $R^{34}$ through bonding to each other is preferably a divalent alicyclic hydrocarbon group having 5 to 12 carbon atoms which includes an oxo group, and the carbon atom to which $R^{336}$ or $R^{37}$ bonds and the carbon atom to which $R^{34}$ bonds.

In a case where $R^{35}$ represents —$R^{38}$—CN or —$R^{39}$—NO$_2$, $R^{38}$ and $R^{39}$ preferably represent a single bond, a methanediyl group or an ethanediyl group.

As the group (12), groups represented by the following formulae (12-1) to (12-8) (hereinafter, may be also referred to as "groups (12-1) to (12-8)") are preferred.

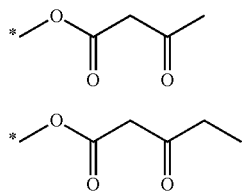

(12-1)

(12-2)

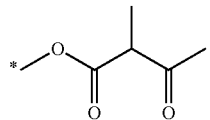

(12-3)

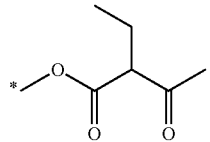

(12-4)

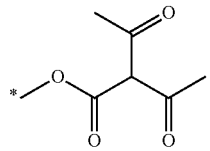

(12-5)

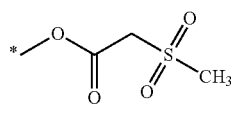

(12-6)

(12-7)

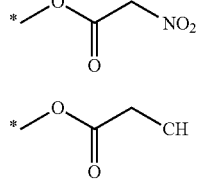

(12-8)

In the above formulae (12-1) to (12-8), * denotes a binding site.

The structural unit (VIII) is exemplified by a structural unit derived from a (meth)acrylic acid ester derivative that includes the group (12), a structural unit derived from a (meth)acrylamide derivative that includes the group (12), a structural unit derived from a vinyl ether derivative that includes the group (12), a structural unit derived from an olefin derivative that includes the group (12), a structural unit derived from a styrene derivative that includes the group (12), and the like. Of these, in light of the copolymerizability of a monomer that gives the structural unit (VII), the structural unit derived from the (meth)acrylic acid ester derivative that includes the group (12) is preferred. More specifically, a structural unit represented by the following formula (12-a) (hereinafter, may be also referred to as "structural unit (VIII-a)") is preferred as the structural unit (VIII).

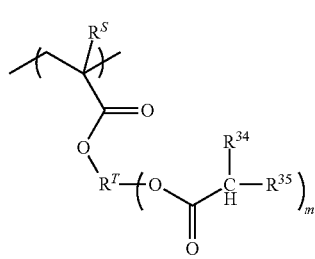

(12-a)

In the above formula (12-a), $R^S$ represents a hydrogen atom, a methyl group, a fluorine atom or a trifluoromethyl group; $R^T$ represents a linking group having a valency of (m+1); $R^{14}$ and $R^{15}$ are as defined in the above formula (12); and in is an integer of 1 to 3, wherein in a case where $R^{34}$ and $R^{35}$ are each present in a plurality of number, a plurality of $R^{34}$s may be identical or different and a plurality of $R^{35}$s may be identical or different.

In light of the copolymerizability of a monomer that gives the structural unit (12-a), etc., $R^S$ represents preferably the hydrogen atom or the methyl group, and more preferably the methyl group.

In regard to the linking group having a valency of (m+1) which is represented by $R^T$, the divalent linking group (i.e., in the case of n being 1) is exemplified by an alkanediyl group, a divalent alicyclic hydrocarbon group, an alkenediyl group, an arenediyl group, and the like. It is to be noted that a part or all of hydrogen atoms included in these groups may be substituted with a halogen atom such as a fluorine atom or a chlorine atom, a cyano group, or the like.

Examples of the alkanediyl group include a methanediyl group, an ethanediyl group, a propanediyl group, a butanediyl group, a hexanediyl group, an octanediyl group, and the like. The alkanediyl group is preferably an alkanediyl group having 1 to 8 carbon atoms.

Examples of the divalent alicyclic hydrocarbon group include: monocyclic alicyclic hydrocarbon groups such as a cyclopentanediyl group and a cyclohexanediyl group; polycyclic alicyclic hydrocarbons such as a norbornanediyl group and an adamantanediyl group; and the like. The divalent alicyclic hydrocarbon group is preferably an alicyclic hydrocarbon group having 5 to 12 carbon atoms.

Examples of the alkenediyl group include an ethenediyl group, a propenediyl group, a butenediyl group, and the like. The alkenediyl group is preferably an alkenediyl group having 2 to 6 carbon atoms.

Examples of the arenediyl group include a phenylene group, a tolylene group, a naphthylene group, and the like. The arenediyl group is preferably an arenediyl group having 6 to 15 carbon atoms.

Of these, $R^T$ represents preferably the alkanediyl group or the divalent alicyclic hydrocarbon group, and more preferably an alkanediyl group having 1 to 4 carbon atoms or a divalent alicyclic hydrocarbon group having 6 to 11 carbon atoms. $R^T$ preferably represents the divalent alicyclic hydrocarbon group in that the water repellency of the resulting upper layer film can be enhanced.

As the structural unit (VIII-a), structural units represented by the following formulae (12-a-1) to (12-a-8) (hereinafter, may be also referred to as "structural units (VIII-a-1) to (VIII-a-8)") are preferred.

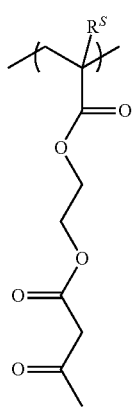

(12-a-1)

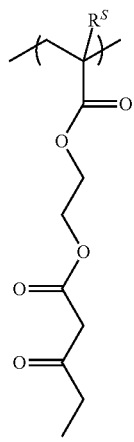

(12-a-2)

(12-a-3)

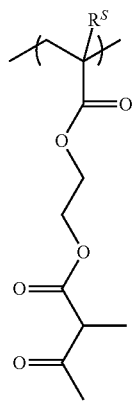

(12-a-4)

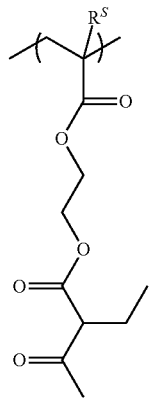

(12-a-5)

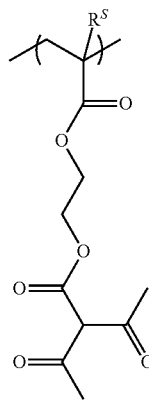

-continued

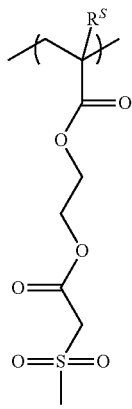

(12-a-6)

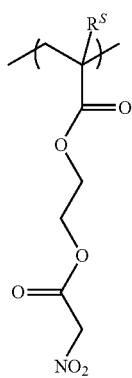

(12-a-7)

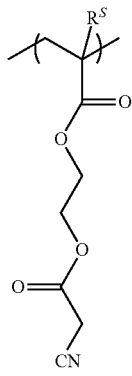

(12-a-8)

In the above formulae (12-a-1) to (12-a-10), $R^S$ is as defined in the above formula (12-a).

In a case where the polymer component (J) has the structural unit (VIII), the upper limit of the proportion of the structural unit (VIII) with respect to the total structural units constituting the polymer component (J) is preferably 70 mol %, more preferably 65 mol %, still more preferably 60 mol %, and particularly preferably 55 mol %.

When the proportion of the structural unit (VIII) falls within the above range, the solubility of the polymer component (J) in the developer solution can be adjusted more properly, and additionally a resist pattern with further fewer development defects can be formed.

(Structural Unit (IX))

The structural unit (IX) includes a lactone structure, a cyclic carbonate structure, a sultone structure or a combination thereof.

The structural unit (IX) is exemplified by the structural unit (III) of the polymer (B) contained in the radiation-sensitive resin composition (X1) described above, and the like.

The structural unit (IX) is preferably a structural unit that include a lactone structure, more preferably a structural unit that include a butyrolactone structure, and still more preferably a structural unit derived from butyrolactone-yl (meth) acrylate.

In a case where the polymer component (J) has the structural unit (IX), the upper limit of the proportion of the structural unit (IX) with respect to the total structural units constituting the polymer component (J) is preferably 70 mol %, more preferably 65 mol %, still more preferably 60 mol %, and particularly preferably 55 mol %.

The polymer component (J) may have other structural unit than the structural units (IV) to (IX). The other structural unit is exemplified by: a structural unit that includes a nonlabile chain hydrocarbon group or an aromatic hydrocarbon group; a structural unit that includes a hydroxy group; and the like. Examples of the nonlabile chain hydrocarbon group include a methyl group, an ethyl group, a propyl group, a butyl group, a pentyl group, and the like. Examples of the aromatic hydrocarbon group include a phenyl group, a naphthyl group, a benzyl group, a naphthylmethyl group, and the like. The upper limit of the proportion of the other structural unit with respect to the total structural units constituting the polymer component (J) is preferably 60 mol %, and more preferably 55 mol %.

The upper limit of the mass ratio of the polymer (b') to the polymer (a') in the polymer component (J1) is preferably 50/50, more preferably 45/55, still more preferably 40/60, particularly preferably 35/65, and most preferably 30/70. When the mass ratio of the polymer (b') to the polymer (a') falls within the above range, according to the composition for upper layer film formation (Y1) that contains the polymer component (J1), both the water repellency of the surface of the upper layer film and the development defects-inhibiting property can be further enhanced.

[Other Polymer]

The composition for upper layer film formation (Y1) may contain as the polymer component (J1), other polymer than the polymer (a') and the polymer (b'). The composition for upper layer film formation (Y1) may contain as the polymer component (J2), other polymer than the polymer (c'). The other polymer is exemplified by a polymer that has neither the structural unit (IV) nor the structural unit (V), and the like, and is also exemplified by a polymer constituted with at least one of: the structural units (VI) to (IX); and other structural unit, and the like.

In a case where the polymer component (J) includes a fluorine atom, the lower limit of the percentage content of the fluorine atom of the polymer component (J) is preferably 2% by mass, more preferably 5% by mass, still more preferably 7% by mass, and particularly preferably 8% by mass. The upper limit of the percentage content of the fluorine atom is preferably 30% by mass, more preferably 25% by mass, still more preferably 20% by mass, particularly preferably 15% by mass, and further particularly preferably 10% by mass. When the percentage content of the fluorine atom of the polymer component (J) falls within the above range, both the water repellency of the surface of the upper layer film and the development defects-inhibiting property can be further enhanced. The percentage content of the fluorine atom (% by mass) in the polymer component can be calculated based on the structure and the proportion of each polymer constituting the polymer component, which are determined by $^1$H-NMR, $^{13}$C-NMR, $^{19}$F-NMR, etc.

<Synthesis Method of Polymer Component (J)>

The polymer (a'), the polymer (b'), the polymer (c') and other polymer that each constitute the polymer component (J) can be synthesized by, for example, performing polymerization, such as radical polymerization, of predetermined monomer(s) in a solvent for polymerization in the presence of an appropriately selected polymerization initiator and/or chain transfer agent.

Examples of the solvent for polymerization include:

alcohols such as methanol, ethanol, 1-propanol, 2-propanol, 1-butanol, 2-butanol, ethylene glycol, diethylene glycol and propylene glycol;

cyclic ethers such as tetrahydrofuran and dioxane;

polyhydric alcohol alkyl ethers such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether and propylene glycol monoethyl ether;

polyhydric alcohol alkyl ether acetates such as ethylene glycol ethyl ether acetate, diethylene glycol ethyl ether acetate, propylene glycol ethyl ether acetate and propylene glycol monomethyl ether acetate;

aromatic hydrocarbons such as toluene and xylene;

ketones such as acetone, 2-butanone, methyl isobutyl ketone, cyclohexanone, 4-hydroxy-4-methyl-2-pentanone and diacetone alcohol;

esters such as ethyl acetate, butyl acetate, methyl 2-hydroxypropionate, ethyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate and methyl 3-ethoxypropionate; and the like. Of these, the cyclic ethers, the polyhydric alcohol alkyl ethers, the polyhydric alcohol alkyl ether acetates, the ketones or the esters are preferred. It is to be noted that one type, or two or more types of the solvent for polymerization may be used.

The lower limit of the Mw of the polymer component (J) is preferably 2,000, more preferably 3,000, still more preferably 4,000, and particularly preferably 5,000. The upper limit of the Mw is preferably 50,000, more preferably 30,000, still more preferably 20,000, and particularly preferably 10,000.

In a case where the polymer component (J) is the polymer component (J1), the lower limit of the polystyrene equivalent weight average molecular weight (Mw) as determined by gel permeation chromatography (GPC) of the polymer (a') is preferably 2,000, more preferably 3,000, still more preferably 4,000, and particularly preferably 5,000. The upper limit of the Mw is preferably 50,000, more preferably 30,000, still more preferably 20,000, and particularly preferably 10,000. In addition, the lower limit of the Mw of the polymer (b') is preferably 2,000, more preferably 3,000, still more preferably 4,000, and particularly preferably 5,000. The upper limit of the Mw is preferably 50,000, more preferably 30,000, still more preferably 20,000, and particularly preferably 10,000.

In a case where the polymer component (J) is the polymer component (J2), the lower limit of the Mw of the polymer (c') is preferably 2,000, more preferably 3,000, still more preferably 4,000, and particularly preferably 5,000. The upper limit of the Mw is preferably 50,000, more preferably 30,000, still more preferably 20,000, and particularly preferably 10,000.

When the Mw of the polymer component (J) falls within the above range, the solubility of the polymer in a developer solution can be adjusted properly, and consequently generation of development defects in the resist pattern can be further inhibited.

The upper limit of the Mw/Mn ratio of the polymer component (J) is preferably 5, more preferably 3, still more preferably 2.5, and particularly preferably 2. The lower limit of the ratio is typically 1, preferably 1.1.

In a case where the polymer component (J) is the polymer component (J1), the upper limit of the ratio (Mw/Mn) of the Mw to the polystyrene equivalent number average molecular weight (Mw) as determined by GPC of the polymer (a') is preferably 5, more preferably 3.5, still more preferably 3.0, and particularly preferably 2.5. The lower limit of the ratio is typically 1, and preferably 1.1. In addition, the upper limit of the Mw/Mn ratio of the polymer (b') is preferably 5, more preferably 3, still more preferably 2.5, and particularly preferably 2. The lower limit of the ratio is typically 1, and preferably 1.1.

In a case where the polymer component (J) is the polymer component (J2), the upper limit of the Mw/Mn ratio of the polymer (c') is preferably 5, more preferably 3.5, still more preferably 3.0, and particularly preferably 2.5. The lower limit of the ratio is typically 1, and preferably 1.1.

When the Mw/Mn ratio falls within the above range, the solubility of the polymer in a developer solution can be further increased, and consequently both the water repellency of the surface of the upper layer film and the development defects-inhibiting property can be further enhanced.

Preferably, the composition for upper layer film formation (Y1) contains impurities such as halogen ions and metals as low as possible. A decrease in the amount of the impurities can lead to an improvement of application properties as the composition for upper layer film formation (Y1), and of uniform solubility of the upper layer film in a developer solution containing an organic solvent. Examples of the purification method of the polymer component (J) for the purpose of lessening the impurities include: a chemical purification method such as water-rinsing, liquid-liquid extraction and filtration through a demetallizing filter; a combination of the chemical purification method with a physical purification method such as ultrafiltration and centrifugal separation; and the like.

The lower limit of the content of the polymer component (J) with respect to the total solid content in the composition for upper layer film formation (Y1) is preferably 90% by mass, more preferably 95% by mass, and still more preferably 99% by mass. The upper limit of the content is typically 100% by mass. The "total solid content" as referred to herein means components other than the solvent in the composition for upper layer film formation (Y1).

<(P) Solvent>

The solvent (P) contained in the composition for upper layer film formation (Y1) is not particularly limited as long as the solvent (P) can dissolve or disperse the polymer component (J), and other component contained as needed such as the acid diffusion inhibiting compound (K).

Examples of the solvent (P) include solvents exemplified as the organic solvent which may be contained in the developer solution used in the development step described above, and the like. The composition for upper layer film formation (Y1) may contain the solvent (P) either alone of one type, or as a mixture of two or more types thereof.

The solvent (P) preferably contains an ester solvent, a ketone solvent, an amide solvent, an ether solvent, an alcohol solvent, a hydrocarbon solvent or a combination thereof.

These organic solvents are exemplified by one type, or two or more types of solvents exemplified as the solvent (D) of the radiation-sensitive resin composition (X) described above, and the like.

Of these, in light of the inhibition of the elution of the resist film components, the solvent (P) is preferably the alcohol solvent, the ether solvent or a combination thereof. The alcohol solvent is more preferably a monohydric alcohol having 7 or less carbon atoms. The ether solvent is more preferably a polyhydric alcohol alkyl ether.

The lower limit of the content of the alcohol solvent with respect to the solvent in the composition for upper layer film formation (Y1) is preferably 70% by mass, more preferably 75% by mass, and still more preferably 80% by mass. The lower limit of the content of the ether solvent with respect to the solvent in the composition for upper layer film formation (Y1) is preferably 70% by mass, more preferably 75% by mass, and still more preferably 80% by mass. The lower limit of the total content of the alcohol solvent and the ether solvent with respect to the solvent in the composition for upper layer film formation (Y1) is preferably 70% by mass, more preferably 90% by mass, and still more preferably 95% by mass. The upper limit of each total content is 100% by mass, for example.

<(K) Acid Diffusion Inhibiting Compound>

The composition for upper layer film formation (Y1) preferably contains the acid diffusion inhibiting compound (K) regardless of whether the structural unit (VI) of the polymer component (J) is used. In a case where the polymer component (J) does not have the structural unit (VI), the composition for upper layer film formation (Y1) contains the acid diffusion inhibiting compound (K). The acid diffusion inhibiting compound (K) can inhibit excess diffusion of the acid into light-unexposed regions by an action on the light-exposed regions of resist film beneath the formed upper layer film, whereby the lithography characteristics can be improved. The acid diffusion inhibiting compound (K) contains a compound (k1), a compound (k2), a compound (k3) or a combination thereof.

The compound (k1) is represented by the following formula (1).

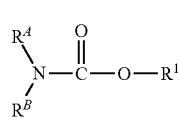

(1)

In the above formula (1), $R^A$ and $R^B$ each independently represent a hydrogen atom or a monovalent organic group having 1 to 20 carbon atoms, or $R^A$ and $R^B$ taken together represent an aliphatic heterocyclic structure having 3 to 20 ring atoms together with the nitrogen atom to which $R^A$ and $R^B$ bond; and $R^1$ represents a monovalent hydrocarbon group having 1 to 20 carbon atoms.

The monovalent organic group having 1 to 20 carbon atoms which may be represented by $R^A$ or $R^B$ is exemplified by: a monovalent chain hydrocarbon group having 1 to 20 carbon atoms; a monovalent alicyclic hydrocarbon group having 3 to 20 carbon atoms; a monovalent aromatic hydrocarbon group having 6 to 20 carbon atoms; a group obtained from the monovalent chain hydrocarbon group, the monovalent alicyclic hydrocarbon group or the monovalent aromatic hydrocarbon group by incorporating a hetero atom-containing group between two adjacent carbon atoms or at the end on the atomic bonding side thereof; a group obtained from the monovalent chain hydrocarbon group, the monovalent alicyclic hydrocarbon group, the monovalent aromatic hydrocarbon group, or the group obtained from the monovalent chain hydrocarbon group, the monovalent alicyclic hydrocarbon group or the monovalent aromatic hydrocarbon group by incorporating a hetero atom-containing group, by substituting a part or all of hydrogen atoms included therein with a substituent; and the like.

The "hetero atom-containing group" as referred to means a group having a hetero atom having a valency of no less than 2 in the structure thereof. The hetero atom-containing group may have either one hetero atom, or two or more hetero atoms.

The hetero atom having a valency of no less than 2 which is included in the hetero atom-containing group is not particularly limited as long as the hetero atom has a valency of no less than 2, and examples thereof include an oxygen atom, a nitrogen atom, a sulfur atom, a silicon atom, a phosphorus atom, a boron atom, and the like.

Examples of the substituent that substitutes for a part or all of hydrogen atoms included in the monovalent chain hydrocarbon group, the monovalent alicyclic hydrocarbon group, the monovalent aromatic hydrocarbon group, or the group obtained from the monovalent chain hydrocarbon group, the monovalent alicyclic hydrocarbon group or the monovalent aromatic hydrocarbon group by incorporating a hetero atom-containing group include:

halogen atoms such as a fluorine atom, a chlorine atom, a bromine atom and an iodine atom;

a hydroxy group, a carboxy group, a cyano group, a nitro group, an acyl group, an acyloxy group, an alkoxy group, a halogenated alkoxy group, an alkoxycarbonyl group, an alkoxycarbonyloxy group, and an oxo group (═O); and the like.

Examples of the aliphatic heterocyclic structure having 3 to 20 ring atoms which may be taken together represented by $R^A$ and $R^B$ together with the nitrogen atom to which $R^A$ and $R^B$ bond include:

azacycloalkane structures such as an azacyclopropane structure, an azacyclobutane structure, an azacyclopentane structure, an azacyclohexane structure, an azacyclooctane structure, an azacyclodecane structure, an azanorbornane structure and an azaadamantane structure;

azaoxacycloalkane structures such as an azaoxacyclopentane structure, an azaoxacyclohexane structure, an azaoxacyclooctane structure and an azaoxanorbornane structure;

diazacycloalkane structures such as a diazacyclopentane structure, a diazacyclohexane structure, a diazacyclooctane structure, a diazacyclodecane structure and a diazanorbornane structure; and the like.

Examples of the monovalent hydrocarbon group having 1 to 20 carbon atoms which is represented by $R^1$ include groups similar to those exemplified in connection with $R^{1'}$, and the like.

Examples of the chain hydrocarbon group include: alkyl groups such as a methyl group, an ethyl group, a propyl group, a butyl group and a pentyl group; alkenyl groups such as an ethenyl group, a propenyl group, a butenyl group and a pentenyl group; alkynyl groups such as an ethynyl group, a propynyl group, a butynyl group and a pentynyl group; and the like.

Examples of the alicyclic hydrocarbon group include: saturated monocyclic alicyclic hydrocarbon groups such as a cyclopropyl group, a cyclobutyl group, a cyclopentyl group and a cyclohexyl group; saturated polycyclic alicyclic hydrocarbon groups such as a norbornyl group, an adamantyl group, a tricyclodecyl group and a tetracyclododecyl group; unsaturated monocyclic alicyclic hydrocarbon groups such as a cyclopropenyl group, a cyclobutenyl group, a cyclopentenyl group and a cyclohexenyl group; unsaturated polycyclic alicyclic hydrocarbon groups such as a norbornenyl group and a tricyclodecenyl group; and the like.

Examples of the aromatic hydrocarbon group include: aryl groups such as a phenyl group, a tolyl group, a xylyl group, a naphthyl group and an anthryl group; aralkyl groups such as a benzyl group, a phenethyl group, a naphthylmethyl group and an anthrylmethyl group; and the like.

Examples of the compound (k1) include N-t-butoxycarbonylpiperidine, N-t-butoxycarbonylimidazole, N-t-butoxycarbonylbenzimidazole, N-t-butoxycarbonyl-2-phenylbenzoimidazolebenzoimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl)diphenylamine, N-t-butoxycarbonyl-4-hydroxypiperidine, N-t-amyloxycarbonyl-4-hydroxypiperidine, N-(undecan-1-ylcarbonyloxyethyl)morpholine, and the like.

The compound (k2) is represented by the following formula (2).

$$X^+Y^- \quad (2)$$

In the above formula (2), $X^+$ represents a monovalent onium cation; and $Y^-$ represents a monovalent weak acid anion.

Examples of the monovalent onium cation represented by $X^+$ include a sulfonium cation, an iodonium cation, an ammonium cation, an oxonium cation, and the like.

Examples of the monovalent weak acid anion represented by $Y^-$ include a monovalent carboxylate anion or a monovalent sulfonamide anion.

Examples of the monovalent carboxylate anion which may be represented by $Y^-$ include a salicylate anion, and the like. Examples of the monovalent sulfonamide anion which may be represented by Y– include a trifluoromethylsulfonamide ion, and the like.

The monovalent weak acid anion represented by $Y^-$ is preferably an acid weaker than an acid generated from the acid generator (C).

The compound (k2) encompasses a photolabile base, i.e. compound that exhibits basicity and is sensitized upon an exposure photosensitive to generate a weak acid, resulting the lowering of the basicity thereof. Examples of the photolabile base include photolabile bases similar to those exemplified in connection with the acid diffusion control agent (E), and the like.

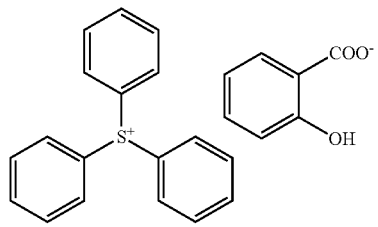

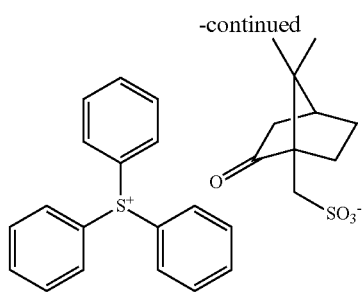

-continued

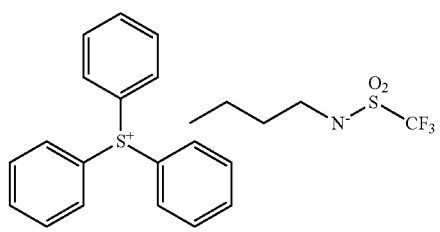

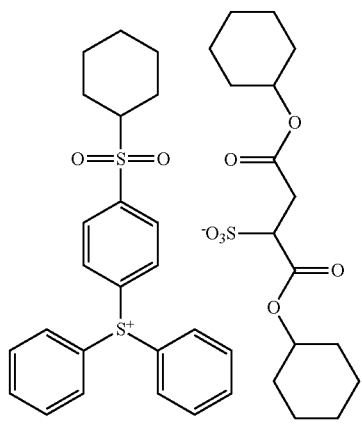

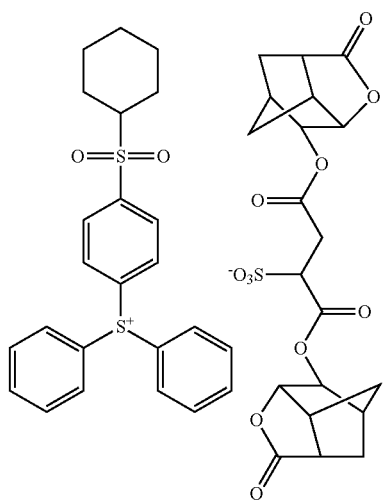

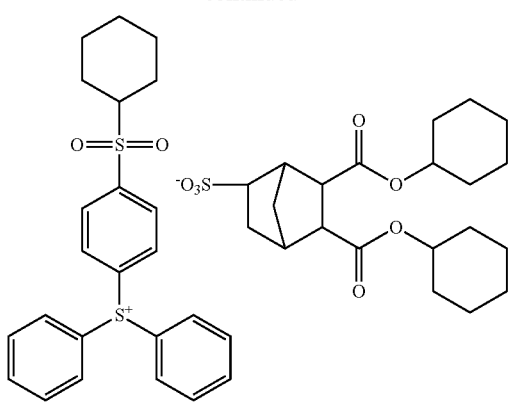

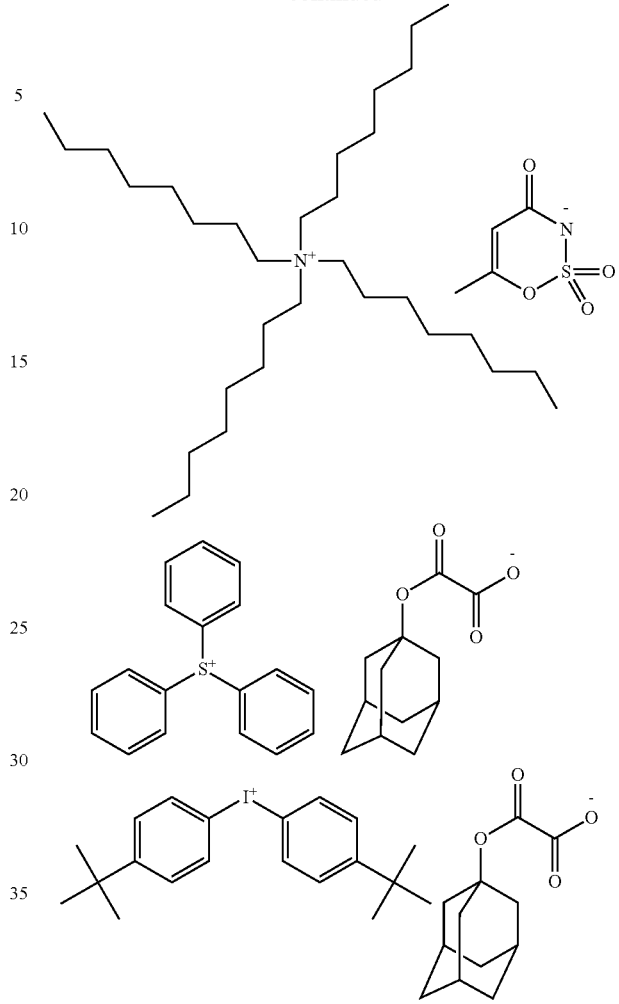

Moreover, examples of the compound (k2) include the following compounds.

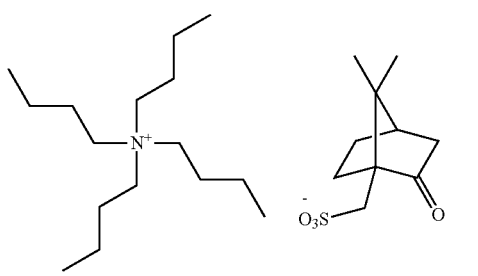

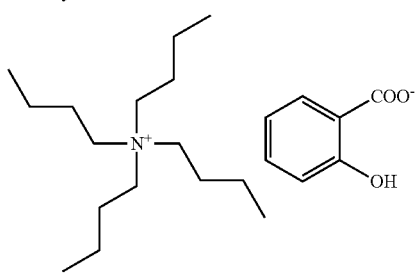

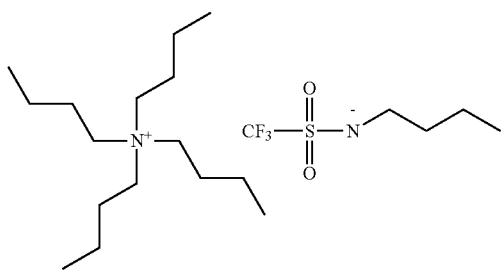

The compound (k3) is represented by the following formula (3).

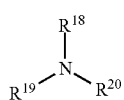

In the above formula (3), $R^{18}$, $R^{19}$ and $R^{20}$ each independently represent a hydrogen atom, or a substituted or unsubstituted linear or branched alkyl group, a monovalent saturated alicyclic hydrocarbon group, a monovalent aryl group or a monovalent aralkyl group.

Examples of the compound (k3) include: monoalkylamines such as n-hexylamine; dialkylamines such as di-n-butylamine; trialkylamines such as triethylamine; aromatic amines such as aniline; and the like.

The acid diffusion inhibiting compound (K) is exemplified by, in addition to the compound (k1), the compound (k2) and the compound (k3): a compound having two nitrogen atoms in a single molecule (hereinafter, may be also referred to as "nitrogen-containing compound (II)"); a compound having three nitrogen atoms in a single molecule (hereinafter, may be also referred to as "nitrogen-containing compound (III)"); an amide group-containing compound; a urea compound; a nitrogen-containing heterocyclic compound; and the like.

Examples of the nitrogen-containing compound (II) include ethylenediamine, N,N,N',N'-tetramethylethylenediamine, and the like.

Examples of the nitrogen-containing compound (III) include: polyamine compounds such as polyethyleneimine and polyallylamine; polymers of dimethylaminoethylacrylamide, etc.; and the like.

Examples of the amide group-containing compound include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compound include: pyridines such as pyridine and 2-methylpyridine; morpholines such as N-propylmorpholine and N-(undecylcarbonyloxyethyl)morpholine; pyrazine; pyrazole; and the like.

The acid diffusion inhibiting compound (K) is preferably tetrabutylammonium camphorsulfonate, triphenylsulfonium salicylate, or the like.

In a case where the composition for upper layer film formation (Y1) contains the acid diffusion inhibiting compound (K), the lower limit of the content of the acid diffusion inhibiting compound (K) with respect to 100 parts by mass of the polymer component (J) is preferably 0.1 parts by mass, more preferably 0.5 parts by mass, and still more preferably 0.8 parts by mass. The upper limit of the content of the acid diffusion inhibiting compound (K) is preferably 20 parts by mass, more preferably 15 parts by mass, and still more preferably 12 parts by mass. When the content of the acid diffusion inhibiting compound (K) falls within the above range, a film loss in the resist pattern formation can be further reduced. The acid diffusion inhibiting compound (K) may be used either alone of one type, or as a mixture of two or more types thereof.

<Other Component>

The composition for upper layer film formation (Y1) may contain other component in addition to the polymer component (J), the solvent (P) and the acid diffusion inhibiting compound (K). The other component is exemplified by a surfactant, and the like.

[Surfactant]

The surfactant is a component for improving the application property of the composition for upper layer film formation (Y1). Commercially available surfactants may also be used as the surfactant. The upper limit of the content of the surfactant with respect to 100 parts by mass of the polymer component (J) is preferably 5 parts by mass, and more preferably 2 parts by mass.

(Preparation Method of Composition for Upper Layer Film Formation (Y1))

The composition for upper layer film formation (Y1) may be prepared by, for example, mixing the polymer component (J), and other component such as the acid diffusion inhibiting compound (K) as needed with the solvent (P) to permit the dissolution, and preferably filtering the resulting mixture through a membrane filter of about 0.2 μm. The lower limit of the solid content concentration of the composition for upper layer film formation (Y1) is preferably 0.1% by mass, more preferably 0.3% by mass, and still more preferably 0.5% by mass. The upper limit of the solid content concentration is preferably 30% by mass, more preferably 20% by mass, and still more preferably 10% by mass.

[Composition for Upper Layer Film Formation (Y2)]

The composition for upper layer film formation (Y2) contains the polymer component (L) as the polymer component (II), and the solvent (P), wherein the polymer component (L) has, in a single polymer or different polymers, a first structural unit that includes an alicyclic structure (structural unit (A)), and a second structural unit that is other than the structural unit (A) and includes a fluorine atom (hereinafter, may be also referred to as "structural unit (B)"), and wherein the percentage content of the fluorine atom in the polymer component (L) is no less than 2% by mass and no greater than 30% by mass.

In negative pattern formation using a developer solution containing an organic solvent, when the composition for upper layer film formation (Y2) is used, the water repellency of the surface of the upper layer film can be enhanced, and a resist pattern with fewer development defects can be formed. Although not necessarily clarified, the reason for achieving the effects described above due to the composition for upper layer film formation (Y2) for use in the negative resist pattern-forming method having the aforementioned constitution is inferred as in the following, for example. More specifically, due to the polymer component (L) having the structural unit (A) that includes an alicyclic structure and the structural unit (B) that includes a fluorine atom, each of these structural units would be arranged in the upper layer film with appropriate phase separation etc. Consequently, the solubility in the developer solution containing the organic solvent would be improved due to the structural unit (A) to result in the inhibition of the generation of the development defects, and the water repellency of the surface of the upper layer film would be more enhanced due to the structural unit (B).

The composition for upper layer film formation (Y2) is used in the negative resist pattern-forming method which includes using a developer solution containing an organic solvent. According to the negative resist pattern-forming method which includes using a developer solution containing an organic solvent, a finer resist pattern can be formed since a higher optical contrast can be achieved as compared with a positive resist pattern-forming method which includes using a developer solution such as an alkaline aqueous solution, and the like.

The composition for upper layer film formation (Y2) contains the polymer component (L) and the solvent (P), and preferably contains (M) a basic compound, a compound that produces a basic compound by an action of an acid, or a combination thereof (hereinafter, may be also referred to as "(M) compound" or "compound (M)"), and may contain other component within a range not leading to impairment of the effects of the present invention. Hereinafter, each component will be described.

[(L) Polymer Component]

The polymer component (L) has the structural unit (A) and the structural unit (B) in a single polymer or different polymers.

The mode of the polymer component (L) is exemplified by the following polymer component (L1), polymer component (L2), and the like.

polymer component (L1): containing a third polymer that has the structural unit (A) (hereinafter, may be also referred to as "polymer (a)"), and a fourth polymer that has the structural unit (B) (hereinafter, may be also referred to as "polymer (b)").

polymer component (L2): containing a fifth polymer that has the structural unit (A) and the structural unit (B) (hereinafter, may be also referred to as "polymer (c)").

The polymer (a) may have, in addition to the structural unit (A), other structural unit such as the structural units (VI) to (IX) of the composition for upper layer film formation (Y1) described above. The polymer (b) may have, in addition to the structural unit (B), other structural unit such as the structural units (VI) to (IX). The polymer (c) may have, in addition to the structural unit (A) and the structural unit (B), other structural unit such as the structural units (VI) to (IX).

The polymer component (L1) may contain other polymer in addition to the polymer (a) and the polymer (b). The polymer component (L2) may contain other polymer in addition to the polymer (c). Hereinafter, each structural unit will be described.

[Structural Unit (A)]

The structural unit (A) includes an alicyclic structure. The structural unit (A) has been described as the structural unit (A) in the composition for upper layer film formation (Y1).

The lower limit of the proportion of the structural unit (A) in the polymer component (L) with respect to the total structural units constituting the polymer component (L) is preferably 5 mol %, more preferably 10 mol %, still more preferably 20 mol %, particularly preferably 30 mol %, further particularly preferably 35 mol %, and most preferably 40 mol %. The upper limit of the proportion of the structural unit (A) in the polymer component (L) is preferably 95 mol %, more preferably 90 mol %, still more preferably 80 mol %, particularly preferably 75 mol %, further particularly preferably 70 mol %, and most preferably 65 mol %.

In a case where the polymer component (L) is the polymer component (L1), the lower limit of the proportion of the structural unit (A) with respect to the total structural units constituting the polymer (a) is preferably 10 mol %, more preferably 20 mol %, still more preferably 30 mol %, and particularly preferably 40 mol %. The upper limit of the proportion of the structural unit (A) is preferably 100 mol %, more preferably 90 mol %, still more preferably 80 mol %, and particularly preferably 75 mol %.

In a case where the polymer component (L) is the polymer component (L2), the lower limit of the proportion of the structural unit (A) with respect to the total structural units constituting the polymer (c) is preferably 5 mol %, more preferably 10 mol %, still more preferably 20 mol %, and particularly preferably 30 mol %. The upper limit of the proportion of the structural unit (A) is preferably 80 mol %, more preferably 75 mol %, still more preferably 70 mol %, and particularly preferably 65 mol %.

When the proportion of the structural unit (A) falls within the above range, the solubility of the polymer component (L) in the developer solution can be adjusted more properly, and consequently according to the resist pattern-forming method, both the water repellency of the surface of the upper layer film and the development defects-inhibiting property can be further enhanced.

[Structural Unit (B)]

The structural unit (B) is other than the structural unit (A) and includes a fluorine atom. Thus, structural units that include an alicyclic structure and a fluorine atom shall be included in the structural unit (A). The structural unit (B) is exemplified by: a structural unit (B-1) represented by the above formula (7) presented in connection with the polymer component (J) contained in the composition for upper layer film formation (Y1); a structural unit (B-2) that includes a fluorinated alkyl group; a structural unit (B-3) that includes a group represented by the formula (13) described later; and the like. The structural unit (B-2) is exemplified by a structural unit similar to that exemplified in connection with the structural unit (V-2) in the composition for upper layer film formation (Y1), and the like.

(Structural Unit (B-1))

The structural unit (B-1) is represented by the above formula (7).

The lower limit of the proportion of the structural unit (B-1) in the polymer component (L) with respect to the total structural units constituting the polymer component (L) is preferably 10 mol %, more preferably 20 mol %, still more preferably 35 mol %, and particularly preferably 45 mol %. The upper limit of the proportion of the structural unit (B-1) in the polymer component (L) is preferably 90 mol %, more preferably 80 mol %, still more preferably 75 mol %, and particularly preferably 60 mol %.

In a case where the polymer component (L) is the polymer component (L1), the lower limit of the proportion of the structural unit (B-1) with respect to the total structural units constituting the polymer (b) is preferably 10 mol %, more preferably 20 mol %, still more preferably 30 mol %, and particularly preferably 40 mol %. The upper limit of the proportion of the structural unit (B-1) is preferably 100 mol %, more preferably 90 mol %, still more preferably 80 mol %, and particularly preferably 75 mol %.

In a case where the polymer component (L) is the polymer component (L2), the lower limit of the proportion of the structural unit (B-1) with respect to the total structural units constituting the polymer (c) is preferably 5 mol %, more preferably 10 mol %, still more preferably 20 mol %, and particularly preferably 30 mol %. The upper limit of the proportion of the structural unit (B-1) is preferably 80 mol %, more preferably 75 mol %, still more preferably 70 mol %, and particularly preferably 65 mol %.

When the proportion of the structural unit (B-1) falls within the above range, both the water repellency of the surface of the upper layer film and the defects-inhibiting property can be further enhanced.

(Structural Unit (B-2))

The structural unit (B-2) includes a fluorinated alkyl group. When the polymer component (L) has the structural unit (B-2), the water repellency of the upper layer film can be more enhanced.

The lower limit of the proportion of the structural unit (B-2) in the polymer component (L) with respect to the total structural units constituting the polymer component (L) is preferably 10 mol %, more preferably 20 mol %, and still more preferably 30 mol %. The upper limit of the proportion of the structural unit (B-2) in the polymer component (L) is preferably 80 mol, more preferably 70 mol %, and still more preferably 60 mol %.

In a case where the polymer component (L) is the polymer component (L1), the lower limit of the proportion of the structural unit (B-2) with respect to the total structural units constituting the polymer (b) is preferably 20 mol %, more preferably 40 mol %, and still more preferably 60 mol %. The upper limit of the proportion of the structural unit (B-2) is preferably 100 mol %, more preferably 90 mol %, and still more preferably 80 mol %.

In a case where the polymer component (L) is the polymer component (L2), the lower limit of the proportion of the structural unit (B-2) with respect to the total structural units constituting the polymer (c) is preferably 10 mol %, more preferably 20 mol %, and still more preferably 30 mol %.

The upper limit of the proportion of the structural unit (B-2) is preferably 80 mol %, more preferably 70 mol %, and still more preferably 60 mol %.

When the proportion of the structural unit (B-2) falls within the above range, the water repellency of the surface of the upper layer film can be further enhanced.

(Structural Unit (B-3))

The structural unit (B-3) includes a group (13). The group (13) is a fluorinated sulfonamide group represented by the following formula (13). When the polymer component (L) has the structural unit (B-3), the solubility thereof in a developer solution containing an organic solvent can be improved. Consequently, both the water repellency of the surface of the upper layer film and the defects-inhibiting property can be more enhanced.

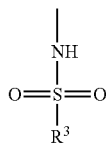

(13)

In the above formula (13), $R^3$ represents a monovalent fluorinated hydrocarbon group having 1 to 20 carbon atoms.

Examples of the monovalent fluorinated hydrocarbon group having 1 to 20 carbon atoms which is represented by $R^3$ include fluorinated hydrocarbon groups similar to those exemplified in connection with $R^1$, and the like.

Examples of the group (13) include a fluoromethylsulfonamide group, a difluoromethylsulfonamide group, a trifluoromethylsulfonamide group, a difluoroethylsulfonamide group, a trifluoroethylsulfonamide group, a pentafluoroethylsulfonamide group, a trifluoro-n-propylsulfonamide group, a heptafluoro-n-sulfonamide group, a trifluoro-i-propylsulfonamide group, a hexafluoro-i-propylsulfonamide group, a nonafluoro-n-butylsulfonamide group, an undecafluoro-n-pentylsulfonamide group, and the like.

Of these, perfluoroalkylsulfonamide groups are preferred, the trifluoromethylsulfonamide group, the pentafluoroethylsulfonamide group, the trifluoro-n-propylsulfonamide group and the nonafluoro-n-butylsulfonamide group are more preferred, and the trifluoromethylsulfonamide group is still more preferred.

Examples of the structural unit (B-3) include a structural unit represented by the following formula (13-a) (hereinafter, may be also referred to as "structural unit (B-3a)"), and the like.

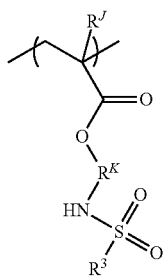

(13-a)

In the above formula (13-a), $R^J$ represents a hydrogen atom, a methyl group, a fluorine atom or a trifluoromethyl group; $R^K$ represents a divalent linking group; and $R^3$ is as defined in the above formula (4).

In light of the copolymerizability of a monomer that gives the structural unit (B-3a) etc., $R^J$ represents preferably the hydrogen atom or the methyl group, and more preferably the methyl group.

The divalent linking group represented by $R^K$ is exemplified by: a divalent chain hydrocarbon group having 1 to 6 carbon atoms; a divalent alicyclic hydrocarbon group having 4 to 12 carbon atoms; a divalent aromatic hydrocarbon group having 6 to 14 carbon atoms; a group obtained from the chain hydrocarbon group by combining the chain hydrocarbon group with —O—; a group obtained from the group obtained from the chain hydrocarbon group by combining the chain hydrocarbon group with —O— by substituting hydrogen atoms included therein with an oxo group; and the like.

Examples of the divalent chain hydrocarbon group having 1 to 6 carbon atoms include:

alkanediyl groups such as a methanediyl group, a 1,2-ethanediyl group, a 1,1-ethanediyl group, a 1,3-propanediyl group, a 1,2-propanediyl group, a 1,1-propanediyl group, a 2,2-propanediyl group, a 1,4-propanediyl group, a 1,5-pentanediyl group, a 1,6-hexanediyl group, a 1-methyl-1,3-propanediyl group, a 2-methyl-1,3-propanediyl group, a 2-methyl-1,2-propanediyl group, a 1-methyl-1,4-butanediyl group and a 2-methyl-1,4-butanediyl group;

alkenediyl groups such as a 1,2-ethenediyl group, a 1,3-propenediyl group and a 1,2-propenediyl group; and the like.

Examples of the divalent alicyclic hydrocarbon group having 4 to 12 carbon atoms include:

monocyclic cycloalkanediyl groups, e.g. cyclobutanediyl groups such as a 1,3-cyclobutanediyl group, cyclopentanediyl groups such as a 1,3-cyclopentanediyl group, cyclohexanediyl groups such as a 1,4-cyclohexanediyl group and a 1,2-cyclohexanediyl group, and cyclooctanediyl groups such as a 1,5-cyclooctanediyl group;

polycyclic alkanediyl groups, e.g. norbornanediyl groups such as a 1,4-norbornanediyl group and a 2,5-norbornanediyl group, adamantanediyl groups such as a 1,3-adamantanediyl group and a 2,4-adamantanediyl group; and the like.

Examples of the divalent aromatic hydrocarbon group having 6 to 14 carbon atoms include:

arenediyl groups such as a benzenediyl group, a toluenediyl group and a naphthalenediyl group;

arenediylalkanediyl groups such as a benzenediylmethanediyl group and a naphthalenediylmethanediyl group;

alkanediylarenediylalkanediyl groups such as a methanediylbenzenediylmethanediyl group and a methanediylnaphthalenediylmethanediyl group; and the like.

Examples of the group obtained from the chain hydrocarbon group by combining the chain hydrocarbon group with —O— include an ethanediyloxyethanediyl group, a propanediyloxypropanediyl group, and the like.

Examples of the group obtained from the group obtained from the chain hydrocarbon group by combining the chain hydrocarbon group with —O— by substituting hydrogen atoms included therein with an oxo group include a methanediylcarbonylmethanediylcarbonyloxyethanediyl group, ethanediylcarbonylmethanediylcarbonyloxypropanediyl group, and the like.

Of these, $R^K$ represents preferably a divalent chain hydrocarbon group having 1 to 3 carbon atoms, a divalent alicyclic hydrocarbon group having 5 to 8 carbon atoms and an aromatic hydrocarbon group having 6 to 10 carbon atoms, more preferably a 1,2-ethanediyl group, a 1,3-propanediyl group, a 1,6-cyclohexanediyl group and a methanediylbenzenediylmethanediyl group, and still more preferably a 1,2-ethanediyl group.

Examples of the structural unit (B-3a) include structural units represented by the following formulae (13-a-1) to (13-a-7) (hereinafter, may be also referred to as "structural units (B-3a-1) to (B-3a-7)"), and the like.

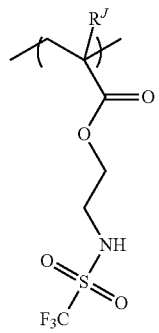
(13-a-1)

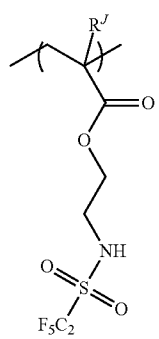
(13-a-2)

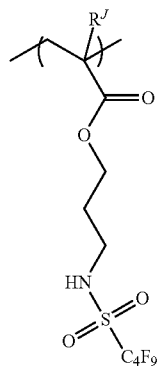
(13-a-3)

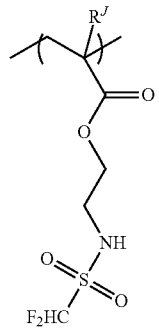
(13-a-4)

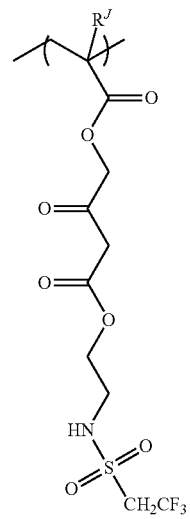
(13-a-5)

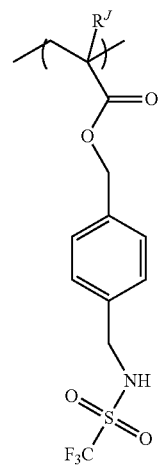
(13-a-6)

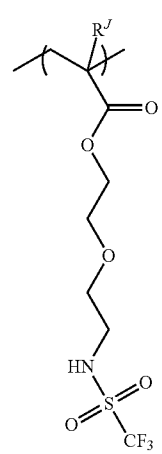
(13-a-7)

In the above formulae (13-a-1) to (13-a-7), $R^J$ is as defined in the above formula (13-a).

Of these, the structural units (B-3a-1) to (B-3a-4) are preferred, the structural units (B-3a-1) to (B-3a-3) are more preferred, and the structural unit (B-3a-1) is still more preferred.

The lower limit of the proportion of the structural unit (B-3) in the polymer component (L) with respect to the total structural units constituting the polymer component (L) is preferably 5 mol %, and more preferably 10 mol %. The upper limit of the proportion of the structural unit (B-3) in the polymer component (L) is preferably 90 mol %, and more preferably 70 mol %.

In a case where the polymer component (L) is the polymer component (L1), the lower limit of the proportion of the structural unit (B-3) with respect to the total structural units constituting the polymer (b) is preferably 10 mol %, and more preferably 20 mol %. The upper limit of the proportion of the structural unit (B-3) is preferably 60 mol %, and more preferably 50 mol %.

In a case where the polymer component (L) is the polymer component (L2), the lower limit of the proportion of the structural unit (B-3) with respect to the total structural units constituting the polymer (c) is preferably 5 mol %, and more preferably 10 mol %. The upper limit of the proportion of the structural unit (B-3) is preferably 90 mol %, and more preferably 70 mol %.

When the proportion of the structural unit (B-3) falls within the above range, according to the negative resist pattern-forming method, both the water repellency of the surface of the upper layer film and the development defects-inhibiting property can be further enhanced.

(Other Structural Unit that Includes Fluorine Atom)

The polymer component (L) may have as the structural unit (B), other structural unit that includes a fluorine atom than the structural units (B-1) to (B-3). The other structural unit that includes a fluorine atom is exemplified by a structural unit that includes a fluorinated aromatic hydrocarbon group, and the like. The upper limit of the proportion of the other structural unit that includes a fluorine atom with respect to the total structural units constituting the polymer component (L) is preferably 20 mol %, and more preferably 10 mol %.

The lower limit of the proportion of the structural unit (B) in the polymer component (L) with respect to the total structural units constituting the polymer component (L) is preferably 5 mol %, more preferably 10 mol %, still more preferably 15 mol %, and particularly preferably 20 mol %. The upper limit of the proportion of the structural unit (B) in the polymer (L) is preferably 95 mol %, more preferably 80 mol %, still more preferably 70 mol %, particularly preferably 60 mol %, further particularly preferably 50 mol %, and most preferably 40 mol %.

In a case where the polymer component (L) is the polymer component (L1), the lower limit of the proportion of the structural unit (B) with respect to the total structural units constituting the polymer (b) is preferably 10 mol %, more preferably 20 mol %, still more preferably 30 mol %, and particularly preferably 40 mol %. The upper limit of the proportion of the structural unit (B) is preferably 100 mol %, more preferably 90 mol %, still more preferably 80 mol %, and particularly preferably 70 mol %.

In a case where the polymer component (L) is the polymer component (L2), the lower limit of the proportion of the structural unit (B) with respect to the total structural units constituting the polymer (c) is preferably 5 mol %, more preferably 10 mol %, still more preferably 15 mol %, and particularly preferably 20 mol %. The upper limit of the proportion of the structural unit (B) is preferably 70 mol %, more preferably 60 mol %, still more preferably 50 mol %, and particularly preferably 40 mol %.

When the proportion of the structural unit (B) falls within the above range, according to the negative resist pattern-forming method, both the water repellency of the surface of the upper layer film and the development defects-inhibiting property can be further enhanced.

[Other Structural Unit]

Other structural unit is exemplified by a structural unit that includes a carboxy group, a sulfo group or a combination thereof (hereinafter, may be also referred to as "structural unit (C)"), a structural unit that includes the group represented by the above formula (12) (hereinafter, may be also referred to as "structural unit (D)"), a structural unit that includes a lactone structure, a cyclic carbonate structure, a sultone structure or a combination thereof (hereinafter, may be also referred to as "structural unit (E)"), which are included in the polymer component (J) contained in the composition for upper layer film formation (Y1) described above, a structural unit that includes a basic group and a structural unit that includes a group which produces a basic group by an action of an acid (hereinafter, may be also referred to as "structural unit (F)"), and the like.

In a case where the polymer component (L) has the structural unit (C), the lower limit of the proportion of the structural unit (C) with respect to the total structural units constituting the polymer component (L) is preferably 5 mol %, more preferably 10 mol %, still more preferably 15 mol %, and particularly preferably 20 mol %. The upper limit of the proportion of the structural unit (C) is preferably 70 mol %, more preferably 60 mol %, still more preferably 50 mol %, and particularly preferably 40 mol %.

In a case where the polymer component (L) is the polymer component (L1), the lower limit of the proportion of the structural unit (C) with respect to the total structural units constituting the polymer (a) is preferably 5 mol %, more preferably 10 mol %, still more preferably 15 mol %, and particularly preferably 20 mol %. The upper limit of the proportion of the structural unit (C) with respect to the total structural units constituting the polymer (a) is preferably 50 mol %, more preferably 40 mol %, still more preferably 30 mol %, and particularly preferably 25 mol %. In addition, the lower limit of the proportion of the structural unit (C) with respect to the total structural units constituting the polymer (b) is preferably 5 mol %, more preferably 10 mol %, still more preferably 15 mol %, and particularly preferably 20 mol %. The upper limit of the proportion of the structural unit (C) with respect to the total structural units constituting the polymer (b) is preferably 50 mol %, more preferably 40 mol %, still more preferably 30 mol %, and particularly preferably 25 mol %.

In a case where the polymer component (L) is the polymer component (L2), the lower limit of the proportion of the structural unit (C) with respect to the total structural units constituting the polymer (c) is preferably 5 mol %, more preferably 10 mol %, still more preferably 15 mol %, and particularly preferably 20 mol %. The upper limit of the proportion of the structural unit (C) is preferably 50 mol %, more preferably 40 mol %, still more preferably 30 mol %, and particularly preferably 25 mol %.

In a case where the polymer component (L) has the structural unit (D), the lower limit of the proportion of the structural unit (D) with respect to the total structural units constituting the polymer component (L) is preferably 5 mol %, more preferably 10 mol %, still more preferably 15 mol %, and particularly preferably 20 mol %. The upper limit of the proportion of the structural unit (D) is preferably 70 mol %, more preferably 60 mol %, still more preferably 50 mol %, and particularly preferably 40 mol %.

In a case where the polymer component (L) is the polymer component (L1), the lower limit of the proportion of the structural unit (D) with respect to the total structural units constituting the polymer (a) is preferably 5 mol %, more preferably 10 mol %, still more preferably 15 mol %, and particularly preferably 20 mol %. The upper limit of the proportion of the structural unit (D) with respect to the total structural units constituting the polymer (a) is preferably 50 mol %, more preferably 40 mol %, still more preferably 30 mol %, and particularly preferably 25 mol %. In addition, the lower limit of the proportion of the structural unit (D) with respect to the total structural units constituting the polymer (b) is preferably 5 mol %, more preferably 10 mol %, still more preferably 15 mol %, and particularly preferably 20 mol %. The upper limit of the proportion of the structural unit (D) with respect to the total structural units constituting the polymer (b) is preferably 50 mol %, more preferably 40 mol %, still more preferably 30 mol %, and particularly preferably 25 mol %.

In a case where the polymer component (L) is the polymer component (L2), the lower limit of the proportion of the structural unit (D) with respect to the total structural units constituting the polymer (c) is preferably 5 mol %, more preferably 10 mol %, still more preferably 15 mol %, and particularly preferably 20 mol %. The upper limit of the proportion of the structural unit (D) is preferably 50 mol %, more preferably 40 mol %, still more preferably 30 mol %, and particularly preferably 25 mol %.

When the proportion of the structural unit (D) falls within the above range, a resist pattern with further fewer development defects can be formed.

In a case where the polymer component (L) has the structural unit (E), the lower limit of the proportion of the structural unit (E) with respect to the total structural units constituting the polymer component (L) is preferably 5 mol %, more preferably 10 mol %, still more preferably 15 mol %, and particularly preferably 20 mol %. The upper limit of the proportion of the structural unit (E) is preferably 50 mol %, more preferably 40 mol %, still more preferably 30 mol %, and particularly preferably 25 mol %.

In a case where the polymer component (L) is the polymer component (L1), the lower limit of the proportion of the structural unit (E) with respect to the total structural units constituting the polymer (a) is preferably 5 mol %, more preferably 10 mol %, still more preferably 15 mol %, and particularly preferably 20 mol %. The upper limit of the proportion of the structural unit (E) with respect to the total structural units constituting the polymer (a) with respect to the total structural units constituting the polymer (a) is preferably 50 mol %, more preferably 40 mol %, still more preferably 30 mol %, and particularly preferably 25 mol %. In addition, the lower limit of the proportion of the structural unit (E) with respect to the total structural units constituting the polymer (b) is preferably 5 mol %, more preferably 10 mol %, still more preferably 15 mol %, and particularly preferably 20 mol %. The upper limit of the proportion of the structural unit (E) with respect to the total structural units constituting the polymer (b) is preferably 50 mol %, more preferably 40 mol %, still more preferably 30 mol %, and particularly preferably 25 mol %.

In a case where the polymer component (L) is the polymer component (L2), the lower limit of the proportion of the structural unit (E) with respect to the total structural units constituting the polymer (c) is preferably 5 mol %, more preferably 10 mol %, still more preferably 15 mol %, and particularly preferably 20 mol %. The upper limit of the proportion of the structural unit (E) is preferably 50 mol %, more preferably 40 mol %, still more preferably 30 mol %, and particularly preferably 25 mol %.

(Structural Unit (F))

The structural unit (F) is a structural unit that includes a basic group, a structural unit that includes a group which produces a basic group by an action of an acid, or a combination thereof. When the polymer component (L) has the structural unit (F), deprotection (i.e., generation of an acidic group through the dissociation of an acid-labile group) can be inhibited by an action of the basic group, and consequently a film loss can be inhibited in the light-exposed regions of the resist film. The structural unit (F) is exemplified by a structural unit similar to the structural unit (VI) in the polymer component (J) contained in the composition for upper layer film formation (Y1) described above, and the like.

In a case where the polymer component (L) has the structural unit (F), the lower limit of the proportion of the structural unit (F) with respect to the total structural units constituting the polymer component (L) is preferably 5 mol %, more preferably 10 mol %, still more preferably 15 mol %, and particularly preferably 20 mol %. The upper limit of the proportion of the structural unit (F) is preferably 50 mol %, more preferably 40 mol %, still more preferably 30 mol %, and particularly preferably 25 mol %.

In a case where the polymer component (L) is the polymer component (L1), the lower limit of the proportion of the structural unit (F) with respect to the total structural units constituting the polymer (a) is preferably 5 mol %, more preferably 10 mol %, still more preferably 15 mol %, and particularly preferably 20 mol %. The upper limit of the proportion of the structural unit (F) with respect to the total structural units constituting the polymer (a) is preferably 50 mol %, more preferably 40 mol %, still more preferably 30 mol %, and particularly preferably 25 mol %. In addition, the lower limit of the proportion of the structural unit (V) with respect to the total structural units constituting the polymer (b) is preferably 5 mol %, more preferably 10 mol %, still more preferably 15 mol %, and particularly preferably 20 mol %. The upper limit of the proportion of the structural unit (V) with respect to the total structural units constituting the polymer (b) is preferably 50 mol %, more preferably 40 mol %, still more preferably 30 mol %, and particularly preferably 25 mol %.

In a case where the polymer component (L) is the polymer component (L2), the lower limit of the proportion of the structural unit (F) with respect to the total structural units constituting the polymer (c) is preferably 5 mol %, more preferably 10 mol %, still more preferably 15 mol %, and particularly preferably 20 mol %. The upper limit of the proportion of the structural unit (F) is preferably 50 mol %, more preferably 40 mol %, still more preferably 30 mol %, and particularly preferably 25 mol %.

When the proportion of the structural unit (F) falls within the above range, a film loss in the light-exposed regions of the resist film can be further inhibited.

The polymer component (L) may have other structural unit than the structural units described above. The other structural unit is exemplified by: a structural unit that includes a nonlabile chain hydrocarbon group or an aromatic hydrocarbon group; a structural unit that includes a hydroxy group; and the like. Examples of the nonlabile chain hydrocarbon group include a methyl group, an ethyl group, a propyl group, a butyl group, a pentyl group, and the like. Examples of the aromatic hydrocarbon group include a phenyl group, a naphthyl group, a benzyl group, a naphthylmethyl group, and the like. The upper limit of the proportion of the other structural unit with respect to the total structural units constituting the polymer component (A) is preferably 20 mol %, and more preferably 10 mol %.

The lower limit of the mass ratio of the polymer (a) to the polymer (b) in the polymer component (L1) is preferably 10/90, more preferably 30/70, still more preferably 50/50, particularly preferably 60/40, further particularly preferably 65/35, and most preferably 70/30. The upper limit of the mass ratio of the polymer (a) to the polymer (b) in the polymer component (L1) is preferably 95/5, more preferably 90/10, and still more preferably 85/15. According to the composition for upper layer film formation (Y2) that contains the polymer component (L1), when the mass ratio of the polymer (a) to the polymer (b) falls within the above range, both the water repellency of the surface of the upper layer film and the development defects-inhibiting property can be further enhanced.

[Other Polymer]

The composition for upper layer film formation (Y2) may contain as the polymer component (L1), other polymer than the polymer (a) and the polymer (b). The composition for upper layer film formation (Y2) may contain as the polymer component (L2), other polymer than the polymer (c). The other polymer is exemplified by a polymer that has neither the structural unit (A) nor the structural unit (B), and the like, and is also exemplified by a polymer constituted with at least one of: the structural units (VI) to (IX) in the polymer component (J) of the composition for upper layer film formation (Y1) described above; and other structural unit, and the like.

The lower limit of the percentage content of the fluorine atom in the polymer component (L) is 2% by mass, preferably 5% by mass, still more preferably 7% by mass, and particularly preferably 8% by mass. The upper limit of the percentage content of the fluorine atom is 30% by mass, preferably 25% by mass, more preferably 20% by mass, particularly preferably 15% by mass, and further particularly preferably 10% by mass. When the percentage content of the fluorine atom of the polymer component (L) falls within the above range, both the water repellency of the surface of the upper layer film and the development defects-inhibiting property can be further enhanced.

[Synthesis Method of Polymer Component (L)]

The polymer (a), the polymer (b), the polymer (c) and other polymer that each constitute the polymer component (L) can be synthesized, for example, according to a similar method to that for the polymer component (J).

The lower limit of the Mw of the polymer component (L) is preferably 2,000, more preferably 3,000, still more preferably 4,000, and particularly preferably 5,000. The upper limit of the Mw is preferably 50,000, more preferably 30,000, still more preferably 20,000, and particularly preferably 10,000.

In a case where the polymer component (L) is the polymer component (L1), the lower limit of the polystyrene equivalent weight average molecular weight (Mw) as determined by gel permeation chromatography (GPC) of the polymer (a) is preferably 2,000, more preferably 3,000, still more preferably 4,000, and particularly preferably 5,000. The upper limit of the Mw is preferably 50,000, more preferably 30,000, still more preferably 20,000, and particularly preferably 10,000. In addition, the lower limit of the Mw of the polymer (b) is preferably 2,000, more preferably 3,000, still more preferably 4,000, and particularly preferably 5,000. The upper limit of the Mw is preferably 50,000, more preferably 30,000, still more preferably 20,000, and particularly preferably 10,000.

In a case where the polymer component (L) is the polymer component (L2), the lower limit of the Mw of the polymer (c) is preferably 2,000, more preferably 3,000, still more preferably 4,000, and particularly preferably 5,000. The upper limit of the Mw is preferably 50,000, more preferably 30,000, still more preferably 20,000, and particularly preferably 10,000.

When the Mw of the polymer in the polymer component (L) falls within the above range, the solubility of the polymer in a developer solution can be adjusted properly, and consequently generation of development defects in the resist pattern can be further inhibited.

The upper limit of the Mw/Mn ratio of the polymer component (L) is preferably 5, more preferably 3, still more preferably 2.5, and particularly preferably 2. The lower limit of the ratio is typically 1, and preferably 1.1.

In a case where the polymer component (L) is the polymer component (L1), the upper limit of the ratio (Mw/Mn) of the Mw to the polystyrene equivalent number average molecular weight (Mw) as determined by GPC of the polymer (a) is preferably 5, more preferably 3, still more preferably 2.5, and particularly preferably 2. The lower limit of the ratio is typically 1, and preferably 1.1. In addition, the upper limit of the Mw/Mn ratio of the polymer (b) is preferably 5, more preferably 3, still more preferably 2.5, and particularly preferably 2. The lower limit of the ratio is typically 1, and preferably 1.1.

In a case where the polymer component (L) is the polymer component (L2), the upper limit of the Mw/Mn ratio of the polymer (c) is preferably 5, more preferably 3, still more preferably 2.5, and particularly preferably 2. The lower limit of the ratio is typically 1, and preferably 1.1.

When the Mw/Mn ratio falls within the above range, the solubility of the polymer in a developer solution can be further increased, and consequently both the water repellency of the surface of the upper layer film and the development defects-inhibiting property can be further enhanced.

The lower limit of the content of the polymer component (L) with respect to the total solid content of the composition for upper layer film formation (Y2) is preferably 90% by mass, more preferably 95% by mass, and still more preferably 99% by mass. The upper limit of the content is typically 100% by mass.

[(P) Solvent]

The solvent (P) contained in the composition for upper layer film formation (Y2) is exemplified by solvents similar to those exemplified in connection with the solvent (P) of the composition for upper layer film formation (Y1), and the like.

Examples of the solvent (P) include solvents exemplified as the organic solvent which may be contained in the developer solution used in the development step, and the like. The composition for upper layer film formation (Y2) may contain the solvent (P) either alone of one type, or as a mixture of two or more types thereof.

The solvent (P) is preferably composed of an ester solvent, a ketone solvent, an amide solvent, a cyclic ether solvent, an alcohol solvent and a combination thereof. The alcohol solvent is preferably an alcohol solvent having 5 or more carbon atoms. In particular, in a case where the polymer component (A) is a polymer component (A3), the solvent described above is preferably used in light of further enhancement of the water repellency of the surface of the upper layer film.

[Other Component]

The composition for upper layer film formation (Y2) may contain other component in addition to the polymer component (L) and the solvent (P). The other component is exemplified by the basic compound (M), a surfactant, and the like.

[(M) Compound]

The compound (M) is a basic compound, a compound that produces a basic compound by an action of an acid, or a combination thereof. The compound (M) can inhibit deprotection by an action on the light-exposed regions of the resist film beneath the formed upper layer film, whereby a film loss in the resist pattern formation can be further reduced. Moreover, a blob defects-inhibiting property in the resist pattern can be improved.

The basic compound is exemplified by a (cyclo)alkylamine compound, a nitrogen-containing heterocyclic compound, an amide group-containing compound, a urea compound, a photolabile basic compound, and the like.

Examples of the (cyclo)alkylamine compound include a compound having one nitrogen atom, a compound having two nitrogen atoms, a compound having 3 or more nitrogen atoms, and the like.

The compound (M) is preferably the (cyclo)alkylamine compound, the nitrogen-containing heterocyclic compound, a compound that produces the (cyclo)alkylamine compound by an action of an acid, or a compound that produces the nitrogen-containing heterocyclic compound by an action of an acid, more preferably the (cyclo)alkylamine compound or the compound that produces the nitrogen-containing heterocyclic compound by an action of an acid, still more preferably a substituted alkylamines or an N-t-alkoxycarbonyl-substituted nitrogen-containing aliphatic heterocyclic compound, and particularly preferably tri(n-hexyloxyethyl)amine and N-t-amyloxycarbonyl-4-hydroxypiperidine.

In a case where the composition for upper layer film formation (Y2) contains the compound (M), the lower limit of the content of the compound (M) with respect to 100 parts by mass of the polymer component (L) is preferably 0.01 parts by mass, more preferably 0.1 parts by mass, still more preferably 0.2 parts by mass, and particularly preferably 0.5 parts by mass. The upper limit of the content of the compound (M) is preferably 10 parts by mass, more preferably 5 parts by mass, still more preferably 3 parts by mass, and particularly preferably 2 parts by mass. When the content of the compound (M) falls within the above range, a film loss in the resist pattern formation can be further reduced. The compound (M) may be used either alone of one type, or as a mixture of two or more types thereof.

[Surfactant]

The surfactant is a component for improving the application property of the composition for upper layer film formation (Y2). Commercially available surfactants may also be used as the surfactant. The upper limit of the content of the surfactant with respect to 100 parts by mass of the polymer component (L) is preferably 5 parts by mass, and more preferably 2 parts by mass.

[Preparation Method of Composition for Upper Layer Film Formation (Y2)]

The composition for upper layer film formation (Y2) may be prepared by, for example, mixing the polymer component (L), and other component such as the compound (M) as needed with the solvent (P) to permit the dissolution, and preferably filtering the resulting mixture through a membrane filter of about 0.2 μm. The lower limit of the solid content concentration of the composition for upper layer film formation (Y2) is preferably 0.1% by mass, more preferably 0.3% by mass, and still more preferably 0.5% by mass. The upper limit of the solid content concentration is preferably 30% by mass, more preferably 20% by mass, and still more preferably 10% by mass.

EXAMPLES

Hereinafter, the embodiment of the present invention will be explained in more detail by way of Examples, but the present invention is not in any way limited to these Examples. Measuring methods for various types of physical properties are shown below.

[Determination of Mw and Mn]

The Mw and the Mn of the polymer were determined by gel permeation chromatography (GPC) under the following conditions:

GPC columns: "G2000 HXL"×2, "G3000 HXL"×1 and "G4000 HXL"×1 available from Tosoh Corporation;

elution solvent: tetrahydrofuran;

flow rate: 1.0 mL/min;

column temperature: 40° C.;

standard substance: mono-dispersed polystyrene; and detector: differential refractometer.

[$^1$H-NMR, $^{13}$C-NMR Analysis and $^{19}$F-NMR Analysis]

$^1$H-NMR and $^{13}$C-NMR analyses of the polymer were performed using a nuclear magnetic resonance apparatus ("JNM-ECX400" available from JEOL, Ltd.), acetone-d6 as a solvent for measurement, and tetramethylsilane (TMS) as an internal standard.

Example (I)

Preparation of Radiation-Sensitive Resin Composition

Radiation-sensitive resin compositions for use in resist film formation were prepared according to the following procedure.

<Syntheses of Polymer (A) and Polymer (B)>

Monomers used in the synthesis of the polymer (A) and the polymer (B) are shown below.

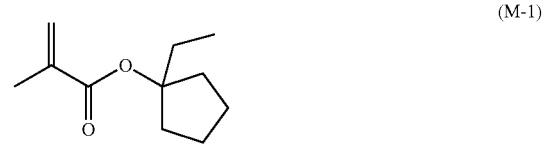

(M-1)

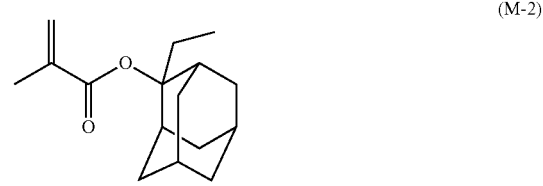

(M-2)

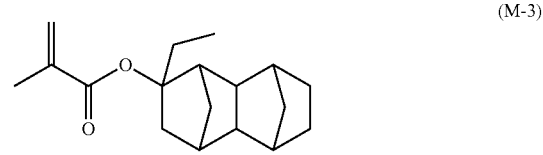

(M-3)

(M-4) 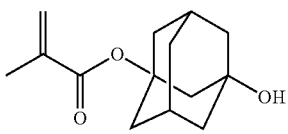

(M-5) 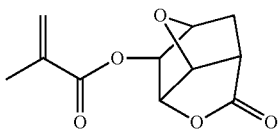

(M-6) 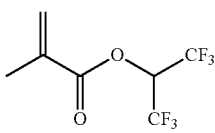

(M-7) 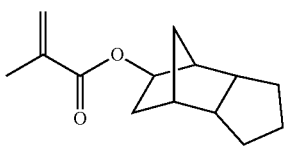

(M-8)

It is to be noted that the monomers (M-1) to (M-3) give the structural unit (II), the monomer (M-4) gives a structural unit that includes a hydroxy group, the monomers (M-5) and (M-6) give the structural unit (III), (M-7) gives the structural unit (I), (M-8) gives a structural unit that includes a nonlabile monovalent alicyclic hydrocarbon group.

Synthesis of Polymer (A)

[Synthesis Example 1-1](Synthesis of Polymer (A-1))

A monomer solution was prepared by dissolving 50 mol % of the compound (M-7) and 50 mol % the compound (M-8) in 20 g of 2-butanone, and further dissolving therein azobisisobutyronitrile as a polymerization initiator in an amount of 7 mol % with respect to the total monomers, as shown in Table 1. The total mass of the monomers used was 100 g. Next, a 500 mL three-neck flask containing 100 g of 2-butanone was heated to 80° C. with stirring under a nitrogen atmosphere, and then the prepared monomer solution was added dropwise over 3 hrs. After the completion of the dropwise addition, heating was performed for another 3 hrs at 80° C. to allow the polymerization reaction. After the completion of the polymerization reaction, the reaction solution was cooled to room temperature. After the transfer of the reaction solution to a separatory funnel, the reaction solution was homogeneously diluted with 300 g of n-hexane, and 1,200 g of methanol was charged thereinto and mix therewith. Next, 60 g of distilled water was charged, followed by further stirring, and the mixture was left to stand for 30 min. Next, the lower layer was collected, and the solvent was replaced with propylene glycol monomethyl ether acetate, whereby a propylene glycol monomethyl ether acetate solution that contained a polymer (A-1) as a solid content was obtained (yield: 75.5%). The polymer (A-1) had the Mw of 5,000 and the Mw/Mn of 1.50.

TABLE 1

| | (A) Polymer | Monomer that gives structural unit (I) type | amount (mol %) | Monomer that gives other structural unit type | amount (mol %) | polymerization initiator amount (mol %) | Yield (%) | Mw | Mw/Mn |
|---|---|---|---|---|---|---|---|---|---|
| Synthesis Example 1-1 | A-1 | M-7 | 50 | M-8 | 50 | 7 | 75.5 | 5,000 | 1.50 |

Synthesis of Polymer (B)

[Synthesis Example 1-2](Synthesis of Polymer (B-1))

A monomer solution was prepared by dissolving 50 mol % of the compound (M-2), 25 mol % of the compound (M-4) and 25 mol % of the compound (M-5) in 40 g of 2-butanone, and further dissolving therein azobisisobutyronitrile as a polymerization initiator in an amount of 3 mol % with respect to the total monomers, as shown in Table 2. The total mass of the monomers used was 100 g. Next, a 500 mL three-neck flask containing 100 g of 2-butanone was heated to 80° C. with stirring under a nitrogen atmosphere, and then the prepared monomer solution was added dropwise over 3 hrs. After the completion of the dropwise addition, heating was performed for another 3 hrs at 80° C. to allow the polymerization reaction. After the completion of the polymerization reaction, the reaction solution was cooled to room temperature, then charged into 2,000 g of methanol, and the precipitated solid was filtered off. The collected solid was washed twice with 400 g of methanol. The solid was filtered off, and then the collected solid was dried at 50° C. for 15 hrs under a reduced pressure to synthesize a polymer (B-1) (yield: 66.5%). The polymer (B-1) had the Mw of 9,100 and the Mw/Mn of 1.75.

[Synthesis Example 1-3](Synthesis of Polymer (B-2))

In 100 g of 2-butanone were dissolved 40 mol % of the compound (M-1), 10 mol % of the compound (M-3), 20 mol % of the compound (M-4), 20 mol % of the compound (M-5) and 10 mol % of the compound (M-6), as well as azobisisobutyronitrile as a polymerization initiator in an amount of 3 mol % with respect to the total monomers, as shown in Table 2. The total mass of the monomers used was 100 g. Next, a 500 mL three-neck flask containing 100 g of 2-butanone was heated to 80° C. with stirring under a nitrogen atmosphere, and then the prepared monomer solution was added dropwise over 3 hrs. After the completion of the dropwise addition, heating was performed for another 3 hrs at 80° C. to allow the polymerization reaction. After the completion of the polymerization reaction, the polymerization solution was added dropwise to 2,000 g of methanol, and the precipitated solid was filtered off. The collected solid was washed twice with 400 g of methanol. The solid was filtered off, and then dried at 50° C. for 17 hrs under a reduced pressure to obtain a polymer (B-2) as a white powder (yield: 70.5%). The polymer (B-2) had the Mw of 8,700 and the Mw/Mn of 1.78.

TABLE 2

| | (B) Polymer | Monomer that gives structural unit (II) type | amount (mol %) | Monomer that gives structural unit (III) type | amount (mol %) | Monomer that gives other structural unit type | amount (mol %) | Polymerization initiator amount (mol %) | Yield (%) | Mw | Mw/Mn |
|---|---|---|---|---|---|---|---|---|---|---|---|
| Synthesis Example 1-2 | B-1 | M-2 | 50 | M-5 | 25 | M-4 | 25 | 3 | 66.5 | 9,100 | 1.75 |
| Synthesis Example 1-3 | B-2 | M-1 M-3 | 40 10 | M-5 M-6 | 20 10 | M-4 | 20 | 3 | 70.5 | 8,700 | 1.78 |

<Preparation of Radiation-Sensitive Resin Composition>

The acid generating agent (C), the solvent (D) and the acid diffusion control agent (E) which were used in the preparation of the radiation-sensitive resin composition are shown below.

[(C) Acid Generating Agent]

C-1: a compound represented by the following formula (C-1)

C-2: a compound represented by the following formula (C-2)

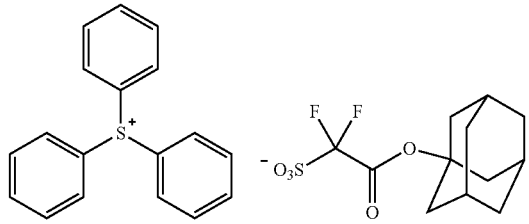

(C-1)

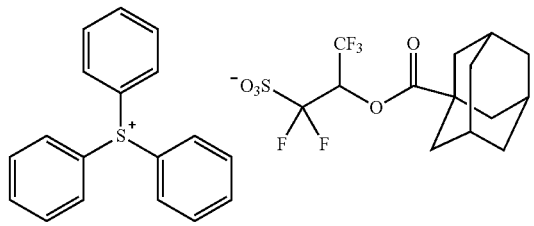

(C-2)

[(D) Solvent]

D-1: propylene glycol monomethyl ether acetate
D-2: cyclohexanone
D-3: γ-butyrolactone

[(E) Acid Diffusion Control Agent]

E-1: a compound represented by the following formula (E-1)

Synthesis Examples 1-5 to 1-7

Preparation of Radiation-Sensitive Resin Compositions (X1-2) to (X1-4)

Radiation-sensitive resin compositions (X1-2) to (X1-4) were prepared by a similar operation to that for the radiation-sensitive resin composition (X1-1) except that the type and the content of each component used were as shown in Table 3 below.

TABLE 3

| Radiation-sensitive resin composition | (A) Polymer type | (A) Polymer content (parts by mass) | (B) Polymer type | (B) Polymer content (parts by mass) | (C) Acid generating agent type | (C) Acid generating agent content (parts by mass) | (D) Solvent type | (D) Solvent content (parts by mass) | (E) Acid diffusion control agent type | (E) Acid diffusion control agent content (parts by mass) |
|---|---|---|---|---|---|---|---|---|---|---|
| Synthesis Example 1-4 | X1-1 | A-1 | 3 | B-1 | 100 | C-1 | 10 | D-1 | 2,640 | E-1 | 8.7 |
| | | | | | | | | D-2 | 1,130 | | |
| | | | | | | | | D-3 | 30 | | |
| Synthesis Example 1-5 | X1-2 | A-1 | 3 | B-2 | 100 | C-2 | 15 | D-1 | 2,610 | E-2 | 1.2 |
| | | | | | | | | D-2 | 1,120 | | |
| | | | | | | | | D-3 | 30 | | |
| Synthesis Example 1-6 | X1-3 | — | — | B-1 | 100 | C-1 | 10 | D-1 | 2,640 | E-1 | 8.7 |
| | | | | | | | | D-2 | 1,130 | | |
| | | | | | | | | D-3 | 30 | | |
| Synthesis Example 1-7 | X1-4 | — | — | B-2 | 100 | C-2 | 15 | D-1 | 2,610 | E-2 | 1.2 |
| | | | | | | | | D-2 | 1,120 | | |
| | | | | | | | | D-3 | 30 | | |

E-2: a compound represented by the following formula (E-2)

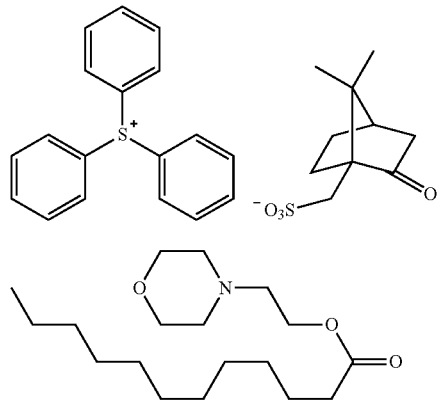

Preparation of Radiation-Sensitive Resin Composition (X1)

[Synthesis Example 1-4](Preparation of Radiation-Sensitive Resin Composition (X1-1))

A radiation-sensitive resin composition (X1-1) was prepared by mixing 3 parts by mass of (A-1) as the polymer (A), 100 parts by mass of (B-1) as the polymer (B), 10 parts by mass of (C-1) as the acid generating agent (C), 8.7 parts by mass of (E-1) as the acid diffusion control agent (E) and 2,640 parts by mass of (D-1), 1,130 parts by mass of (D-2) and 30 parts by mass of (D-3) as the solvent (D), as shown in Table 3 below, and filtering the resulting mixture through a membrane filter having a pore size of 0.2 μm.

<Synthesis of Polymer Component (J) for Composition for Upper Layer Film Formation>

Monomers used in the synthesis of the polymer component (J) are shown below.

(M-9)

(M-10)

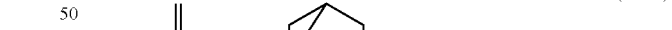
(M-11)

(M-12)

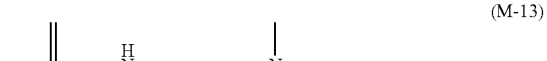
(M-13)

-continued

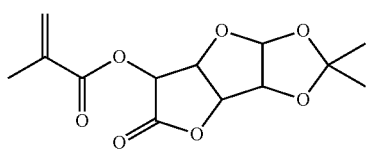
(M-14)

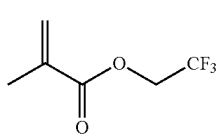
(M-15)

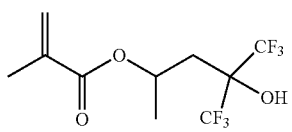
(M-16)

It is to be noted that the monomers (M-9) to (M-11) give the structural unit (IV), the monomers (M-12) and (M-13) give the structural unit (VI), (M-14) gives the structural unit (IX), and the monomers (M-15) and (M-16) give the structural unit (V).

[Synthesis Example 1-8] (Synthesis of Polymer Component (J-1))

In 200 g of 2-butanone were dissolved 25 mol % of the compound (M-9) and 75 mol % of the compound (M-10), as shown in Table 4 below. The total mass of the monomers used was 100 g. Next, 4.11 g (5 mol % with respect to the total monomers) of 2,2'-azobis(methyl 2-methylpropionate) as a radical polymerization initiator was added to prepare a monomer solution. A 1,000 mL three-neck flask containing 100 g of 2-butanone was purged with nitrogen for 30 min, then heated to 80° C. while the contents inside the flask were stirred with a magnetic stirrer, and the prepared monomer solution was added dropwise over 3 hrs using a dropping funnel. The time of the start of the dropwise addition was regarded as the time of the start of the polymerization reaction, and the polymerization reaction was allowed to proceed for 6 hrs. After the completion of the polymerization reaction, the polymerization reaction mixture was water-cooled to 30° C. or below. The cooled polymerization reaction mixture was charged into 2,000 g of methanol, and the precipitated white powder was filtered off. The collected white powder was washed twice with 400 g of methanol and filtered off, followed by drying at 60° C. for 17 hrs to obtain a polymer (J-1) as a white powder (yield: 77.0%). The polymer (J-1) thus obtained had the Mw of 9,200 and the Mw/Mn of 1.60.

Synthesis Examples 1-9 to 1-12

Syntheses of Polymer Components (J-2) to (J-5)

Polymer components (J-2) to (J-5) were each synthesized in a similar manner to Synthesis Example 1-8 except that the type and the amount of the monomer used were as shown in Table 4 below. The total mass of the monomers used was 100 g. It is to be noted that "-" in Table 4 indicates that the corresponding component was not used. Values of the yield, the Mw and the Mw/Mn of the polymers thus obtained are shown together in Table 4.

Synthesis Example 1-13

In 200 g of 2-butanone were dissolved 50 mol % of the compound (M-15) and 50% of the compound (M-16), as shown in Table 4 below. The total mass of the monomers used was 100 g. Next, 2.99 g (3 mol % with respect to the total monomer) of 2,2'-azobis-(methyl 2-methylpropionate) as a radical polymerization initiator was added to prepare a monomer solution. A 1,000 mL three-neck flask containing 100 g of 2-butanone was purged with nitrogen for 30 min, then heated to 80° C. while the contents inside the flask were stirred with a magnetic stirrer, and the prepared monomer solution was added dropwise over 3 hrs using a dropping funnel. The time of the start of the dropwise addition was regarded as the time of the start of the polymerization reaction, and the polymerization reaction was allowed to proceed for 6 hrs. Next, the resulting polymerization reaction mixture was transferred to a separatory funnel, and 56 g of methanol and 240 g of heptane were charged into this separatory funnel to perform purification by liquid separation. After the separation, the lower layer liquid was collected. The collected lower layer liquid was replaced with 4-methyl-2-pentanol to obtain a liquid containing a polymer component (J-6). From the mass of the residue obtained after 0.5 g of the liquid containing the polymer component (J-6) was placed on an aluminum pan and heated on a hot plate at 155° C. for 30 min, the solid content concentration of the liquid containing the polymer (J-6) was calculated, and the value of the solid content concentration was used to subsequently prepare the composition for upper layer film formation and to calculate a yield. The yield of the polymer (J-6) thus obtained was 71.2%, and the polymer (J-6) had the Mw of 11,000 and the Mw/Mn of 1.65.

Synthesis Example 1-14

A polymer component (J-7) was synthesized in a similar manner to Synthesis Example 1-13 except that the type and the amount of the monomer used were as shown in Table 4. The total mass of the monomers used was 100 g. It is to be noted that "-" in Table 4 indicates that the corresponding component was not used. Values of the yield, the Mw and the Mw/Mn of the polymer thus obtained are shown together in Table 4.

TABLE 4

| | (J) | Monomer that gives structural unit (IV) | | Monomer that gives structural unit (V) | | Monomer that gives structural unit (VI) or (IX) | | Polymerization | | | |
|---|---|---|---|---|---|---|---|---|---|---|---|
| | Polymer component | type | amount (mol %) | type | amount (mol %) | type | amount (mol %) | initiator amount (mol %) | Yield (%) | Mw | Mw/Mn |
| Synthesis Example 1-8 | J-1 | M-9<br>M-10 | 25<br>75 | — | — | — | — | 5 | 77.0 | 9,200 | 1.60 |

TABLE 4-continued

| (J) Polymer component | Monomer that gives structural unit (IV) type | amount (mol %) | Monomer that gives structural unit (V) type | amount (mol %) | Monomer that gives structural unit (VI) or (IX) type | amount (mol %) | Polymerization initiator amount (mol %) | Yield (%) | Mw | Mw/Mn |
|---|---|---|---|---|---|---|---|---|---|---|
| Synthesis Example 1-9 | J-2 | M-10 | 95 | — | — | M-12 | 5 | 2 | 69.0 | 14,400 | 2.19 |
| Synthesis Example 1-10 | J-3 | M-9 M-11 | 20 80 | — | — | — | — | 5 | 85.5 | 8,800 | 1.75 |
| Synthesis Example 1-11 | J-4 | M-9 M-11 | 10 80 | — | — | M-13 | 10 | 2 | 74.5 | 13,500 | 2.33 |
| Synthesis Example 1-12 | J-5 | M-11 | 50 | — | — | M-14 | 50 | 7 | 65.0 | 6,500 | 1.65 |
| Synthesis Example 1-13 | J-6 | — | — | M-15 M-16 | 50 50 | — | — | 3 | 71.2 | 11,000 | 1.65 |
| Synthesis Example 1-14 | J-7 | — | — | M-16 | 100 | — | — | 3 | 63.2 | 10,200 | 1.70 |

<Preparation of Composition for Upper Layer Film Formation>

The acid diffusion inhibiting compound (K) and the solvent (P) which were used in the preparation of the composition for upper layer film formation are shown below.

[(K) Acid Diffusion Inhibiting Compound]

K-1: a compound represented by the following formula (K-1)

K-2: a compound represented by the following formula (K-2)

K-3: a compound represented by the following formula (K-3)

K-4: a compound represented by the following formula (K-4)

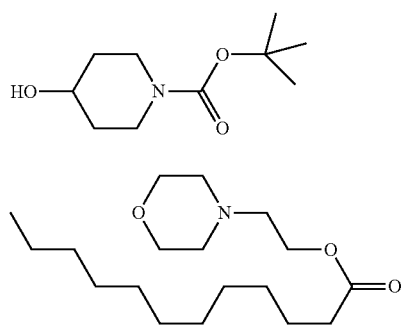
(K-1)

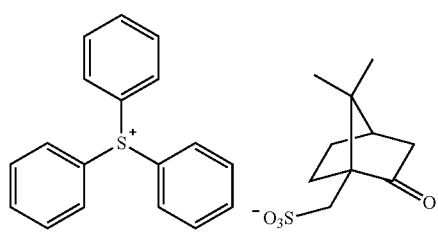
(K-2)

(K-3)

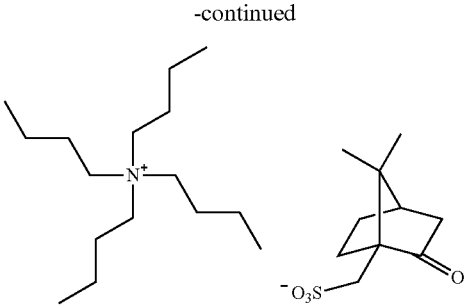
(K-4)

[(P) Solvent]
P-1: 4-methyl-2-pentanol
P-2: 2-heptanol
P-3: diisoamyl ether
P-4: n-decane
P-5: γ-butyrolactone Preparation of Composition for Upper Layer Film Formation (Y1)

[Synthesis Example 1-15](Preparation of Composition for Upper Layer Film Formation (Y1-1))

A composition for upper layer film formation (Y1-1) was prepared by mixing a liquid containing 95 parts by mass of the polymer (J-1) and 5 parts by mass of the polymer (J-6) as the polymer component (J), and 11,350 parts by mass of (P-1) and 2,840 parts by mass of (P-3) as the solvent (P), and filtering the resulting mixture through a membrane filter of 0.2 μm.

Synthesis Example 1-16 to 1-27

Preparation of Compositions for Upper Layer Film Formation (Y1-2) to (Y1-13)

Compositions for upper layer film formation (Y1-2) to (Y1-13) were prepared in a similar manner to Synthesis Example 1-15 except that the type and the content of each component used were as shown in Table 5 below. The values of the mass percentage contents of fluorine atom (% by mass) of the polymer components (J) of the compositions for upper layer film formation thus prepared are shown together in Table 5.

TABLE 5

| Composition for upper layer film formation | (J) Polymer component type | content (parts by mass) | type | content (parts by mass) | (K) Basic compound type | content (parts by mass) | (P) Solvent type | content (parts by mass) | Mass percentage content of fluorine atom (% by mass) |
|---|---|---|---|---|---|---|---|---|---|
| Synthesis Example1-15 | Y1-1 | J-1 | 95 | J-6 | 5 | K-1 | 5 | P-1/P-3 | 11,350/2,840 | 5 |
| Synthesis Example1-16 | Y1-2 | J-1 | 95 | J-6 | 5 | K-2 | 5 | P-2/P-3 | 11,350/2,840 | 5 |
| Synthesis Example1-17 | Y1-3 | J-1 | 95 | J-6 | 5 | K-3 | 2 | P-1/P-3/P-5 | 7,090/7,090/100 | 5 |
| Synthesis Example1-18 | Y1-4 | J-1 | 95 | J-6 | 5 | K-4 | 5 | P-1/P-3/P-5 | 7,090/7,090/100 | 5 |
| Synthesis Example1-19 | Y1-5 | J-2 | 100 | — | — | — | — | P-1/P-3 | 11,350/2,840 | 0 |
| Synthesis Example1-20 | Y1-6 | J-2 | 90 | J-7 | 10 | K-1 | 10 | P-1/P-3 | 11,350/2,840 | 10 |
| Synthesis Example1-21 | Y1-7 | J-3 | 100 | — | — | — | — | P-1/P-5 | 14,000/100 | 0 |
| Synthesis Example1-22 | Y1-8 | J-3 | 90 | J-7 | 10 | K-2 | 5 | P-1/P-5 | 14,000/100 | 10 |
| Synthesis Example1-23 | Y1-9 | J-3 | 80 | J-7 | 20 | K-2 | 5 | P-1/P-5 | 14,000/100 | 20 |
| Synthesis Example1-24 | Y1-10 | J-4 | 85 | J-6 | 15 | K-4 | 10 | P-2/P-4 | 1,410/5,630 | 15 |
| Synthesis Example1-25 | Y1-11 | J-4 | 70 | J-6 | 30 | K-4 | 10 | P-2/P-4 | 1,410/5,630 | 30 |
| Synthesis Example1-26 | Y1-12 | J-5 | 90 | J-7 | 10 | K-3 | 5 | P-2/P-3/P-5 | 1,410/5,630/100 | 10 |
| Synthesis Example1-27 | Y1-13 | J-5 | 75 | J-7 | 25 | K-1 | 1 | P-2/P-3/P-5 | 1,410/5,630/100 | 25 |

Evaluations

Experimental Examples 1-1 to 1-20

As shown in Table 6 below, various evaluations shown below were made on various combinations of the radiation-sensitive resin compositions (X1-1) to (X1-4) and the compositions for upper layer film formation (Y1-1) to (Y1-13) which were prepared as described above. It is to be noted that "-" in Table 6 indicates that the composition for upper layer film formation was not used. The results of the evaluations are shown in Table 6 below.

[Receding Contact Angle]

A value of a receding contact angle of water on the surface of the upper layer film was measured. A resist film having a film thickness of 90 nm was formed on an 8-inch silicon wafer by applying a radiation-sensitive resin composition on the 8-inch silicon wafer, followed by PB (90° C., 60 sec) and then cooling at 23° C. for 30 sec. Next, a composition for upper layer film formation was spin-coated, followed by PB on a hot plate at 90° C. for 60 sec, whereby an upper layer film having a film thickness of 30 nm was formed. Thereafter, a receding contact angle was measured quickly with a contact angle meter ("DSA-10" available from KRUS) in an environment of room temperature of 23° C., a humidity of 45%, and an ordinary pressure according to the following procedure. First, the position of a wafer stage of the contact angle meter was adjusted, and the wafer was placed on the adjusted stage. Next, water was injected into a needle, and the position of the needle was fine-tuned to an initial position which allowed a water bead to be formed on the wafer placed as described above. Thereafter, water was discharged from the needle to form a 25 μL water bead on the wafer, then the needle was once retracted from the water bead, and the needle was lowered again to the initial position so as to position a tip of the needle in the water bead. Then, the water bead was suctioned for 90 sec with the needle at a rate of 10 μL/min, during which a contact angle was concurrently measured once per second, 90 times in total. Of the measurement values, contact angle measurements acquired for 20 sec after the time point when the measurement of the contact angle became stable were averaged to obtain a reading of the receding contact angle (unit: degree))(°. The receding contact angle was evaluated to be: "A" (favorable) in the case of the receding contact angle)(° being no less than 70°; and "B" (unfavorable) in the case of the receding contact angle)(° being less than 70°.

[DOF (Depth of Focus)]

An underlayer antireflective film having a film thickness of 105 nm was formed on a 12-inch silicon wafer by applying an underlayer antireflective film ("ARC66" available from Nissan Chemical Industries, Ltd.) on the 12-inch silicon wafer using a spin coater ("CLEAN TRACK Lithius Pro-i" available from Tokyo Electron Limited), followed by baking at 205° C. for 60 sec. Next, a radiation-sensitive resin composition was applied using the spin coater, followed by PB (90° C., 60 sec) and then cooling at 23° C. for 30 sec to form a resist film having a film thickness of 90 nm Next, a composition for upper layer film formation was applied using the spin coater, followed by PB (90° C., 60 sec) and then cooling at 23° C. for 30 sec to form an upper layer film having a film thickness of 30 nm Next, an exposure was performed using an ArF Immersion Scanner ("S610C" available from NIKON Corporation), through a mask for formation of a pattern of 45 nm hole/800 nm pitch under optical conditions of NA of 1.30 and Crosspole. Next, PEB was performed on a hot plate of the "Lithius Pro-i" mentioned above at 90° C. for 60 sec, followed by cooling at 23° C. for 30 sec, and then a puddle development was performed for 30 sec using butyl acetate as a developer solution.

Next, rinsing was performed with 4-methyl-2-pentanol for 7 sec followed by spin-drying at 2,000 rpm for 15 sec, whereby a resist pattern of 45 nm hole/800 nm pitch was formed. In this procedure, an exposure dose at which a hole of 45 nm was formed was defined as optimum exposure dose (Eop). Then, the hole pattern size of the resist pattern thus obtained was measured using a scanning electron microscope ("CG4000" available from Hitachi High-Technologies Corporation). A focus amplitude when the size of the hole pattern formed fell within the range of ±10% of 45 nm was measured, and the measurement value was defined as DOF (nm) A greater DOF value indicates a smaller change in patterning performance due to a change in focus, suggesting a favorable result.

[CDU]

An underlayer antireflective film having a film thickness of 105 nm was formed on a 12-inch silicon wafer by applying an underlayer antireflective film ("ARC66" available from Nissan Chemical Industries, Ltd.) on the 12-inch silicon wafer using a spin coater ("CLEAN TRACK Lithius Pro-i" available from Tokyo Electron Limited), followed by baking at 205° C. for 60 sec. Next, a radiation-sensitive resin composition was applied using the spin coater, followed by PB (90° C., 60 sec) and then cooling at 23° C. for 30 sec to form a resist film having a film thickness of 90 nm Next, a composition for upper layer film formation was applied using the spin coater, followed by PB (90° C., 60 sec) and then cooling at 23° C. for 30 sec to form an upper layer film having a film thickness of 30 nm Next, an exposure was performed using an ArF Immersion Scanner ("S610C" available from NIKON Corporation), through a mask for formation of a pattern of 45 nm hole/90 nm pitch under optical conditions of NA of 1.30 and Crosspole. Next, PEB was performed on a hot plate of the "Lithius Pro-i" mentioned above at 90° C. for 60 sec, followed by cooling at 23° C. for 30 sec, and then a puddle development was performed for 30 sec using butyl acetate as a developer solution. Next, rinsing was performed with 4-methyl-2-pentanol for 7 sec followed by spin-drying at 2,000 rpm for 15 sec, whereby a resist pattern of 45 nm hole/90 nm pitch was formed. Then, the hole pattern size of the resist pattern thus obtained was measured using a scanning electron microscope ("CG4000" available from Hitachi High-Technologies Corporation). A variation (3σ) of the hole diameter was determined for 1,800 hole patterns formed, and the value of the variation (3σ) was defined as CDU (nm) The CDU was evaluated to be: "A" (favorable) in the case of the CDU (nm) being no greater than 6.5 nm; and "B" (unfavorable) in the case of the CDU (nm) being greater than 6.5 nm

[LWR]

An underlayer antireflective film having a film thickness of 105 nm was formed on a 12-inch silicon wafer by applying an underlayer antireflective film ("ARC66" available from Nissan Chemical Industries, Ltd.) on the 12-inch silicon wafer using a spin coater ("CLEAN TRACK Lithius Proi" available from Tokyo Electron Limited), followed by baking at 205° C. for 60 sec. Next, a radiation-sensitive resin composition was applied using the spin coater, followed by PB (90° C., 60 sec) and then cooling at 23° C. for 30 sec to form a resist film having a film thickness of 90 nm Next, a composition for upper layer film formation was applied using the spin coater, followed by PB (90° C., 60 sec) and then cooling at 23° C. for 30 sec to form an upper layer film having a film thickness of 30 nm Next, an exposure was performed using an ArF Immersion Scanner ("S610C" available from NIKON Corporation), through a mask for formation of a pattern of 45 nm space/100 nm pitch under optical conditions of NA of 1.30 and Crosspole. Next, PEB was performed on a hot plate of the "Lithius Pro-i" mentioned above at 90° C. for 60 sec, followed by cooling at 23° C. for 30 sec, and then a puddle development was performed for 30 sec using butyl acetate as a developer solution. Next, rinsing was performed with 4-methyl-2-pentanol for 7 sec followed by spin-drying at 2,000 rpm for 15 sec, whereby a resist pattern of 45 nm space/100 nm pitch was formed. The space width of the resist pattern thus obtained was measured using a scanning electron microscope ("CG4000" available from Hitachi High-Technologies Corporation). A variation (3σ) of the space width was determined for 20 space patterns formed, and the value of the variation (3σ) was defined as LWR (nm) The LWR was evaluated to be: "A" (favorable) in the case of the LWR (nm) being no greater than 5.5 nm; and "B" (unfavorable) in the case of the LWR (nm) being greater than 5.5 nm.

[Bridge Defects-Inhibiting Property and Break Defects-Inhibiting Property]

The number of bridge defects and break defects generated on a resist pattern obtained after the exposure and development of a resist film having an upper layer film formed thereon was evaluated. An underlayer antireflective film having an average thickness of 105 nm was formed on the surface of a 12-inch silicon wafer by spin-coating a composition for underlayer antireflective film formation ("ARC66" available from Nissan Chemical Industries, Ltd.) using a coater/developer ("Lithius Pro-i" available from Tokyo Electron Limited), followed by PB. Next, a radiation-sensitive resin composition (a) was spin-coated using the coater/developer, followed by PB at 90° C. for 60 sec and then cooling at 23° C. for 30 sec to form a resist film having an average thickness of 90 nm Thereafter, a composition for upper layer film formation was applied on the resist film, followed by PB at 90° C. for 60 sec, whereby an upper layer film having an average thickness of 30 nm was formed.

Next, an exposure was performed using an ArF Immersion Scanner ("S610C" available from NIKON) through a mask for formation of a pattern of 45 nm line/90 nm pitch under optical conditions of NA of 1.30 and Dipole. Next, PEB was performed on a hot plate of the coater/developer at 90° C. for 60 sec, followed by cooling at 23° C. for 30 sec, and then a puddle development was performed for 30 sec using butyl acetate as a developer solution. Then, spin-drying was performed at 2,000 rpm for 15 sec, whereby a substrate having a resist pattern formed thereon was obtained. The obtained substrate having a resist pattern formed thereon was inspected for defects using a defect inspection apparatus ("KLA2810" available from KLA-Tencor), and observed using a scanning electron microscope ("RS6000" available from Hitachi High-Technologies Corporation), and bridge defects and break defects were measured. The bridge defects-inhibiting property and the break defects-inhibiting property were each evaluated to be: "A" (favorable) in the case of the number of defects per wafer being less than 100; and "B" (unfavorable) in the case of the number of defects per wafer being no less than 100.

TABLE 6

| Radiation-sensitive resin composition | Composition for upper layer film formation | Receding contact angle (°) | DOF (nm) | CDU (nm) | LWR (nm) | bridge defects-inhibiting property (defects/wafer) | break defects-inhibiting property (defects/wafer) |
|---|---|---|---|---|---|---|---|
| Experimental Example1-1 | X1-1 | Y1-1 | 75.5 | 50 | 5.7 | 4.5 | 33 | 40 |
| Experimental Example1-2 | X1-1 | Y1-2 | 75.7 | 55 | 5.7 | 4.5 | 30 | 43 |
| Experimental Example1-3 | X1-1 | Y1-3 | 75.2 | 50 | 5.9 | 4.8 | 28 | 38 |
| Experimental Example1-4 | X1-1 | Y1-4 | 75.4 | 50 | 5.9 | 4.8 | 34 | 39 |
| Experimental Example1-5 | X1-1 | Y1-5 | 71.3 | 50 | 5.6 | 4.4 | 25 | 30 |
| Experimental Example1-6 | X1-1 | Y1-6 | 73.7 | 55 | 5.7 | 4.5 | 30 | 20 |
| Experimental Example1-7 | X1-2 | Y1-7 | 76.7 | 55 | 5.4 | 4.1 | 10 | 5 |
| Experimental Example1-8 | X1-2 | Y1-8 | 78.2 | 60 | 5.4 | 4.1 | 15 | 8 |
| Experimental Example1-9 | X1-2 | Y1-9 | 80.4 | 60 | 5.4 | 4.1 | 25 | 15 |
| Experimental Example1-10 | X1-1 | Y1-10 | 77.4 | 55 | 5.9 | 4.8 | 18 | 11 |
| Experimental Example1-11 | X1-1 | Y1-11 | 79.2 | 55 | 5.9 | 4.8 | 35 | 20 |
| Experimental Example1-12 | X1-2 | Y1-12 | 70.2 | 55 | 6.3 | 5.3 | 40 | 8 |
| Experimental Example1-13 | X1-2 | Y1-13 | 71.4 | 50 | 6.1 | 5.2 | 50 | 10 |
| Experimental Example1-14 | X1-1 | — | 72.3 | 40 | 5.7 | 4.5 | 350 | 230 |
| Experimental Example1-15 | X1-3 | Y1-1 | 73.4 | 50 | 5.7 | 4.5 | 150 | 210 |
| Experimental Example1-16 | X1-3 | Y1-6 | 71.4 | 55 | 5.7 | 4.5 | 180 | 250 |
| Experimental Example1-17 | X1-3 | Y1-10 | 74.5 | 55 | 5.9 | 4.7 | 165 | 200 |
| Experimental Example1-18 | X1-2 | — | 75.5 | 45 | 5.4 | 4.1 | 300 | 200 |
| Experimental Example1-19 | X1-4 | Y1-7 | 73.2 | 55 | 5.4 | 4.1 | 140 | 180 |
| Experimental Example1-20 | X1-4 | Y1-13 | 67.7 | 50 | 6.0 | 5.1 | 220 | 150 |

From the results shown in Table 6, it was found that when the negative resist pattern-forming method according to the embodiment of the present invention was employed, favorable lithography characteristics such as DOF, CDU and LWR performances were exhibited while a favorable receding contact angle on the surface of the upper layer film was maintained, and in particular, that a resist pattern that was superior in the bridge defects-inhibiting property and the break defects-inhibiting property could be formed. In particular, in Experimental Example 1-7, even though the composition for upper layer film formation did not contain any fluorine atom, the composition for upper layer film formation gave favorable results in terms of the receding contact angle, DOF, CDU, LWR and the like when used in combination with the resist film formed from the radiation-sensitive resin composition containing a fluorine atom, and a superior development defects-inhibiting property was exhibited. Moreover, in Experimental Example 1-4, even though the composition for upper layer film formation had a low mass percentage content of fluorine atom, a favorable receding contact angle was attained. Therefore, it was found that according to the negative resist pattern-forming method, even when the content of the fluorine atom causing the bridge defects in the upper layer film was reduced, favorable water repellency required for the liquid immersion lithography could be maintained.

Example (II)

Synthesis of Polymer Component (L)

Monomers used in the synthesis of the polymer component (L) are shown below.

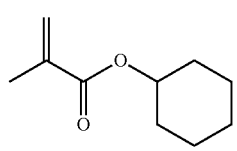

(M'-1)

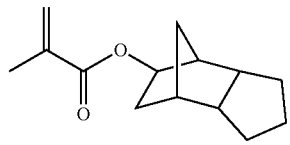

(M'-2)

-continued (M'-3) 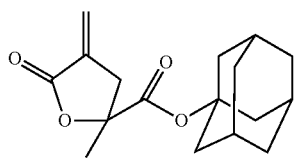

(M'-4) 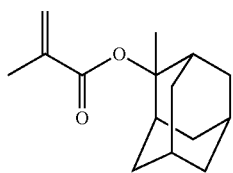

(M'-5) 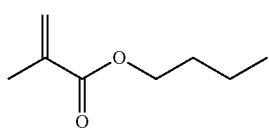

(M'-6) 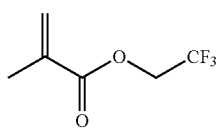

(M'-7) 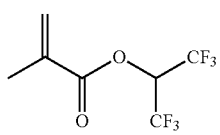

(M'-8) 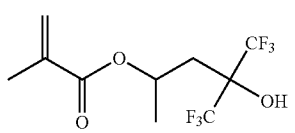

(M'-9) 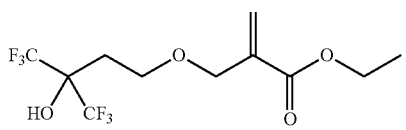

(M'-10) 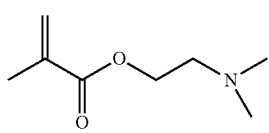

(M'-11) 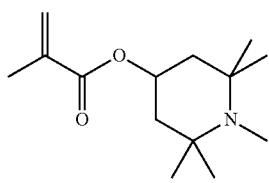

(M'-12) 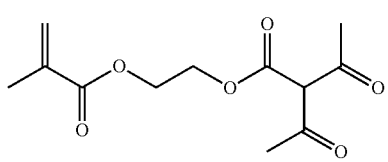

-continued (M'-13) 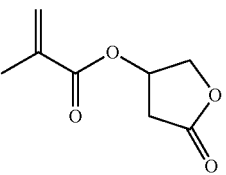

It is to be noted that the monomers (M'-1) to (M'-4) give the structural unit (I), the monomers (M'-5) to (M'-9) give the structural unit (II), the monomers (M'-10) and (M'-11) give the structural unit (V), the monomer (M'-12) gives the structural unit (IV), and the monomer (M'-13) gives the structural unit (VI).

Synthesis Example 2-1

A monomer solution was prepared by dissolving 100 g of the monomer (M'-1) in 200 g of 2-butanone and adding thereto 4.11 g (3 mol % with respect to the total monomer) of 2,2'-azobis(methyl 2-methylpropionate) as a radical polymerization initiator, as shown in Table 7. A 1,000 mL three-neck flask containing 100 g of 2-butanone was purged with nitrogen for 30 min, then heated to 80° C. while the contents inside the flask were stirred with a magnetic stirrer, and the prepared monomer solution was added dropwise over 3 hrs using a dropping funnel. The time of the start of the dropwise addition was regarded as the time of the start of the polymerization reaction, and the polymerization reaction was allowed to proceed for 6 hrs. After the completion of the polymerization reaction, the polymerization reaction mixture was water-cooled to 30° C. or below. The cooled polymerization reaction mixture was charged into 2,000 g of methanol, and the precipitated white powder was filtered off. The collected white powder was washed twice with 400 g of methanol and filtered off, followed by drying at 60° C. for 17 hrs to obtain a polymer (a-1) as a white powder (amount: 79.9 g; yield: 79.9%). The polymer (a-1) thus obtained had the Mw of 12,000 and the Mw/Mn of 1.76.

Synthesis Examples 2-2 to 2-9

Polymers (a-2) to (a-9) were synthesized in a similar manner to Synthesis Example 2-1 except that the type and the amount of the monomer used were as shown in Table 7. The total mass of the monomers used was 100 g. It is to be note that "-" in Table 7 indicates that the corresponding component was not used. Values of the proportions of the structural units, the yield, the Mw and the Mw/Mn of the polymer thus obtained are shown together in Table 1.

Synthesis Example 2-10

A monomer solution was prepared by dissolving 36.4 g of the monomer (M'-6) and 63.6 g of the monomer (M'-8) in 200 g of 2-butanone, adding thereto 2.99 g (3 mol % with respect to the total monomer) 2,2'-azobis-(methyl 2-methylpropionate) as a radical polymerization initiator. A 1,000 mL three-neck flask containing 100 g of 2-butanone was purged with nitrogen for 30 min, then heated to 80° C. while the contents inside the flask were stirred with a magnetic stirrer, and the prepared monomer solution was added dropwise over 3 hrs using a dropping funnel. The time of the start of the dropwise addition was regarded as the time of the start of the polymerization reaction, and the polymerization reaction was allowed to proceed for 6 hrs. Then, the resulting polymerization reaction mixture was transferred to a separatory funnel, and 56 g of methanol and 240 g of heptane were charged into this separatory funnel to perform purification by liquid separation. After the separation, the lower layer liquid was collected. The collected lower layer liquid was replaced with 4-methyl-2-pentanol to obtain a liquid containing a polymer (b-1). From the mass of the residue obtained after 0.5 g of the liquid containing the polymer (b-1) was placed on an aluminum pan and heated on a hot plate at 155° C. for 30 min, the solid content concentration of the liquid containing the polymer (b-1) was calculated, and the value of the solid content concentration was used to subsequently prepare the composition for upper layer film formation and to calculate a yield.

Synthesis Examples 2-11 to 2-14

Polymers (b-2), (c-1), (c-2) and (d-1) were each synthesized in a similar manner to Synthesis Example 2-10 except that the type and the amount of the monomer used were as shown in Table 7. The total mass of the monomers used was 100 g. It is to be noted that "-" in Table 1 indicates that the corresponding component was not used. Values of the proportion of the structural units, the yield, the Mw and the Mw/Mn of the polymer thus obtained are shown together in Table 7.

TABLE 7

|  | (L) Polymer component | Monomer that gives structural unit (A) | | Monomer that gives structural unit (B) | | Monomer that gives other structural unit | | Polymerization initiator amount (mol %) | Yield (%) | Mw | Mw/Mn |
|---|---|---|---|---|---|---|---|---|---|---|---|
|  |  | type | amount (mol %) / proportion of structural unit (mol %) | type | amount (mol %) / proportion of structural unit (mol %) | type | amount (mol %) / proportion of structural unit (mol %) |  |  |  |  |
| Synthesis Example2-1 | a-1 | M'-1 | 100 / 100 | — | — / — | — | — / — | 3 | 79.9 | 12,000 | 1.76 |
| Synthesis Example2-2 | a-2 | M'-1 / M'-3 | 70 / 72, 30 / 28 | — | — / — | — | — / — | 3 | 70.2 | 10,800 | 1.92 |
| Synthesis Example2-3 | a-3 | M'-2 | 100 / 100 | — | — / — | — | — / — | 3 | 93.8 | 15,000 | 2.11 |
| Synthesis Example2-4 | a-4 | M'-2 / M'-3 | 70 / 72, 30 / 28 | — | — / — | — | — / — | 3 | 81.3 | 12,900 | 2.41 |
| Synthesis Example2-5 | a-5 | M'-1 / M'-2 / M'-4 | 40 / 39, 40 / 41, 20 / 20 | — | — / — | — | — / — | 3 | 88.8 | 14,500 | 1.98 |
| Synthesis Example2-6 | a-6 | M'-1 / M'-3 | 50 / 53, 30 / 27 | — | — / — | M'-10 | 20 / 20 | 3 | 82.5 | 11,700 | 2.52 |
| Synthesis Example2-7 | a-7 | M'-1 / M'-3 | 50 / 54, 30 / 26 | — | — / — | M'-11 | 20 / 20 | 3 | 81.9 | 12,200 | 2.65 |
| Synthesis Example2-8 | a-8 | M'-2 | 90 / 89 | — | — / — | M'-12 | 10 / 11 | 3 | 91.2 | 14,300 | 2.23 |
| Synthesis Example2-9 | a-9 | M'-2 | 90 / 90 | — | — / — | M'-13 | 10 / 10 | 3 | 90.9 | 13,900 | 1.95 |
| Synthesis Example2-10 | b-1 | — | — / — | M'-8 | 50 / 47 | — | — / — | 3 | 71.2 | 11,000 | 1.65 |
| Synthesis Example2-11 | b-2 | — | — / — | M'-7 / M'-9 | 50 / 55, 50 / 45 | — | — / — | 3 | 65.3 | 10,200 | 1.55 |
| Synthesis Example2-12 | c-1 | M'-2 | 70 / 71 | M'-6 / M'-9 | 15 / 17, 15 / 12 | — | — / — | 3 | 82.1 | 12,300 | 1.83 |
| Synthesis Example2-13 | c-2 | M'-2 | 35 / 36 | M'-7 / M'-9 | 40 / 43, 25 / 21 | — | — / — | 3 | 81.9 | 11,800 | 1.87 |
| Synthesis Example2-14 | d-1 | — | — / — | — | — / — | M'-5 | 100 / 100 | 3 | 90.2 | 13,200 | 1.95 |

<Preparation of Composition for Upper Layer Film Formation>

The solvents (P) used in the preparation of the composition for upper layer film formation are shown below.

[(P) Solvent]
P'-1: 4-methyl-2-pentanol
P'-2: 2-heptanol
P'-3: diisoamyl ether
P'-4: n-decane Experimental Example 2-1

Preparation of Composition for Upper Layer Film Formation (Y2-1)

A composition for upper layer film formation (Y2-1) was prepared by mixing a liquid containing 70 parts by mass of the polymer (a-1) and 30 parts by mass of polymer (b-1) as the polymer component (L), and 1,410 parts by mass of (P'-1) and 5,630 parts by mass of (P'B-3) as the solvent (P), and filtering the resulting mixture through a membrane filter of 0.2 μm. The mass percentage content of fluorine atom in the polymer component (L) was 13.7% by mass.

Experimental Examples 2-2 to 2-21

Preparation of Compositions for Upper Layer Film Formation (Y2-2) to (Y2-21)

Compositions for upper layer film formation (Y2-2) to (Y2-21) were prepared in a similar manner to Experimental Example 2-1 except that the type and the content of each component used were as shown in Table 8. Values of the mass percentage contents of fluorine atom (% by mass) in the polymer component (L) of the composition for upper layer film formation are shown together in Table 8.

TABLE 8

| | Composition for upper layer film formation | (L) Polymer component | | | | (P) Solvent | | Mass percentage content of fluorine atom (% by mass) |
|---|---|---|---|---|---|---|---|---|
| | | type | content (parts by mass) | type | content (parts by mass) | type | content (parts by mass) | |
| Experimental Example 2-1 | Y2-1 | a-1 | 70 | b-1 | 30 | P'-1/P'-3 | 1,410/5,630 | 13.7 |
| Experimental Example 2-2 | Y2-2 | a-2 | 70 | b-2 | 30 | P'-2/P'-3 | 1,410/5,631 | 15.0 |
| Experimental Example 2-3 | Y2-3 | a-3 | 95 | b-2 | 5 | P'-1/P'-3 | 1,410/5,632 | 2.6 |
| Experimental Example 2-4 | Y2-4 | a-3 | 90 | b-2 | 10 | P'-1/P'-3 | 1,410/5,633 | 5.0 |
| Experimental Example 2-5 | Y2-5 | a-3 | 85 | b-2 | 15 | P'-1/P'-3 | 1,410/5,634 | 7.5 |
| Experimental Example 2-6 | Y2-6 | a-3 | 70 | b-2 | 30 | P'-1/P'-3 | 1,410/5,635 | 14.4 |
| Experimental Example 2-7 | Y2-7 | a-3 | 50 | b-2 | 50 | P'-1/P'-3 | 1,410/5,636 | 22.8 |
| Experimental Example 2-8 | Y2-8 | a-4 | 85 | b-1 | 15 | P'-2/P'-4 | 1,410/5,637 | 5.3 |
| Experimental Example 2-9 | Y2-9 | a-5 | 70 | b-1 | 30 | P'-2/P'-4 | 1,410/5,638 | 12.1 |
| Experimental Example 2-10 | Y2-10 | a-6 | 70 | b-1 | 30 | P'-2/P'-4 | 1,410/5,639 | 12.1 |
| Experimental Example 2-11 | Y2-11 | a-7 | 70 | b-1 | 30 | P'-2/P'-4 | 1,410/5,640 | 11.5 |
| Experimental Example 2-12 | Y2-12 | a-8 | 70 | b-2 | 30 | P'-2/P'-4 | 1,410/5,641 | 14.5 |
| Experimental Example 2-13 | Y2-13 | a-9 | 70 | b-2 | 30 | P'-2/P'-4 | 1,410/5,642 | 14.6 |
| Experimental Example 2-14 | Y2-14 | c-1 | 100 | — | — | P'-1/P'-3 | 1,410/5,648 | 14.4 |
| Experimental Example 2-15 | Y2-15 | c-2 | 100 | — | — | P'-1/P'-3 | 1,410/5,649 | 29.3 |
| Experimental Example 2-16 | Y2-16 | a-3 | 35 | b-2 | 65 | P'-1/P'-3 | 1,410/5,636 | 28.5 |
| Experimental Example 2-17 | Y2-17 | a-3 | 100 | — | — | P'-1/P'-3 | 1,410/5,643 | 0.0 |
| Experimental Example 2-18 | Y2-18 | a-3 | 97 | b-2 | 3 | P'-1/P'-3 | 1,410/5,644 | 1.5 |
| Experimental Example 2-19 | Y2-19 | a-3 | 15 | b-2 | 85 | P'-1/P'-3 | 1,410/5,645 | 35.7 |
| Experimental Example 2-20 | Y2-20 | — | — | b-2 | 100 | P'-1/P'-3 | 1,410/5,646 | 40.7 |
| Experimental Example 2-21 | Y2-21 | d-1 | 70 | b-1 | 30 | P'-1/P'-3 | 1,410/5,647 | 1.4 |

[Preparation of Radiation-Sensitive Resin Composition]

Radiation-sensitive resin compositions for use in resist film formation were prepared according to the following procedure.

[Synthesis of Polymer (B)]

Monomers used in the synthesis of the polymer (B) are shown below.

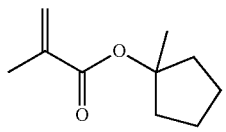

(M'-14)

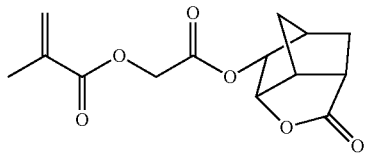

(M'-15)

[Synthesis Example 2-15](Synthesis of Polymer (B'-1))

A monomer solution was prepared by dissolving 37.5 g (50 mol %) of the monomer (M'-14) and 62.5 g (50 mol %) of the monomer (M'-15) in 200 g of 2-butanone, and further dissolving therein 3.7 g (5 mol % with respect to the total monomers) of 2,2'-azobis(methyl 2-methylpropionate). Separately, a 500 mL three-neck flask containing 100 g of 2-butanone was purged with nitrogen for 30 min. After the purging with nitrogen, the reaction vessel was heated to 80° C. with stirring, and the prepared monomer solution was added dropwise over 3 hrs using a dropping funnel. The time of the start of the dropwise addition was regarded as the time of the start of the polymerization reaction, and the polymerization reaction was allowed to proceed for 6 hrs. After the completion of the polymerization, the polymerization reaction mixture was water-cooled to 30° C. or below and charged into 2,000 g of methanol, and the precipitated white powder was filtered off. The collected white powder was washed twice with 400 g of methanol in a slurry, filtered off, and dried at 50° C. for 17 hrs, whereby a polymer (B'-1) as a white powder was obtained (amount: 70.5 g; yield: 70.5%). The polymer (B'-1) had the Mw of 6,500 and the Mw/Mn of 1.40. In addition, the result of the $^{13}$C-NMR analysis indicated that the proportions of the structural unit derived from (M'-14) and the structural unit derived from (M'-15) were 49 mol % and 51 mol %, respectively.

[Preparation of Radiation-Sensitive Resin Composition]

The acid generating agent (C), the solvent (D) and the acid diffusion control agent (E) which were used in the preparation of the radiation-sensitive resin composition are shown below.

[(C) Acid Generating Agent]

C'-1: triphenylsulfonium 2-(norbornan-2-yl)-1,1-difluoroethane-1-sulfonate (a compound represented by the following formula (C'-1))

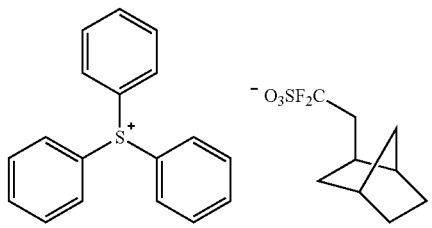

(C'-1)

[(D) Solvent]

D'-1: propylene glycol monomethyl ether acetate
D'-2: cyclohexanone
D'-3: γ-butyrolactone

[(E) Acid Diffusion Control Agent]

E'-1: N-t-butoxycarbonyl-4-hydroxypiperidine (a compound represented by the following formula (E'-1))

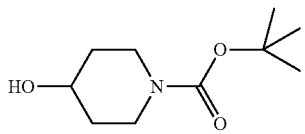

(E'-1)

[Synthesis Example 2-16](Preparation of Radiation-Sensitive Resin Composition (X2-1))

A radiation-sensitive resin composition (X2-1) was prepared by mixing 100 parts by mass of (B'-1) as the polymer (B), 7.8 parts by mass of (C'-1) as the acid generating agent (C), 1 part by mass of (E'-1) as the acid diffusion control agent (E), and 2,110 parts by mass of (D'-1), 900 parts by mass of (D'-2) and 30 parts by mass of (D'-3) as the solvent (D), and filtering the resulting mixture through a membrane filter having a pore size of 0.2 μm.

Evaluations

Experimental Examples 2-1 to 2-21

Various types of evaluations shown below were made on the compositions for upper layer film formation prepared as described above. The results of the evaluations are shown in Table 9.

[Composition Stability]

Evaluation was made on the presence or absence of opacification over time of the composition for upper layer film formation. The composition for upper layer film formation was stirred for 30 min, and thereafter visually checked for the presence or absence of opacification. The composition stability was evaluated to be: "A" (favorable) in the case of the absence of opacification; and "B" (unfavorable) in the case of the presence of opacification, if any.

[Receding Contact Angle]

A value of a receding contact angle of water on the surface of the upper layer film was measured. An upper layer film having an average thickness of 30 nm was formed on an 8-inch silicon wafer by spin-coating a composition for upper layer film formation on the 8-inch silicon wafer, followed by PB on a hot plate at 90° C. for 60 sec to form. Thereafter, a receding contact angle was measured quickly with a contact angle meter ("DSA-10" available from KRUS) in an environment of room temperature of 23° C., a humidity of 45%, and an ordinary pressure according to the following procedure.

First, the position of a wafer stage of the contact angle meter was adjusted, and the wafer was placed on the adjusted stage. Next, water was injected into a needle, and the position of the needle was fine-tuned to an initial position which allowed a water bead to be formed on the wafer placed as above. Thereafter, water was discharged from the needle to form a 25 µL water bead on the wafer, then the needle was once retracted from the water bead, and the needle was lowered again to the initial position so as to position a tip of the needle in the water bead. Then, the water bead was suctioned for 90 sec with the needle at a rate of 10 µL/min, during which a contact angle was concurrently measured once per second, 90 times in total. Of the measurement values, contact angle measurements acquired for 20 sec after the time point when the measurement of the contact angle became stable were averaged to obtain a reading of the receding contact angle (unit: degree))(°. The receding contact angle was evaluated to be: "A" (favorable) in the case of the receding contact angle being no less than 80°; and "B" (unfavorable) in the case of the receding contact angle being less than 80°.

[Elution-Inhibiting Property]

The amount of a resist component eluted from a resist film having an upper layer film formed thereon was determined. A silicone rubber sheet (Kureha Elastomer Co., Ltd.; a square sheet having a side length of 30 cm, with a thickness of 1.0 mm) with its central part being hollowed out in a circular shape with a diameter of 11.3 cm was mounted on the central part of an 8-inch silicon wafer that had been subjected to a treatment with hexamethyldisilazane (HMDS) at 100° C. for 60 sec in a coater/developer ("CLEAN TRACK ACTS" available from Tokyo Electron Limited). Then, the hollowed central part of the silicone rubber was filled with 10 mL of ultra pure water using a 10 mL transfer pipet. On the other hand, separately from the silicon wafer, an 8-inch silicon wafer having an underlayer antireflective film, a resist film and an upper layer film formed thereon was prepared, and this 8-inch silicon wafer was mounted on the silicone rubber sheet such that the upper layer film was positioned on the silicone rubber sheet side, in other words, so as to bring the upper layer film into contact with the ultra pure water while keeping the ultra pure water from running out. It is to be noted that the silicon wafer having the underlayer antireflective film, the resist film and the upper layer film formed thereon was obtained by spin-coating a composition for underlayer antireflective film formation ("ARC29A" available from Brewer Science, Inc.) on the 8-inch silicon wafer with the coater/developer to provide an underlayer antireflective film having an average thickness of 77 nm, then spin-coating the radiation-sensitive resin composition (X2-1) on the underlayer antireflective film with the coater/developer and subjecting the same to PB at 90° C. for 60 sec for 60 sec to form a resist film having an average thickness of 90 nm, and thereafter coating a composition for upper layer film formation on the resist film and subjecting the same to PB at 90° C. for 60 sec to form an upper layer film having an average thickness of 30 nm After the upper layer film was mounted, the state was maintained for 10 sec. Thereafter, the mounted 8-inch silicon wafer was removed and the ultra pure water was recovered with a glass syringe, and the recovered ultra pure water was designated as a sample for analysis. It is to be noted that the recovery rate of the ultra pure water after completion of the experiment was no less than 95%. Next, peak intensity of the anion moiety of the photoacid generating agent in the ultra pure water obtained as described above was measured using a liquid chromatograph-mass spectrometer (LC-MS)(LC unit: "SERIES 1100" available from AGILENT; MS unit: "Mariner" available from Perseptive Biosystems, inc.) under the following measurement conditions. In the measurement, peak intensities for 1 ppb, 10 ppb and 100 ppb aqueous solutions of the acid generating agent (C) (compound (C'-1) used in the radiation-sensitive resin composition (X2-1) were measured under measurement conditions to generate a calibration curve, and the amount of the eluted acid generating agent (C) was calculated from the peak intensity using the calibration curve. The elution-inhibiting property was evaluated to be: "A" (favorable) in the case of the amount of the eluted component being no greater than $5.0 \times 10^{-12}$ mol/cm$^2$; and "B" (unfavorable) in the case of the amount of the eluted component being greater than $5.0 \times 10^{-12}$ mol/cm$^2$.

(Measurement Conditions)

column used: "CAPCELL PAK MG"×1 available from Shiseido Company, Limited flow rate: 0.2 mL/min elution solvent: water/methanol (volume ratio: 3/7) with 0.1% by mass of formic acid measurement temperature: 35° C.

[Peel Resistance]

Evaluation was made on difficulty of peeling of an upper layer film from a substrate. An 8-inch silicon wafer that had not been subjected to a treatment with HMDS was used as a substrate. An upper layer film having an average thickness of 30 nm was formed on the substrate by spin-coating a composition for upper layer film formation on the substrate with the coater/developer, followed by subjecting the same to PB at 90° C. for 60 sec. Next, rinsing with pure water in the coater/developer was performed for 60 sec, followed by drying through spinning. The peel resistance was evaluated to be: "A" (favorable) in the case of no peeling of the upper layer film being visually found after the rinsing; "B" (somewhat favorable) in the case of the peeling being found only in an edge portion; and "C" (unfavorable) in the case of the peeling of the upper layer film being found on the entire face of the wafer.

[Bridge Defects-Inhibiting Property and Break Defects-Inhibiting Property]

The number of bridge defects and break defects generated on a resist pattern obtained after the exposure and development of a resist film having an upper layer film formed thereon was evaluated.

An underlayer antireflective film having an average thickness of 105 nm was formed on the surface of a 12-inch silicon wafer by spin coating a composition for underlayer antireflective film formation ("ARC66" available from Nissan Chemical Industries, Ltd.) on the surface of the 12-inch silicon wafer using a coater/developer ("Lithius Pro-i" available from Tokyo Electron Limited), followed by PB. Next, a radiation-sensitive resin composition (a) was spin-coated on using the coater/developer, followed by PB at 90° C. for 60 sec and then cooling at 23° C. for 30 sec to form a resist film having an average thickness of 90 nm Thereafter, a composition for upper layer film formation was applied on the resist film, followed by PB at 90° C. for 60 sec, whereby an upper layer film having an average thickness of 30 nm was formed.

Next, an exposure was performed using an ArF Immersion Scanner ("S610C" available from NIKON) through a mask for formation of a pattern of 45 nm line/90 nm pitch under optical conditions of NA of 1.30 and Dipole. Next, PEB was performed on a hot plate of the coater/developer at 90° C. for 60 sec, followed by cooling at 23° C. for 30 sec, and then a puddle development was performed for 30 sec using butyl acetate as a developer solution. Then, spin-drying was performed at 2,000 rpm for 15 sec, whereby a substrate having a resist pattern formed thereon was obtained. The obtained substrate having a resist pattern formed thereon was inspected for defects using a defect inspection apparatus ("KLA2810" available from KLA-Tencor), and observed using a scanning electron microscope ("RS6000" available from Hitachi High-Technologies Corporation), and bridge defects and break defects were measured. The bridge defects-inhibiting property and the break defects-inhibiting property were each evaluated to be: "A" (favorable) in the case of the number of defects per wafer being less than 50; and "B" (unfavorable) in the case of the number of defects per wafer being no less than 50.

TABLE 9

| | Composition for upper layer film formation | Composition stability | Receding contact angle (°) | Elution-inhibiting property | Peel resistance | Bridge defects-inhibiting property (defects/wafer) | Break defects-inhibiting property (defects/wafer) |
|---|---|---|---|---|---|---|---|
| Experimental Example2-1 | Y2-1 | A | 88.0 | A | A | 43 | 32 |
| Experimental Example2-2 | Y2-2 | A | 91.0 | A | A | 35 | 21 |
| Experimental Example2-3 | Y2-3 | A | 80.5 | A | B | 9 | 3 |
| Experimental Example2-4 | Y2-4 | A | 81.2 | A | B | 8 | 4 |
| Experimental Example2-5 | Y2-5 | A | 82.6 | A | B | 10 | 5 |
| Experimental Example2-6 | Y2-6 | A | 82.9 | A | B | 30 | 30 |
| Experimental Example2-7 | Y2-7 | A | 83.2 | A | B | 20 | 40 |
| Experimental Example2-8 | Y2-8 | A | 85.7 | A | B | 5 | 3 |
| Experimental Example2-9 | Y2-9 | A | 92.3 | A | A | 14 | 19 |
| Experimental Example2-10 | Y2-10 | A | 82.1 | A | A | 30 | 39 |
| Experimental Example2-11 | Y2-11 | A | 81.2 | A | A | 28 | 41 |
| Experimental Example2-12 | Y2-12 | A | 81.5 | A | A | 11 | 9 |
| Experimental Example2-13 | Y2-13 | A | 81.3 | A | A | 15 | 7 |
| Experimental Example2-14 | Y2-14 | A | 81.2 | A | B | 39 | 40 |
| Experimental Example2-15 | Y2-15 | A | 83.4 | A | B | 48 | 48 |
| Experimental Example2-16 | Y2-16 | A | 83.5 | A | B | 35 | 39 |
| Experimental Example2-17 | Y2-17 | A | 78.4 | A | B | 9 | 6 |
| Experimental Example2-18 | Y2-18 | A | 78.9 | A | B | 10 | 5 |
| Experimental Example2-19 | Y2-19 | A | 80.1 | A | B | 150 | 660 |
| Experimental Example2-20 | Y2-20 | A | 80.9 | A | C | 60,000 | 30,000 |
| Experimental Example2-21 | Y2-21 | A | 73.2 | A | A | 180 | 400 |

From the results shown in Table 9, it is found that when the composition for upper layer film formation and negative resist pattern-forming method according to the embodiments of the present invention are employed, an upper layer film exhibiting a greater receding contact angle and superior peel resistance can be formed while the composition stability and the elution-inhibiting property are maintained, and a resist pattern with fewer bridge defects and break defects can be formed.

INDUSTRIAL APPLICABILITY

According to the embodiments of the negative resist pattern-forming method and the composition for upper layer film formation according to the present invention, the water repellency of the surface of the upper layer film can be enhanced, and a resist pattern with fewer defects can be formed. Therefore, the negative resist pattern-forming method can be suitably used for pattern formation in the field of semiconductor devices and the like in which further miniaturization and improvement in quality are demanded in the future.

What is claimed is:

1. A negative resist pattern-forming method comprising:
    applying a radiation-sensitive resin composition on a substrate to form a resist film, the radiation-sensitive resin composition comprising a first polymer component and a radiation-sensitive acid generator;
    applying a composition for upper layer film formation on one surface of the resist film to form an upper layer film, the composition for upper layer film formation comprising a second polymer component and a solvent;
    subjecting the resist film having the upper layer film formed thereon to liquid immersion lithography; and
    developing the resist film subjected to the liquid immersion lithography with a developer solution comprising an organic solvent,
    wherein the second polymer component comprises:
        a third polymer comprising no fluorine atom or silicone atom and comprising a first structural unit that comprises a polycyclic alicyclic structure and that is represented by formula (6-1) or formula (6-2); and
        a fourth polymer comprising a second structural unit which comprises a group represented by formula (7), and a third structural unit which comprises a fluorinated alkyl group,
    the polycyclic alicyclic structure in the first structural unit is a polycyclic hydrocarbon structure not comprising a hetero atom in the structure thereof, and
    a percentage content of the fluorine atom in the second polymer component is no less than 2% by mass and no greater than 30% by mass:

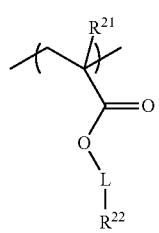

(6-1)

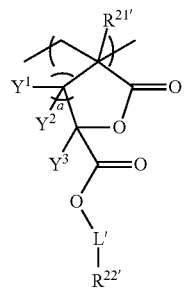

(6-2)

wherein, in the formula (6-1),
R$^{21}$ represents a hydrogen atom, or a methyl group;
L represents a single bond or a divalent organic group having 1 to 20 carbon atoms; and
R$^{22}$ represents a substituted or unsubstituted monovalent polycyclic alicyclic hydrocarbon group having 3 to 20 ring atoms, and
in the formula (6-2),
R$^{21'}$ represents a hydrogen atom or a methyl group;
Y$^{1}$, Y$^{2}$ and Y$^{3}$ each independently represent a hydrogen atom or a monovalent organic group having 1 to 20 carbon atoms;
a is an integer of 1 to 4, wherein in a case where a is no less than 2, a plurality of Y$^{1}$s are identical or different, and a plurality of Y$^{2}$s are identical or different;
L' represents a single bond or a divalent organic group having 1 to 20 carbon atoms; and
R$^{22'}$ represents a substituted or unsubstituted monovalent polycyclic alicyclic hydrocarbon group having 3 to 20 ring atoms,

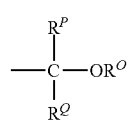

(7)

wherein, in the formula (7),
R$^{O}$ represents a hydrogen atom or a monovalent organic group having 1 to 20 carbon atoms; and
R$^{P}$ and R$^{Q}$ each independently represent a fluorine atom or a fluorinated alkyl group having 1 to 20 carbon atoms.

2. The negative resist pattern-forming method according to claim 1, wherein the first polymer component comprises a first polymer that comprises a fluorine atom, and a second polymer that comprises an acid-labile group.

3. The negative resist pattern-forming method according to claim 2, wherein the composition for upper layer film formation satisfies at least one selected from the group consisting of (i) and (ii):
    (i) the composition for upper layer film formation further comprising an acid diffusion inhibiting compound; and
    (ii) the second polymer component comprising a structural unit that comprises an acid diffusion-inhibiting group,
    wherein the acid diffusion inhibiting compound comprises a compound represented by formula (1), a compound represented by formula (2), a compound represented by formula (3) or a combination thereof, and wherein the acid diffusion-inhibiting group comprises a group represented by formula (1'), a group represented by formula (2'-1), a group represented by formula (2'-2), a group represented by formula (3') or a combination thereof,

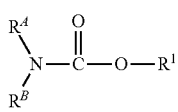 (1)

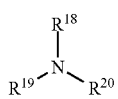 (2)

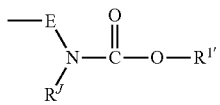 (3)

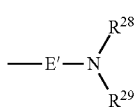 (1')

—X'+ Y'−  (2'-1)

—Y''− X''+  (2'-2)

—E'—N⟨R²⁸/R²⁹  (3')

wherein, in the formula (1),
$R^A$ and $R^B$ each independently represent a hydrogen atom or a monovalent organic group having 1 to 20 carbon atoms, or $R^A$ and $R^B$ taken together represent an aliphatic heterocyclic structure having 3 to 20 ring atoms together with the nitrogen atom to which $R^A$ and $R^B$ bond; and
$R^1$ represents a monovalent hydrocarbon group having 1 to 20 carbon atoms, in the formula (2),
$X^+$ represents a monovalent onium cation; and
$Y^-$ represents a monovalent weak acid anion, in the formula (3),
$R^{18}$, $R^{19}$ and $R^{20}$ each independently represent a hydrogen atom, or a substituted or unsubstituted linear or branched alkyl group, a substituted or unsubstituted monovalent saturated alicyclic hydrocarbon group, a substituted or unsubstituted monovalent aryl group or a monovalent aralkyl group,
in the formula (1'),
E represents a single bond or a divalent organic group having 1 to 20 carbon atoms;
$R^J$ represents a hydrogen atom or a monovalent organic group having 1 to 20 carbon atoms,
wherein $R^J$ and E optionally taken together represent an aliphatic heterocyclic structure having 3 to 20 ring atoms together with the nitrogen atom to which $R^J$ and E bond; and
$R^{1'}$ represents a monovalent hydrocarbon group having 1 to 20 carbon atoms, in the formula (2'-1),
$X'^+$ represents a monovalent group that comprises a monovalent onium cation; and
$Y'^-$ represents a monovalent weak acid anion, in the formula (2'-2), $Y''^-$ represents a monovalent group that comprises a monovalent weak acid anion; and
$X''^+$ represents a monovalent onium cation, and
in the formula (3'),
E' represents a single bond or a divalent organic group having 1 to 20 carbon atoms; and
$R^{28}$ and $R^{29}$ each independently represent a hydrogen atom or a monovalent organic group having 1 to 20 carbon atoms,
wherein any two of $R^{28}$, $R^{29}$ and E' optionally taken together represent an aliphatic heterocyclic structure having 3 to 20 ring atoms together with the nitrogen atom to which the any two of $R^{28}$, $R^{29}$ and E' bond.

4. The negative resist pattern-forming method according to claim 1, wherein the proportion of the first structural unit with respect to total structural units constituting the second polymer component is no less than 30 mol %.

5. The negative resist pattern-forming method according to claim 4, wherein the proportion of the first structural unit with respect to the total structural units constituting the second polymer component is no less than 35 mol %.

6. The negative resist pattern-forming method according to claim 1, wherein a content of the fluorine atom in the composition for upper layer film formation in terms of solid content equivalent is no less than 5% by mass and no greater than 10% by mass.

7. The negative resist pattern-forming method according to claim 1, wherein the solvent comprises an alcohol solvent, an ether solvent or a combination thereof.

8. The negative resist pattern-forming method according to claim 7, wherein a total percentage content of the alcohol solvent and the ether solvent in the solvent is no less than 70% by mass.

9. The negative resist pattern-forming method according to claim 1, wherein a mass ratio of the third polymer to the fourth polymer is no less than 10/90 and no greater than 95/5.

10. The negative resist pattern-forming method according to claim 1, wherein a proportion of the first structural unit with respect to total structural units constituting the second polymer component is no less than 20 mol % and no greater than 95 mol %.

11. The negative resist pattern-forming method according to claim 1, wherein the percentage content of the fluorine atom in the second polymer component is no less than 5% by mass and no greater than 10% by mass.

12. A composition for upper layer film formation, comprising:
a polymer component comprising:
a polymer comprising no fluorine atom or silicon atom and comprising a first structural unit that comprises a polycyclic alicyclic structure and that is represented by formula (6-1) or formula (6-2); and
a polymer comprising a second structural unit that comprises a group represented by formula (7), and a third structural unit that comprises a fluorinated alkyl group; and
a solvent,
wherein the polycyclic alicyclic structure is a polycyclic structure not comprising a hetero atom in the structure thereof, and a percentage content of the fluorine atom in the polymer component is no less than 2% by mass and no greater than 30% by mass:

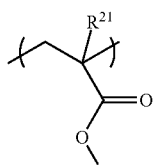

(6-1)

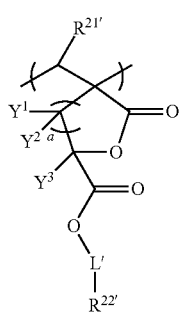

(6-2)

wherein, in the formula (6-1), $R^{21}$ represents a hydrogen atom, or a methyl group;

L represents a single bond or a divalent organic group having 1 to 20 carbon atoms; and $R^{22}$ represents a substituted or unsubstituted monovalent polycyclic alicyclic hydrocarbon group having 3 to 20 ring atoms, and in the formula (6-2), $R^{21'}$ represents a hydrogen atom or a methyl group;

$Y^1$, $Y^2$ and $Y^3$ each independently represent a hydrogen atom or a monovalent organic group having 1 to 20 carbon atoms;

a is an integer of 1 to 4, wherein in a case where a is no less than 2, a plurality of $Y^1$s are identical or different, and a plurality of $Y^2$s are identical or different;

L' represents a single bond or a divalent organic group having 1 to 20 carbon atoms; and $R^{22'}$ represents a substituted or unsubstituted monovalent polycyclic alicyclic hydrocarbon group having 3 to 20 ring atoms,

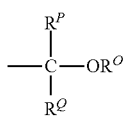

(7)

wherein, in the formula (7), $R^O$ represents a hydrogen atom or a monovalent organic group having 1 to 20 carbon atoms; and $R^P$ and $R^Q$ each independently represent a fluorine atom or a fluorinated alkyl group having 1 to 20 carbon atoms.

13. The composition for upper layer film formation according to claim 12, wherein the percentage content of the fluorine atom in the polymer component is no less than 5% by mass and no greater than 10% by mass.

14. The composition for upper layer film formation according to claim 12, wherein the composition for upper layer film formation satisfies at least one selected from the group consisting of (i') and (ii'):

(i') the composition for upper layer film formation further comprising an acid diffusion inhibiting compound; and (ii') the polymer component comprising a structural unit that comprises an acid diffusion-inhibiting group, wherein the acid diffusion inhibiting compound comprises a compound represented by formula (1), a compound represented by formula (2), a compound represented by formula (3) or a combination thereof, and wherein the acid diffusion-inhibiting group comprises a group represented by formula (1'), a group represented by formula (2'-1), a group represented by formula (2'-2), a group represented by formula (3') or a combination thereof,

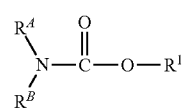

(1)

(2)

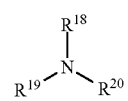

(3)

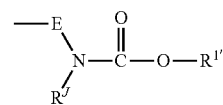

(1')

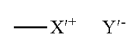

(2'-1)

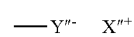

(2'-2)

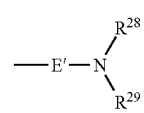

(3')

wherein, in the formula (1), $R^A$ and $R^B$ each independently represent a hydrogen atom or a monovalent organic group having 1 to 20 carbon atoms, or $R^A$ and $R^B$ taken together represent an aliphatic heterocyclic structure having 3 to 20 ring atoms together with the nitrogen atom to which $R^A$ and $R^B$ bond; and $R^1$ represents a monovalent hydrocarbon group having 1 to 20 carbon atoms, in the formula (2), $X^+$ represents a monovalent onium cation; and $Y^-$ represents a monovalent weak acid anion, in the formula (3), $R^{18}$, $R^{19}$ and $R^{20}$ each independently represent a hydrogen atom, or a substituted or unsubstituted linear or branched alkyl group, a monovalent saturated alicyclic hydrocarbon group, a monovalent aryl group or a monovalent aralkyl group, in the formula (1'), E represents a single bond or a divalent organic group having 1 to 20 carbon atoms;

$R^J$ represents a hydrogen atom or a monovalent organic group having 1 to 20 carbon atoms, wherein $R^J$ and E optionally taken together represent an aliphatic heterocyclic structure having 3 to 20 ring atoms together with the nitrogen atom to which $R^J$ and E bond; and $R^{1'}$ represents a monovalent hydrocarbon group having 1 to 20 carbon atoms, in the formula (2'-1), $X'^{+}$ represents a monovalent group that comprises a monovalent onium cation; and $Y'''^{-}$ represents a monovalent weak acid anion, in the formula (2'-2), $Y'''^{-}$ represents a monovalent group that comprises a monovalent weak acid anion; and $X'''^{+}$ represents a monovalent onium cation, and in the formula (3'), E' represents a single bond or a divalent organic group having 1 to 20 carbon atoms;

$R^{28}$ and $R^{29}$ each independently represent a hydrogen atom or a monovalent organic group having 1 to 20 carbon atoms, wherein any two of $R^{28}$, $R^{29}$ and E' optionally taken together represent an aliphatic heterocyclic structure having 3 to 20 ring atoms together with the nitrogen atom to which the any two of $R^{28}$, $R^{29}$ and E' bond.

15. The negative resist pattern-forming method according to claim 1, wherein the second structural unit is represented by formula (7-a) or formula (7-b):

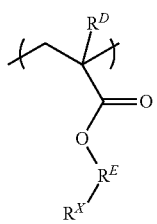

(7-a)

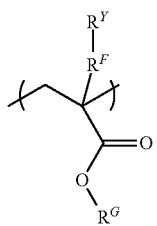

(7-b)

wherein in the above formula (7-a), $R^D$ represents a hydrogen atom, a fluorine atom, a methyl group or a trifluoromethyl group; $R^E$ represents a divalent linking group; and $R^X$ represents the group represented by formula (7), and in the above formula (7-b), $R^Y$ represents the group represented by formula (7); $R^F$ represents a single bond or a divalent linking group; and $R^G$ represents a hydrogen atom or a monovalent organic group.

16. The composition for upper layer film formation according to claim 12, wherein the second structural unit is represented by formula (7-a) or formula (7-b):

(7-a)

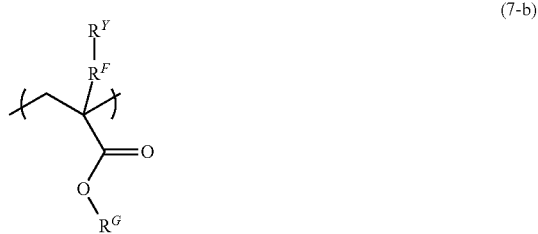

(7-b)

wherein in the above formula (7-a), $R^D$ represents a hydrogen atom, a fluorine atom, a methyl group or a trifluoromethyl group; $R^E$ represents a divalent linking group; and $R^X$ represents the group represented by formula (7), and in the above formula (7-b), $R^Y$ represents the group represented by formula (7); $R^F$ represents a single bond or a divalent linking group; and $R^G$ represents a hydrogen atom or a monovalent organic group.

* * * * *